(12) United States Patent
Park et al.

(10) Patent No.: US 12,514,117 B2
(45) Date of Patent: Dec. 30, 2025

(54) LIGHT-EMITTING DEVICE AND ELECTRONIC APPARATUS COMPRISING LIGHT-EMITTING DEVICE

(71) Applicant: Samsung Display Co., Ltd., Yongin-si (KR)

(72) Inventors: Heungsu Park, Yongin-si (KR); Namsu Kang, Yongin-si (KR); Songeun Lee, Yongin-si (KR); Jongwon Lee, Yongin-si (KR); Hyunshik Lee, Yongin-si (KR); Wonsuk Han, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 927 days.

(21) Appl. No.: 17/723,353

(22) Filed: Apr. 18, 2022

(65) Prior Publication Data
US 2023/0113809 A1    Apr. 13, 2023

(30) Foreign Application Priority Data
Aug. 9, 2021  (KR) .................. 10-2021-0104807

(51) Int. Cl.
*H01L 51/50*    (2006.01)
*H10K 85/30*    (2023.01)
(Continued)

(52) U.S. Cl.
CPC ....... *H10K 85/6572* (2023.02); *H10K 85/322* (2023.02); *H10K 85/342* (2023.02);
(Continued)

(58) Field of Classification Search
None
See application file for complete search history.

(56) References Cited

U.S. PATENT DOCUMENTS 8,114,529 B2   2/2012   Kitazawa et al.
10,756,274 B2  8/2020   Kim et al.
(Continued)

FOREIGN PATENT DOCUMENTS

EP   1783189 A1   5/2007
EP   3229289 A1   10/2017
(Continued)

OTHER PUBLICATIONS

Kang J W et al: "A host material containing tetraphenylsilane for phosphorescent OLEDs with high efficiency and operational stability", Organic Electronics, Elsevier, Amsterdam, NL, vol. 9, No. 4, Aug. 1, 2008 (Aug. 1, 2008), pp. 452-460, XP022681629.
(Continued)

*Primary Examiner* — Gregory D Clark
(74) *Attorney, Agent, or Firm* — CANTOR COLBURN LLP

(57) ABSTRACT

A light emitting device in which: a) an absolute value of a lowest unoccupied molecular orbital (LUMO) energy level of a first electron transporting compound (ET-1) is smaller than an absolute value of a LUMO energy level of a host compound (H-1), b) an absolute value of a LUMO energy level of a second electron transporting compound (ET-2) is smaller than an absolute value of a LUMO energy level of a third electron transporting compound (ET-3), c) and an absolute value of a LUMO energy level of the second electron transporting compound (ET-2) is smaller than an absolute value of a LUMO energy level of the first electron transporting compound (ET-1).

20 Claims, 2 Drawing Sheets

(51) Int. Cl.
   *H10K 85/60* (2023.01)
   *H10K 50/11* (2023.01)
   *H10K 50/16* (2023.01)
   *H10K 50/19* (2023.01)
   *H10K 101/00* (2023.01)
   *H10K 101/10* (2023.01)
   *H10K 101/30* (2023.01)

(52) U.S. Cl.
   CPC ......... *H10K 85/615* (2023.02); *H10K 85/626* (2023.02); *H10K 85/633* (2023.02); *H10K 85/654* (2023.02); *H10K 85/6574* (2023.02); *H10K 85/6576* (2023.02); *H10K 50/11* (2023.02); *H10K 50/16* (2023.02); *H10K 50/19* (2023.02); *H10K 85/624* (2023.02); *H10K 2101/10* (2023.02); *H10K 2101/30* (2023.02); *H10K 2101/90* (2023.02)

(56) References Cited

U.S. PATENT DOCUMENTS

| | | |
|---|---|---|
| 10,873,041 B2 | 12/2020 | Kim et al. |
| 11,114,620 B2 | 9/2021 | Cho et al. |
| 2009/0191427 A1 | 7/2009 | Liao et al. |
| 2013/0032766 A1 | 2/2013 | Molt et al. |
| 2014/0001451 A1 | 1/2014 | Mizuki et al. |
| 2019/0173027 A1 | 6/2019 | Kim et al. |
| 2019/0312221 A1 | 10/2019 | Park |
| 2019/0326535 A1 | 10/2019 | Kim et al. |
| 2020/0251040 A1 | 8/2020 | Lee et al. |
| 2021/0074940 A1* | 3/2021 | Song ................ H10K 85/40 |
| 2021/0119169 A1 | 4/2021 | Lee et al. |

FOREIGN PATENT DOCUMENTS

| | | |
|---|---|---|
| KR | 10-2010-0138899 | 12/2010 |
| KR | 10-2019-0000759 | 1/2019 |
| KR | 10-2019-0067290 | 6/2019 |
| KR | 10-2019-0108217 | 9/2019 |
| KR | 10-2019-0123821 | 11/2019 |
| KR | 10-2021-0046258 | 4/2021 |
| WO | 2020/050372 | 3/2020 |
| WO | 2021146853 A1 | 7/2021 |

OTHER PUBLICATIONS

Adamovich V et al: "High Efficiency Single Dopant White Electrophosphorescent Light Emitting Diodes", New Journal of Chemistry, Royal Society of Chemistry, GB. vol. 26, Jan. 1, 2002 (Jan. 1, 2002), pp. 1171-1178, XP008037151.
Extended European Search Report dated Jan. 20, 2023, issued in European Patent Application No. 22186500.9.

* cited by examiner

LIGHT-EMITTING DEVICE AND ELECTRONIC APPARATUS COMPRISING LIGHT-EMITTING DEVICE

CROSS-REFERENCE TO RELATED APPLICATION

This application claims priority from and the benefit of Korean Patent Application No. 10-2021-0104807, filed on Aug. 9, 2021, which is hereby incorporated by reference for all purposes as if fully set forth.

BACKGROUND

Field

Embodiments of the invention relate generally to a light-emitting device and an electronic apparatus including the light-emitting device.

Discussion of the Background

Light-emitting devices are self-emissive devices that, as compared with devices of the related art, have wide viewing angles, high contrast ratios, short response times, and excellent characteristics in terms of brightness, driving voltage, and response speed.

Light-emitting devices may include a first electrode on a substrate, and a hole transport region, an emission layer, an electron transport region, and a second electrode sequentially stacked on the first electrode. Holes (i.e., a lack of an electron at a particular position) provided from the first electrode may move toward the emission layer through the hole transport region, and electrons provided from the second electrode may move toward the emission layer through the electron transport region. Carriers, such as holes and electrons, recombine in the emission layer to generate light.

The above information disclosed in this Background section is only for understanding of the background of the inventive concepts, and, therefore, it may contain information that does not constitute prior art.

SUMMARY

Inventive concepts consistent with one or more embodiments of the invention provide for a device having improved efficiency and lifespan, as compared with devices in the related art.

Additional features of the inventive concepts will be set forth in the description which follows, and in part will be apparent from the description, or may be learned by practice of the inventive concepts.

According to one or more embodiments, a light-emitting device may include a first electrode, a second electrode facing the first electrode, and an interlayer located between the first electrode and the second electrode and including an emission layer, wherein the emission layer may include a host compound (H-1) and a dopant compound (D), the interlayer may include a first buffer layer including a first electron transporting compound (ET-1), a second buffer layer including a second electron transporting compound (ET-2), and an electron transport layer including a third electron transporting compound (ET-3), an absolute value of a lowest unoccupied molecular orbital (LUMO) energy level of the first electron transporting compound (ET-1) may be smaller than an absolute value of a LUMO energy level of the host compound (H-1), an absolute value of a LUMO energy level of the second electron transporting compound (ET-2) may be smaller than an absolute value of a LUMO energy level of the third electron transporting compound (ET-3), and an absolute value of a LUMO energy level of the second electron transporting compound (ET-2) may be smaller than an absolute value of a LUMO energy level of the first electron transporting compound (ET-1).

According to one or more embodiments, an electronic apparatus may include the light-emitting device.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
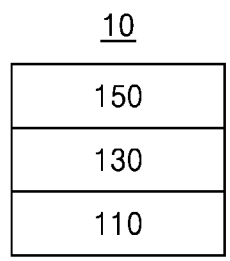
FIG. 1 is a schematic view of a light-emitting device according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

In the related art, when a light-emitting device includes a phosphorescent green emission layer, electron injection from an electron transport layer to an emission layer may occur rapidly, and thus, an exciton profile in the phosphorescent green emission layer may be biased toward a hole transport region. That is, excitons may be formed at an interface between the emission layer and the hole transport region.

In addition, due to rapid electron injection to the green emission layer, a narrow recombination zone may be formed, and triplets in such a narrow recombination zone may undergo triplet-triplet annihilation (TTA) rather than contribute to emission, thus causing roll-off.

According to an embodiment, a light-emitting device may include: a light-emitting device may include a first electrode, a second electrode facing the first electrode; and an interlayer located between the first electrode and the second electrode and including an emission layer, wherein the emission layer may include a host compound (H-1) and a dopant compound (D), the interlayer may include a first buffer layer including a first electron transporting compound (ET-1), a second buffer layer including a second electron transporting compound (ET-2), and an electron transport layer including a third electron transporting compound (ET-3), an absolute value of a lowest unoccupied molecular orbital (LUMO) energy level of the first electron transporting compound (ET-1) may be smaller than an absolute value of a LUMO energy level of the host compound (H-1), an absolute value of a LUMO energy level of the second electron transporting compound (ET-2) may be smaller than an absolute value of a LUMO energy level of the third electron transporting compound (ET-3), and an absolute value of a LUMO energy level of the second electron transporting compound (ET-2) may be smaller than an absolute value of a LUMO energy level of the first electron transporting compound (ET-1).

In the light-emitting device according to one or more embodiments, electrons may be injected from an electron transport layer through a second buffer layer having a shallow LUMO. In this embodiment, electron injection may be controlled by a barrier due to a LUMO difference between the electron transport layer and the second buffer layer.

A LUMO difference between the host compound (H-1) and the first electron transporting compound (ET-1) of the first buffer layer may be small, and a LUMO difference between the second electron transporting compound (ET-2) of the second buffer layer and the first electron transporting compound (ET-1) of the first buffer layer may also be small. Thus, electron injection to the emission layer may be smooth.

The host compound (H-1) may be, for example, an electron transporting host compound.

Due to the second buffer layer, electron injection may be controlled. Thus, a recombination zone of electrons and holes in the emission layer may be formed relatively broadly, and thus, the recombination zone may be biased toward inside of the emission layer at an interface between the emission layer and the hole transport layer.

In addition, due to formation of the broad recombination zone, probability of occurrence of triplet-triplet annihilation (TTA) in the emission layer may be lowered, thus improving roll-off.

In some embodiments, the first electrode may be an anode, the second electrode may be a cathode, a hole transport region may be between the first electrode and the emission layer and may include a hole injection layer, a hole transport layer, an electron blocking layer, or any combination thereof, and/or an electron transport region may be between the second electrode and the emission layer and may include a hole blocking layer, an electron injection layer, or any combination thereof.

The electron transport region may include the electron transport layer.

In an embodiment, the first buffer layer may be in contact with the emission layer. For example, the first buffer layer may be physically in direct contact with the emission layer.

In an embodiment, the second buffer layer may be in contact with the electron transport layer. For example, the second buffer layer may be physically in direct contact with the electron transport layer.

In an embodiment, the first buffer layer may be in contact with the second buffer layer. For example, the first buffer layer may be physically in direct contact with the second buffer layer.

In some embodiments, the LUMO energy level of the first electron transporting compound (ET-1) and the LUMO energy level of the host compound (H-1) may satisfy Equation (1).

$$|E_{LUMO\_ET\text{-}1} - E_{LUMO\_H\text{-}1}| \leq 0.20 \text{ eV} \quad (1)$$

When the LUMO energy level difference between the first electron transporting compound (ET-1) and the host compound (H-1) is greater than 0.20 eV, electron injection to the host may not be relatively smooth, and thus charge balance in the emission layer may not be good.

In some embodiments, the LUMO energy level of the first electron transporting compound (ET-1) and the LUMO energy level of the second electron transporting compound (ET-2) may satisfy Equation (3):

$$|E_{LUMO\_ET\text{-}2} - E_{LUMO\_ET\text{-}1}| \leq 0.20 \text{ eV} \quad (3)$$

When the LUMO energy level difference between the first electron transporting compound (ET-1) and the second electron transporting compound (ET-2) is greater than 0.20 eV, electron flow to a direction of electron injection may not be relatively smooth, and thus charge balance in the emission layer may not be good.

When the LUMO energy level of the first electron transporting compound (ET-1), the LUMO energy level of the second electron transporting compound (ET-2), and the LUMO energy level of the host compound (H-1) satisfy Equations (1) and (3), electron injection to the emission layer may be relatively smooth. As a result, charge balance in the emission layer may be good.

In some embodiments, the LUMO energy level of the second electron transporting compound (ET-2) and the LUMO energy level of the third electron transporting compound (ET-3) may satisfy Equation (2):

$$E_{LUMO\_ET\text{-}2} - E_{LUMO\_ET\text{-}3}| \geq 0.20 \text{ eV} \quad (2)$$

When the LUMO energy level difference between the second electron transporting compound (ET-2) and the third electron transporting compound (ET-3) is smaller than 0.20 eV, it may be difficult to control electron injection by a low barrier due to the LUMO difference between the electron transport layer and the second buffer layer. As a result, a recombination zone of electrons and holes inside the emission layer may move toward the interface between the emission layer and the hole transport layer, and deterioration of the hole transport layer may occur in an early stage.

When the relationship between the LUMO energy level of the second electron transporting compound (ET-2) and the LUMO energy level of the third electron transporting compound (ET-3) satisfies Equation (2), electron injection may be controlled easily.

For example, the LUMO energy level of the host compound (H-1) and the LUMO energy level of the electron transporting host compound may each be in a range of about −2.5 eV to about −2.7 eV.

For example, the LUMO energy level of first electron transporting compound (ET-1) may be in a range of about −2.5 eV to about −2.8 eV.

For example, the LUMO energy level of the second electron transporting compound (ET-2) may be in a range of about −2.1 eV to about −2.4 eV.

For example, the LUMO energy level of the third electron transporting compound (ET-3) may be in a range of about −2.6 eV to −2.8 eV.

In an embodiment, the emission layer may include a single host or mixed hosts.

For example, when the emission layer further includes at least one other host compound, e.g., a hole transporting host compound, an absolute value of the LUMO energy level of the at least one other host compound may be smaller than or equal to an absolute value of the LUMO energy level of the host compound (H-1).

In some embodiments, a mol % of the host compound (H-1) may be in a range of about 90 mol % to about 10 mol %, based on the total hosts in the emission layer. As electrons may flow to the LUMO of the host compound (H-1), a mol % of the host compound (H-1) may be 10 mol % or higher.

In an embodiment, the first buffer layer may include only the first electron transporting compound (ET-1) and the second buffer layer may include only the second electron transporting compound (ET-2), or the first buffer layer and the second buffer layer may each independently further include at least one other transporting compound.

For example, when the first buffer layer further includes at least one other electron transporting compound, an absolute value of the LUMO energy level of the at least one other electron transporting compound may be greater than or equal to an absolute value of the LUMO energy level of the first electron transporting compound (ET-1). That is, in the first buffer layer, the first electron transporting compound (ET-1) may have the most shallow LUMO. Electrons may flow to the LUMO of the first electron transporting compound (ET-1).

In this embodiment, for example, a mol % of the first electron transporting compound (ET-1) may be in a range of about 90 mol % to about 30 mol %, based on the total compounds of the first buffer layer. As electrons flow to the LUMO of the first electron transporting compound (ET-1), a mol % of the first electron transporting compound (ET-1) may be 30 mol % or higher.

For example, when the second buffer layer further includes at least one other electron transporting compound, an absolute value of the LUMO energy level of the at least one other electron transporting compound may be greater than or equal to an absolute value of the LUMO energy level of the second electron transporting compound (ET-2). That is, in the second buffer layer, the second electron transporting compound (ET-2) may have the most shallow LUMO. Electrons may flow to the LUMO of the second electron transporting compound (ET-2).

In this embodiment, for example, a mol % of the second electron transporting compound (ET-2) may be in a range of about 90 mol % to about 30 mol %, based on the total compounds of the second buffer layer. As electrons flow to the LUMO of the second electron transporting compound (ET-2), a mol % of the second electron transporting compound (ET-2) may be 30 mol % or higher.

In some embodiments, the dopant compound (D) may be a phosphorescent dopant compound. The dopant will be described in detail in the following description.

In an embodiment, the emission layer may be a green or red emission layer.

In an embodiment, the first electron transporting compound (ET-1) and the second electron transporting compound (ET-2) may each independently be one of Formulas 312-1 to 312-4 and 313:

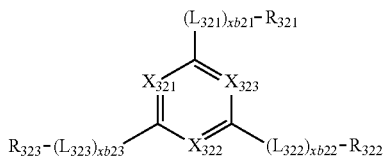

Formula 312-1

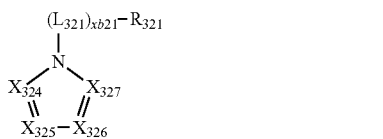

Formula 312-2

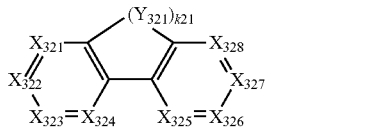

Formula 312-3

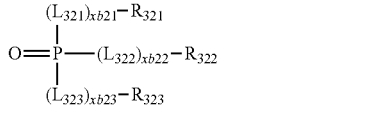

Formula 312-4

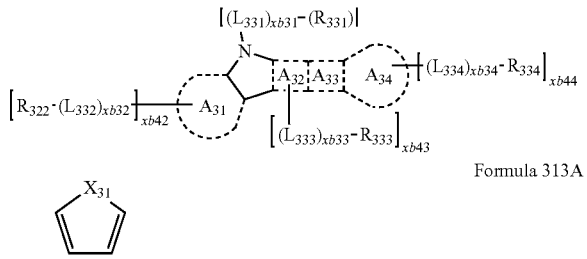

Formula 313

Formula 313A wherein, in Formulas 312-1 to 312-4, 313, and 313A,

X321 to X328 may each independently be N or C[(L324)xb24-R324],

Y321 may be *—O—*', *—S—*', *—N[(L325)xb25-R325]—*', *—C[(L325)xb25-R325][(L326)xb26-R326]—*', *—C[(L325)xb25-R325]=C[(L326)xb26-R326]—*', *—C[(L325)xb25-R325]=N—*', or *—N=C[(L326)xb26-R326]—*', k21 may be 0, 1, or 2, and when k21 is 0, Y321 may not be present, xb21 to xb26 may each independently be 0, 1, 2, 3, 4, or 5, A31, A32, and A34 may each independently be a C3-C60 carbocyclic group or a C1-C30 heterocyclic group, A33 may be a group represented by Formula 313A, X31 may be N[(L335)xb35-(R335)], O, S, Se, C[(L335)xb35-(R335)][(L336)xb36-(R336)], or Si[(L335)xb35-(R335)][(L336)xb36-(R336)], xb31 to xb36 may each independently be 0, 1, 2, 3, 4, or 5, xb42 to xb44 may each independently be 0, 1, 2, 3, 4, 5, 6, 7, 8, 9, or 10, L321 to L326 and L331 to L336 may each independently be a single bond, a C1-C20 alkylene group unsubstituted or substituted with at least one R10a, a C1-C20 alkenylene group unsubstituted or substituted with at least one R10a, a C1-C20 alkynylene group unsubstituted or substituted with at least one R10a, a C3-C10 cycloalkylene group unsubstituted or substituted with at least one R10a, a C1-C10 heterocycloalkylene group unsubstituted or substituted with at least one R10a, a C3-C10 cycloalkenylene group unsubstituted or substituted with at least one R10a, a C1-C10 heterocycloalkenylene group unsubstituted or substituted with at least one R10a, a C6-C60 arylene group unsubstituted or substituted with at least one R10a, a C1-C60 heteroarylene group unsubstituted or substituted with at least one R10a, a divalent non-aromatic condensed polycyclic group unsubstituted or substituted with at least one R10a, or a divalent non-aromatic condensed heteropolycyclic group unsubstituted or substituted with at least one R10a, R321 to R326 and R331 to R336 may each independently be hydrogen, deuterium, —F, —Cl, —Br, —I, a hydroxyl group, a cyano group, a nitro group, an amidino group, a hydrazino group, a hydrazono group, a C1-C60 alkyl group unsubstituted or substituted with at least one R10a, a C2-C60 alkenyl group unsubstituted or substituted with at least one R10a, a C2-C60 alkynyl group unsubstituted or substituted with at least one R10a, a C1-C60 alkoxy group unsubstituted or substituted with at least one R10a, a C3-C10 cycloalkyl group unsubstituted or substituted with at least one R10a, a C1-C10 heterocycloalkyl group unsubstituted or substituted with at least one R10a, a C3-C10 cycloalkenyl group unsubstituted or substituted with at least one R10a, a C1-C10 heterocycloalkenyl group unsubstituted or substituted with at least one R10a, a C6-C60 aryl group unsubstituted or substituted with at least one R10a, a C6-C60 aryloxy group unsubstituted or substituted with at least one R10a, a C6-C60 arylthio group unsubstituted or substituted with at least one R10a, a C1-C60 heteroaryl group unsubstituted or substituted with at least one R10a, a C1-C60 heteroaryloxy group unsubstituted or substituted with at least one R10a, a C1-C60 heteroarylthio group unsubstituted or substituted with at least one R10a, a monovalent non-aromatic condensed polycyclic group unsubstituted or substituted with at least one R10a, a monovalent non-aromatic condensed heteropolycyclic group unsubstituted or substituted with at least one R10a, —Si(Q1)(Q2)(Q3), —B(Q1)(Q2), —N(Q1)(Q2), —P(Q1)(Q2), —C(=O)(Q1), —S(=O)(Q1), —S(=O)2(Q1), —P(=O)(Q1)(Q2), or —P(=S)(Q1)(Q2), at least two adjacent groups of R321 to R324 may optionally be bound to form a C3-C60 carbocyclic group unsubstituted or substituted with at least one R10a or a C5-C60 heterocyclic group unsubstituted or substituted with at least one R10a, and R10a may be: deuterium, —F, —Cl, —Br, —I, a hydroxyl group, a cyano group, or a nitro group; a C1-C60 alkyl group, a C2-C60 alkenyl group, a C2-C60 alkynyl group, or a C1-C60 alkoxy group, each unsubstituted or substituted with deuterium, —F, —Cl, —Br, —I, a hydroxyl group, a cyano group, a nitro group, a C3-C60 carbocyclic group, a C1-C60 heterocyclic group, a C6-C60 aryloxy group, a C6-C60 arylthio group, a C7-C60 aryl alkyl group, a C2-C60 heteroaryl alkyl group, —Si(Q11)(Q12)(Q13), —N(Q11)(Q12), —B(Q11)(Q12), —C(=O)(Q11), —S(=O)2(Q11), —P(=O)(Q11)(Q12), or any combination thereof; a C3-C60 carbocyclic group, a C1-C60 heterocyclic group, a C6-C60 aryloxy group, a C6-C60 arylthio group, a C7-C60 aryl alkyl group, or a C2-C60 heteroaryl alkyl group, each unsubstituted or substituted with deuterium, —F, —Cl, —Br, —I, a hydroxyl group, a cyano group, a nitro group, a C1-C60 alkyl group, a C2-C60 alkenyl group, a C2-C60 alkynyl group, a C1-C60 alkoxy group, a C3-C60 carbocyclic group, a C1-C60 heterocyclic group, a C6-C60 aryloxy group, a C6-C60 arylthio group, a C7-C60 aryl alkyl group, a C2-C60 heteroaryl alkyl group, —Si(Q21)(Q22)(Q23), —N(Q21)(Q22), —B(Q21)(Q22), —C(=O)(Q21), —S(=O)2(Q21), —P(=O)(Q21)(Q22), or any combination thereof; or —Si(Q31)(Q32)(Q33), —N(Q31)(Q32), —B(Q31)(Q32), —C(=O)(Q31), —S(=O)2(Q31), or —P(=O)(Q31)(Q32), wherein Q1 to Q3, Q11 to Q13, Q21 to Q23, and Q31 to Q33 may each independently be: hydrogen; deuterium; —F; —Cl; —Br; —I; a hydroxyl group; a cyano group; a nitro group; a C1-C60 alkyl group; a C2-C60 alkenyl group; a C2-C60 alkynyl group; a C1-C60 alkoxy group; a C3-C60 carbocyclic group or a C1-C60 heterocyclic group, each unsubstituted or substituted with deuterium, —F, a cyano group, a C1-C60 alkyl group, a C1-C60 alkoxy group, a phenyl group, a biphenyl group, or any combination thereof; a C7-C60 aryl alkyl group; or a C2-C60 heteroaryl alkyl group.

In an embodiment, the first electron transporting compound (ET-1) may be selected from following compounds:

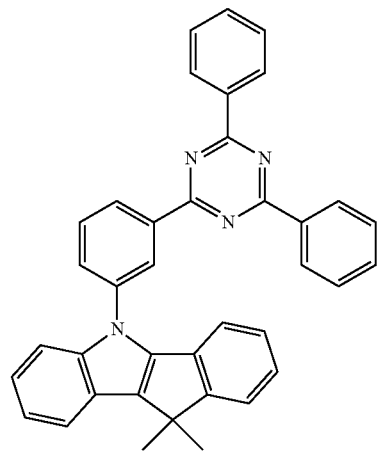

1-1

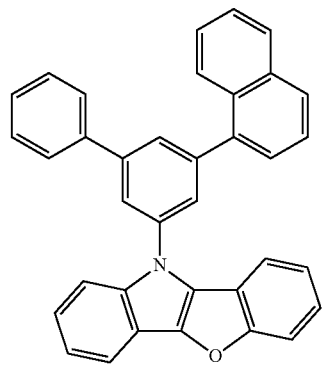

1-2

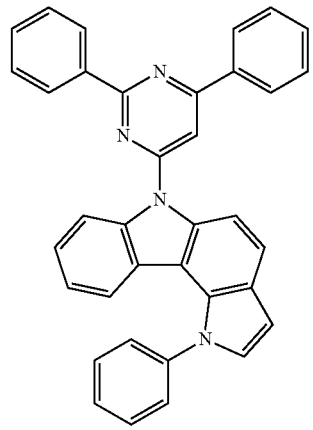

1-3

1-4
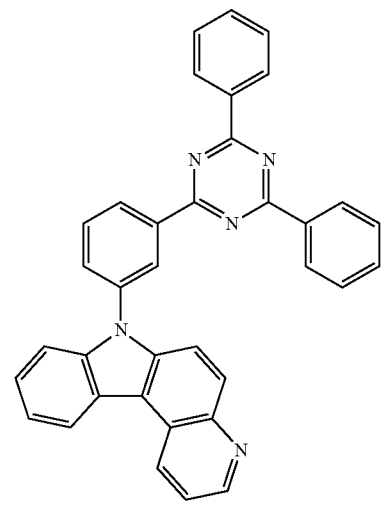
1-5
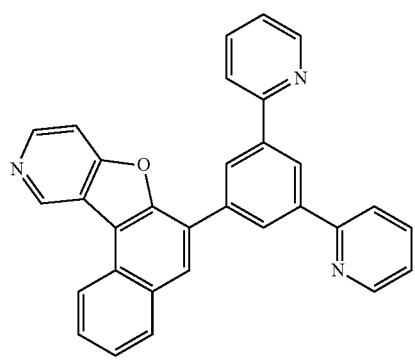
1-6
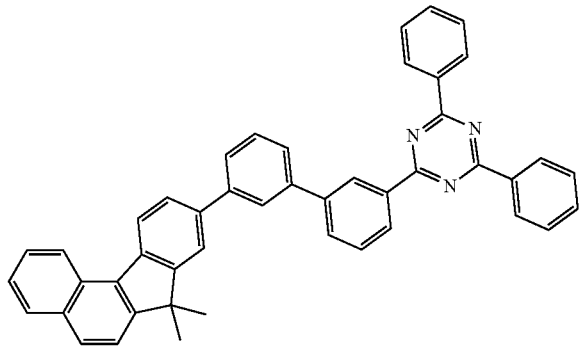
1-7
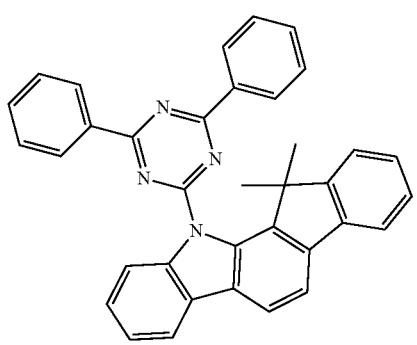
1-8
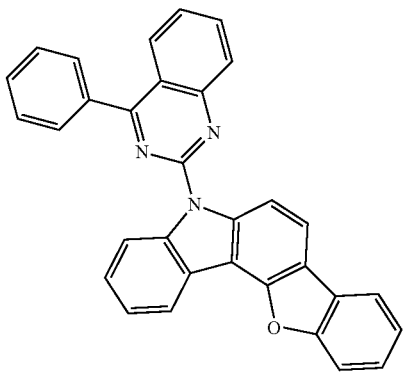
1-9
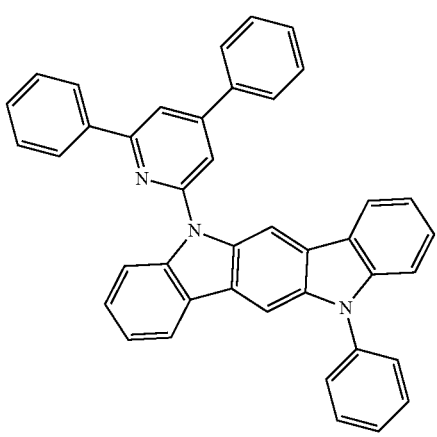
1-10
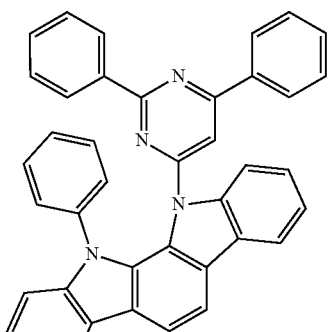
1-11
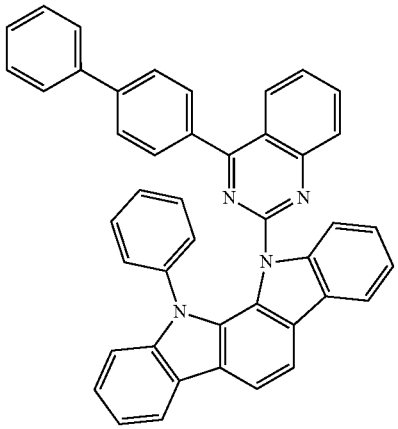

1-12
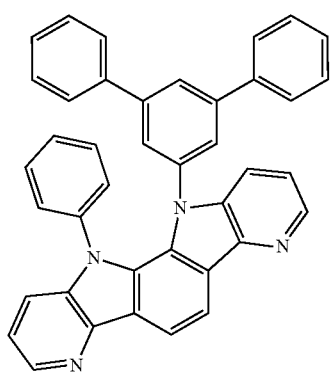
1-13
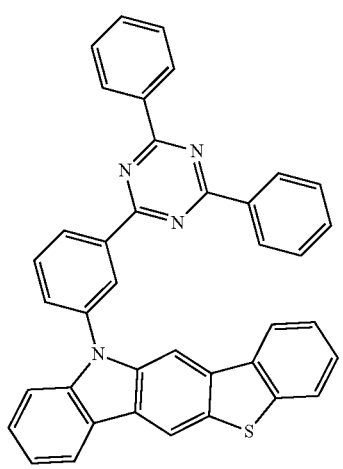
1-14
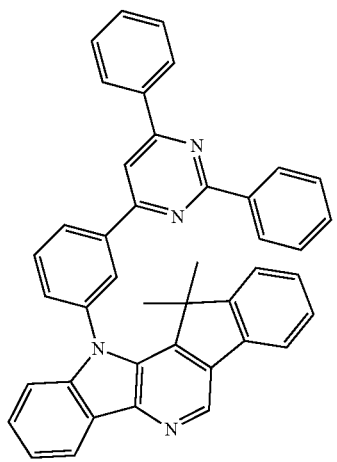
1-15
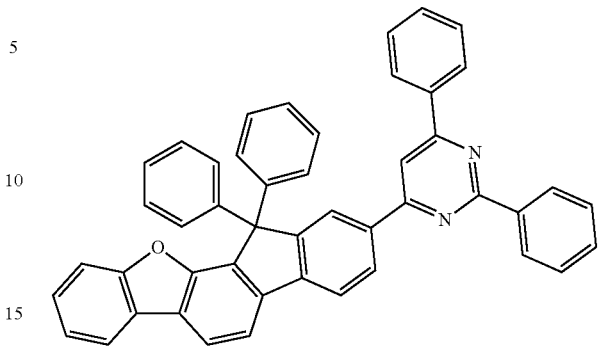
1-16
1-17
1-18
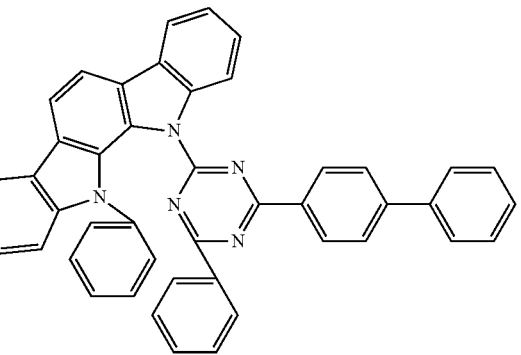

-continued
1-19
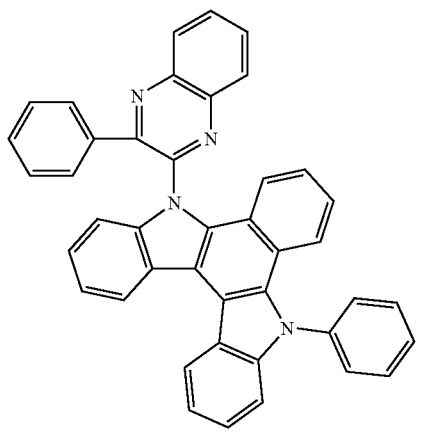
1-20
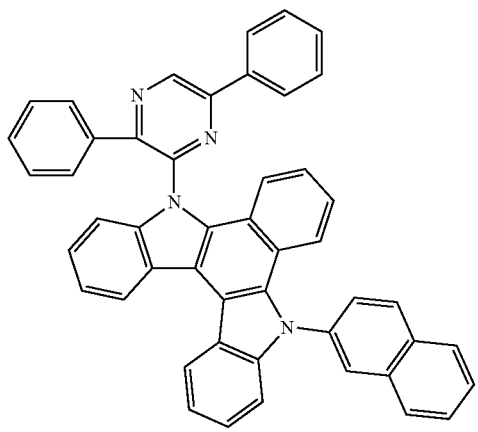
1-21
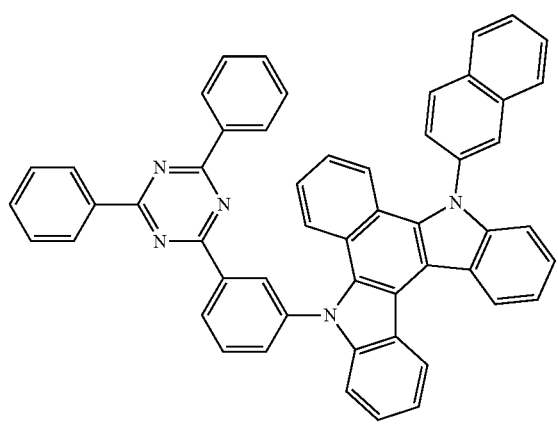
-continued
1-22
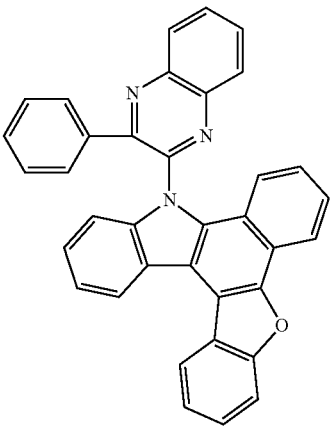
1-23
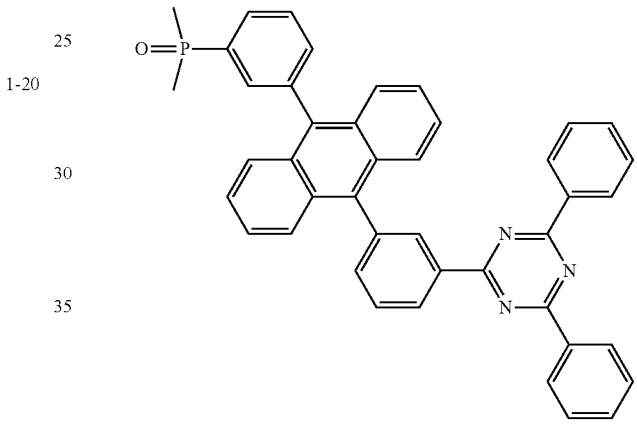
In an embodiment, the second electron transporting compound (ET-2) may be selected from following compounds:
2-1
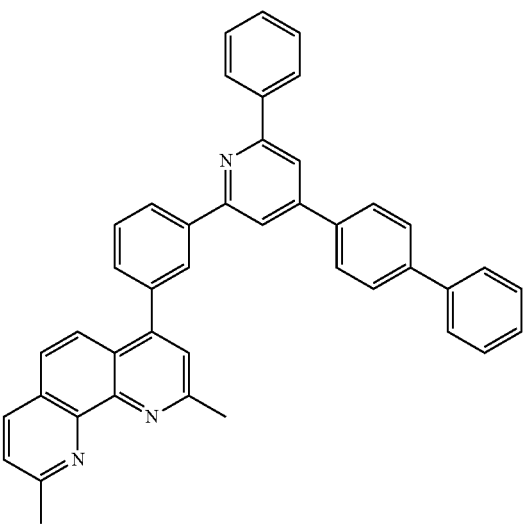

2-2
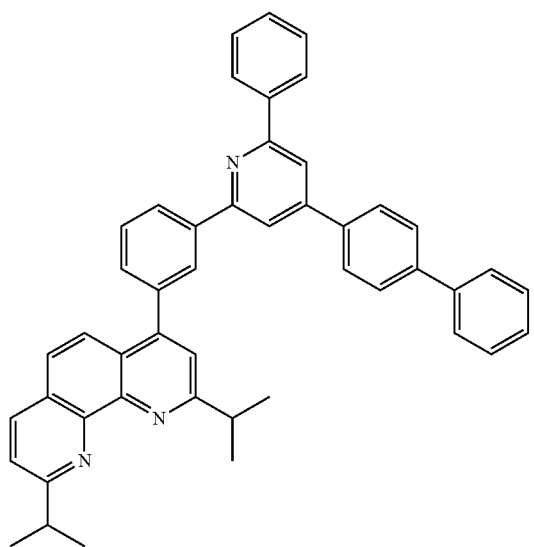
2-3
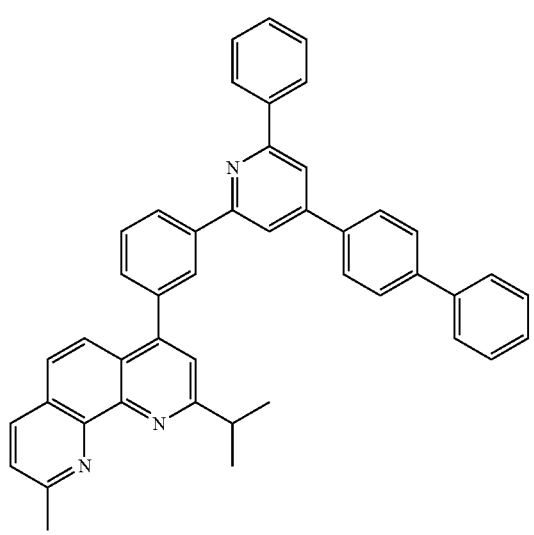
2-4
2-5
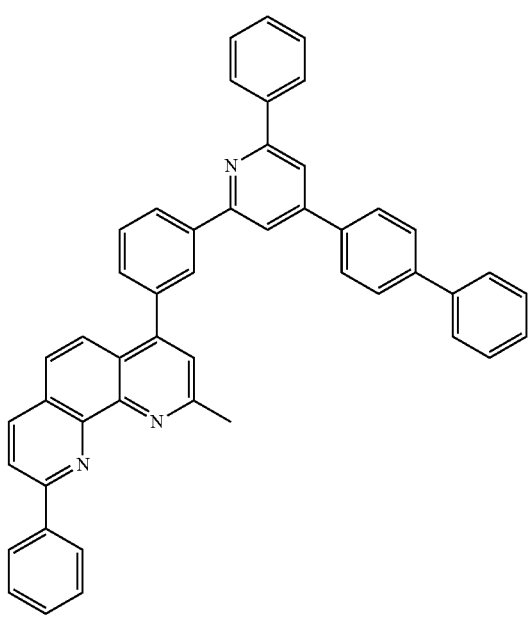
2-6
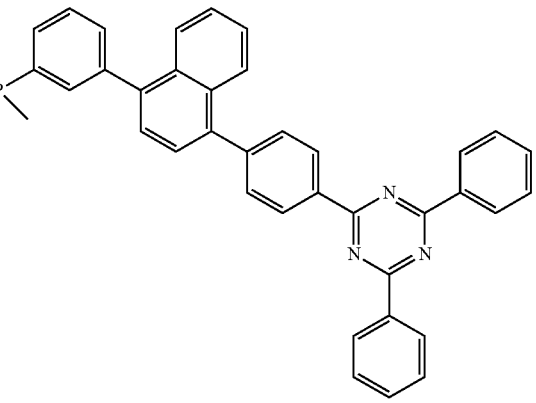
2-7
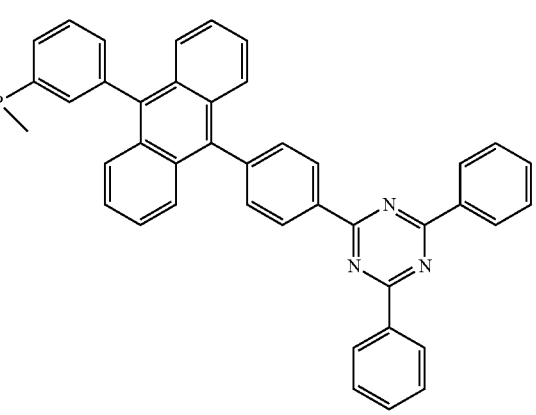

-continued
2-8
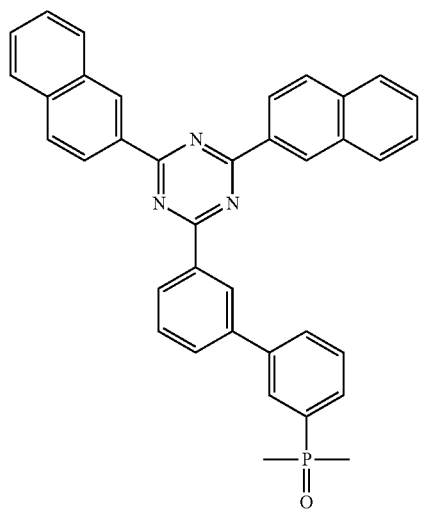
2-9
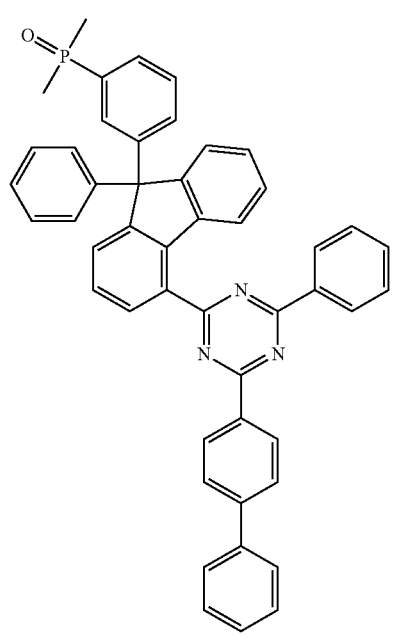
2-10
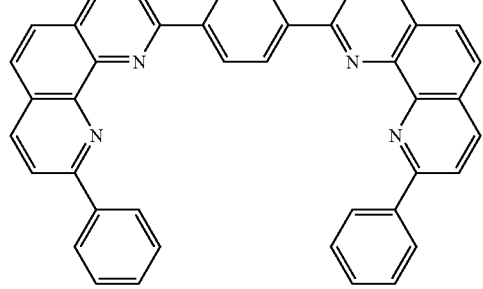
-continued
2-11
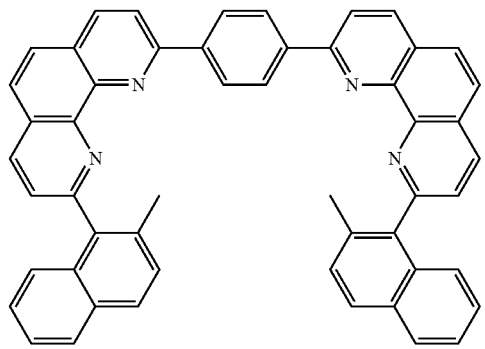
2-12
2-13
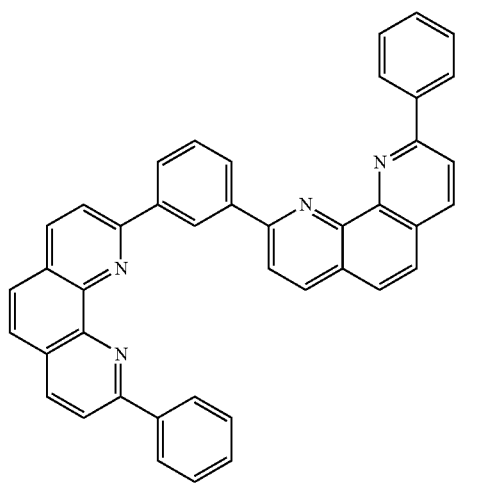
2-14
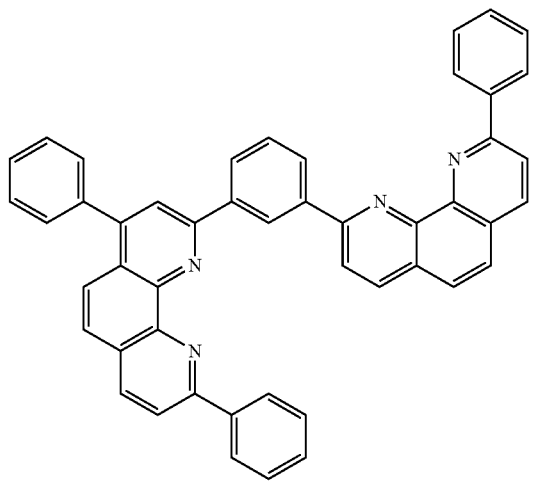
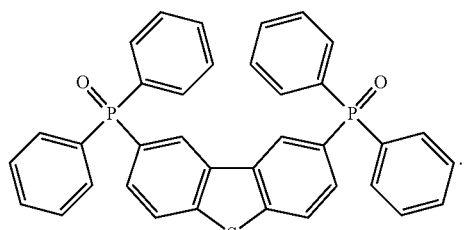
In an embodiment, the dopant compound (D) may have a maximum emission wavelength in a range of about 490 nm to about 580 nm. In an embodiment, the dopant compound (D) may have a maximum emission wavelength in a range of about 510 nm to about 545 nm.

In some embodiments, the interlayer may include emission units in the number of m; and charge generating unit(s) in the number of (m−1), between the emission units that are adjacent to each other, and any one unit of the emission units in the number of m may include the emission layer, the first buffer layer, the second buffer layer, and the electron transport layer.

The light-emitting device layer may include charge generating unit(s) in the number of (m−1), between the emission units in the number of m that are adjacent to each other.

Figure 2:
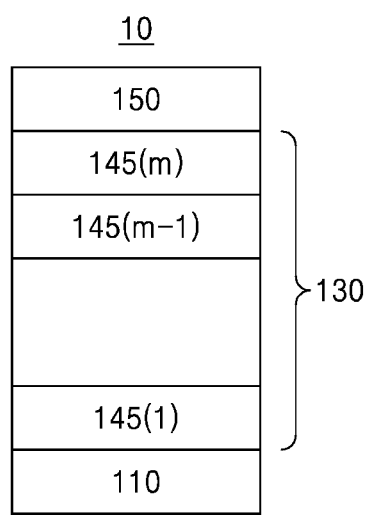
FIG. 2 is a schematic view of a light-emitting device according to an embodiment.

As shown in FIG. 2, a light-emitting device may include an interlayer may include emission units 145(1), 145(m−1), and 145(m) in the number of m; and charge generating unit(s) 144(m−1) in the number of (m−1), between the emission units that are adjacent to each other, wherein any one unit of emission units in the number of m may include the emission layer, the first buffer layer, the second buffer layer, and the electron transport layer.

For example, when m is 2, a first electrode, a first emission unit, a first charge generating unit, and a second emission unit may be sequentially stacked. In this embodiment, the first emission unit may emit a first color light, the second emission unit may emit a second color light, and a maximum emission wavelength of the first color light may be identical to or different from a maximum emission wavelength of the second color light. In this embodiment, any one unit of the first emission unit and the second emission unit may include the emission layer, the first buffer layer, the second buffer layer, and the electron transport layer.

For example, when m is 3, a first electrode, a first emission unit, a first charge generating unit, a second emission unit, a second charge generating unit, and a third emission unit may be sequentially stacked. In this embodiment, the first emission unit may emit a first color light, the second emission unit may emit a second color light, the third emission unit may emit a third color light, and a maximum emission wavelength of the first color light, a maximum emission wavelength of the second color light, and a maximum emission wavelength of the third color light may be identical to or different from one another. In this embodiment, at least one unit of the first emission unit, the second emission unit, and the third emission unit may include the emission layer, the first buffer layer, the second buffer layer, and the electron transport layer.

For example, when m is 4, a first electrode, a first emission unit, a first charge generating unit, a second emission unit, a second charge generating unit, a third emission unit, a third charge generating unit, and a third emission unit may be sequentially stacked. In this embodiment, the first emission unit may emit a first color light, the second emission unit may emit a second color light, the third emission unit may emit a third color light, the fourth emission unit may emit a fourth color light, and a maximum emission wavelength of the first color light, a maximum emission wavelength of the second color light, a maximum emission wavelength of the third color light, and a maximum emission wavelength of the fourth color light, may be identical to or different from one another.

In this embodiment, at least one unit of the first emission unit, the second emission unit, the third emission unit, and the fourth emission unit may include the emission layer, the first buffer layer, the second buffer layer, and the electron transport layer.

When m is in a range of 5 to 7, the above description may also be applied.

For example, when m is 4 or greater, at least one emission unit may be a light-emitting device, in which an emission layer may include a host compound (H-1) and a dopant compound (D), an interlayer may include a first buffer layer including a first electron transporting compound (ET-1), a second buffer layer including a second electron transporting compound (ET-2), and an electron transport layer including a third electron transporting compound (ET-3), an absolute value of a lowest unoccupied molecular orbital (LUMO) energy level of the first electron transporting compound (ET-1) may be smaller than an absolute value of a LUMO energy level of the host compound (H-1), an absolute value of a LUMO energy level of the second electron transporting compound (ET-2) may be smaller than an absolute value of a LUMO energy level of the third electron transporting compound (ET-3), and an absolute value of a LUMO energy level of the second electron transporting compound (ET-2) may be smaller than an absolute value of a LUMO energy level of the first electron transporting compound (ET-1).

The rest of at least three emission units may be a light-emitting device including a blue emission layer.

In some embodiments, a maximum emission wavelength emitted from at least one of the emission units in the number of m may differ from that of light emitted from at least one of the other emission units.

As shown in FIG. 2, from among the emission units in the number of m, an emission unit that may be $m^{th}$ from the first electrode may be indicated as a $m^{th}$ emission unit ELU(m).

Among the emission units in the number of m, an emission unit closest to the first electrode may be indicated as a first emission unit ELU(1), an emission unit farthest from the first electrode may be indicated as the $m^{th}$ emission unit ELU(m), and the first emission unit to the $m^{th}$ emission unit ELU(m) may be sequentially located. That is, a $(m-1)^{th}$ charge generating unit CGU(m−1) may be between the first electrode and the $m^{th}$ emission unit ELU(m).

At least one of the charge generating unit(s) may include an n-type charge generating layer n-CGL, a p-type charge generating layer p-CGL, and/or a hole transport region.

The hole transport region may include a hole injection layer, a hole transport layer, an electron blocking layer, or any combination thereof.

In some embodiments, in the charge generating unit in the number of (m−1), a charge generating unit that may be $(m-1)^{th}$ from a first electrode may be indicated as a $(m-1)^{th}$ charge generating unit.

In some embodiments, the $(m-1)^{th}$ charge generating unit CGU(m−1) may include a $(m-1)^{th}$ n-type charge generating layer, a $(m-1)^{th}$ p-type charge generating layer, and/or a $(m-1)^{th}$ hole transport region.

For example, from among the $(m-1)^{th}$ charge generating unit CGU(m−1), the $(m-1)^{th}$ n-type charge generating layer, a $(m-1)^{th}$ p-type charge generating layer pCGL(m−1), and a $(m-1)^{th}$ hole transport region may be sequentially stacked.

In some embodiments, the $(m-1)^{th}$ p-type charge generating layer pCGL(m−1) may be in direct contact with the $(m-1)^{th}$ n-type charge transport layer nCGL(m−1) and the hole transport region.

According to one or more embodiments, an electronic apparatus may include the light-emitting device. The electronic apparatus may further include a thin-film transistor. In some embodiments, the electronic apparatus may further include a thin-film transistor including a source electrode and drain electrode, and a first electrode of the light-emitting device may be electrically connected to the source electrode or the drain electrode.

The electronic apparatus may further include a color filter, a color-conversion layer, a touchscreen layer, a polarizing layer, or any combination thereof. The electronic apparatus may be understood by referring to the description of the electronic apparatus provided herein.

The term "interlayer" as used herein refers to a single layer and/or a plurality of all layers located between a first electrode and a second electrode in a light-emitting device.

Description of FIG. 1

FIG. 1 is a schematic view of a light-emitting device 10 according to an embodiment that is constructed according to principles of the invention. The light-emitting device 10 may include a first electrode 110, an interlayer 130, and a second electrode 150.

Hereinafter, the structure of the light-emitting device 10 according to an embodiment and a method of manufacturing the light-emitting device 10 according to an embodiment will be described in connection with FIG. 1.

First Electrode 110

In FIG. 1, a substrate may be additionally located under the first electrode 110 or above the second electrode 150. The substrate may be a glass substrate or a plastic substrate. The substrate may be a flexible substrate including plastic having excellent heat resistance and durability, for example, polyimide, polyethylene terephthalate (PET), polycarbonate, polyethylene naphthalate, polyarylate (PAR), polyetherimide, or any combination thereof.

The first electrode 110 may be formed by depositing or sputtering, on the substrate, a material for forming the first electrode 110. When the first electrode 110 is an anode, a high work function material that may easily inject holes may be used as a material for a first electrode.

The first electrode 110 may be a reflective electrode, a semi-transmissive electrode, or a transmissive electrode. When the first electrode 110 is a transmissive electrode, a material for forming the first electrode 110 may be indium tin oxide (ITO), indium zinc oxide (IZO), tin oxide ($SnO_2$), zinc oxide (ZnO), or any combination thereof. In some embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as a material for forming the first electrode 110.

The first electrode 110 may have a single-layered structure consisting of a single layer or a multi-layered structure including two or more layers. In some embodiments, the first electrode 110 may have a triple-layered structure of ITO/Ag/ITO.

Interlayer 130

The interlayer 130 may be on the first electrode 110. The interlayer 130 may include an emission layer.

The interlayer 130 may further include a hole transport region between the first electrode 110 and the emission layer and an electron transport region between the emission layer and the second electrode 150.

The interlayer 130 may further include metal-containing compounds such as organometallic compounds, inorganic materials such as quantum dots, and the like, in addition to various organic materials.

The interlayer 130 may include: i) at least two emitting layers sequentially stacked between the first electrode 110 and the second electrode 150; and ii) a charge-generation layer located between the at least two emitting layers. When the interlayer 130 includes the at least two emitting layers and the charge generation layer, the light-emitting device 10 may be a tandem light-emitting device.

Hole Transport Region in Interlayer 130

The hole transport region may have i) a single-layered structure consisting of a single layer consisting of a single material, ii) a single-layered structure consisting of a single layer including a plurality of different materials, or iii) a multi-layered structure having a plurality of layers including a plurality of different materials.

The hole transport region may include a hole injection layer, a hole transport layer, an emission auxiliary layer, an electron blocking layer, or a combination thereof.

For example, the hole transport region may have a multi-layered structure, e.g., a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein layers of each structure are sequentially stacked on the first electrode 110 in each stated order.

For example, the hole transport region may have a multi-layered structure, e.g., a hole transport layer/emission auxiliary layer structure, or a hole transport layer/electron blocking layer structure, wherein layers of each structure are sequentially stacked on the first electrode 110 in each stated order.

The hole transport region may include the compound represented by Formula 201, the compound represented by Formula 202, or any combination thereof:

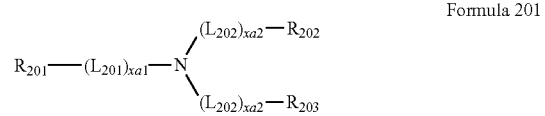

Formula 201

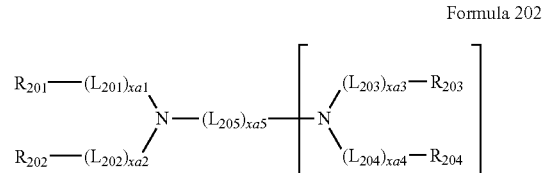

Formula 202 wherein, in Formulas 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (e.g., a carbazole group or the like) unsubstituted or substituted with at least one $R_{10a}$ (e.g., Compound HT16 described herein), $R_{203}$ and $R_{204}$ may optionally be bound to each other via a single bond, a $C_1$-$C_5$ alkylene group unsubstituted or substituted with at least one $R_{10a}$ or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and na1 may be an integer from 1 to 4.

In some embodiments, Formulas 201 and 202 may each include at least one of groups represented by Formulas CY201 to CY217:

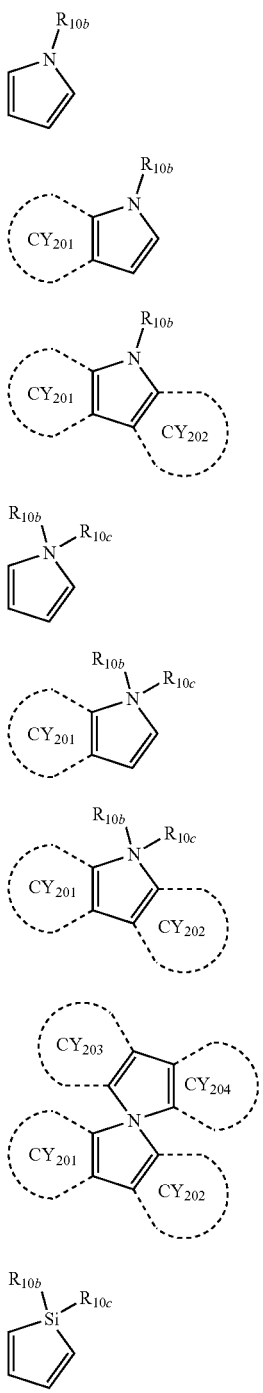
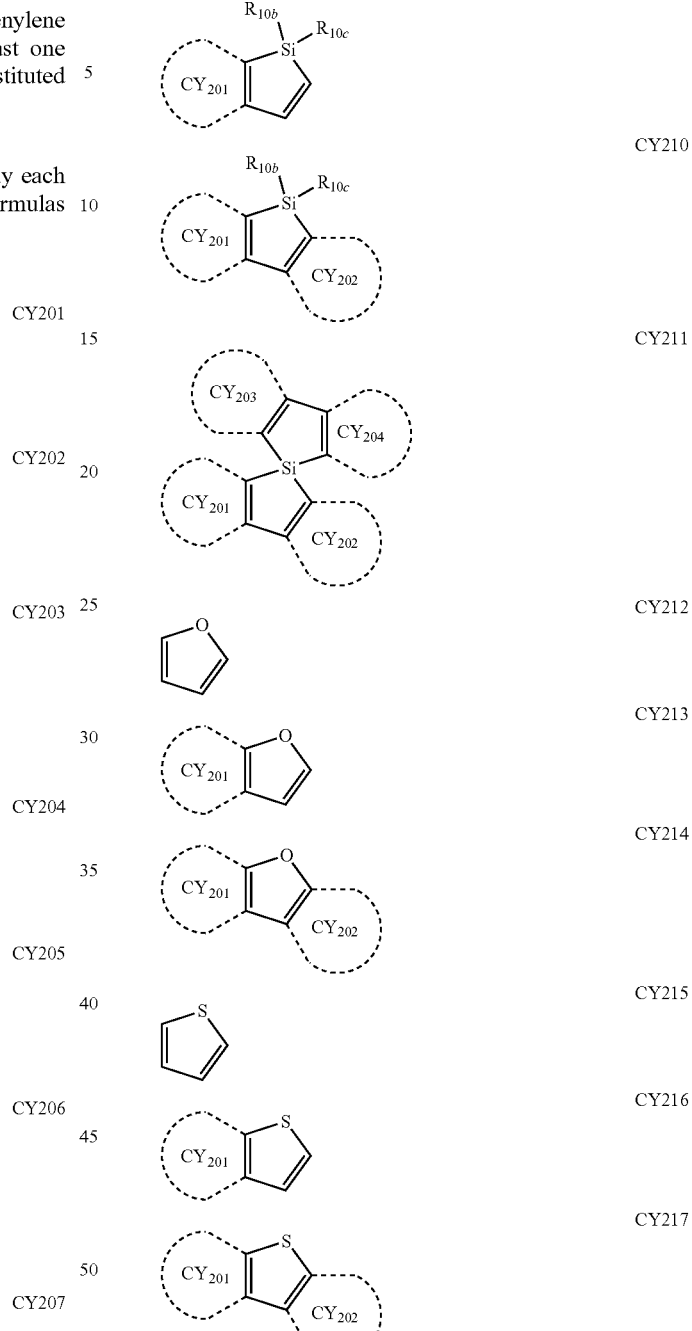

wherein, in Formulas CY201 to CY217, $R_{10b}$ and $R_{10c}$ may each be understood by referring to the descriptions of $R_{10a}$, ring CY201 to ring CY204 may each independently be a $C_3$-$C_{20}$ carbocyclic group or a $C_1$-$C_{20}$ heterocyclic group, and at least one hydrogen in Formulas CY201 to CY217 may be unsubstituted or substituted with $R_{10a}$.

In an embodiment, in Formulas CY201 to CY217, ring CY201 to ring CY204 may each independently be a benzene group, a naphthalene group, a phenanthrene group, or an anthracene group.

In one or more embodiments, Formulas 201 and 202 may each include at least one of groups represented by Formulas CY201 to CY203.

In one or more embodiments, Formula 201 may include at least one of groups represented by Formulas CY201 to CY203 and at least one of groups represented by Formulas CY204 to CY217.

In one or more embodiments, in Formula 201, xa1 may be 1, R201 may be represented by one of Formulas CY201 to CY203, xa2 may be 0, and R202 may be represented by one of Formulas CY204 to CY207.

In one or more embodiments, Formulas 201 and 202 may each not include groups represented by Formulas CY201 to CY203.

In one or more embodiments, Formulas 201 and 202 may each not include groups represented by Formulas CY201 to CY203, and include at least one of groups represented by Formulas CY204 to CY217.

In one or more embodiments, Formulas 201 and 202 may each not include groups represented by Formulas CY201 to CY217.

In some embodiments, the hole transport region may include one of Compounds HT1 to HT46 and m-MTDATA, TDATA, 2-TNATA, NPB (NPD), β-NPB, TPD, spiro-TPD, spiro-NPB, methylated-NPB, TAPC, HMTPD, 4,4', 4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphorsulfonic acid (PANI/CSA), polyaniline/poly(4-styrenesulfonate (PANI/PSS), or any combination thereof:

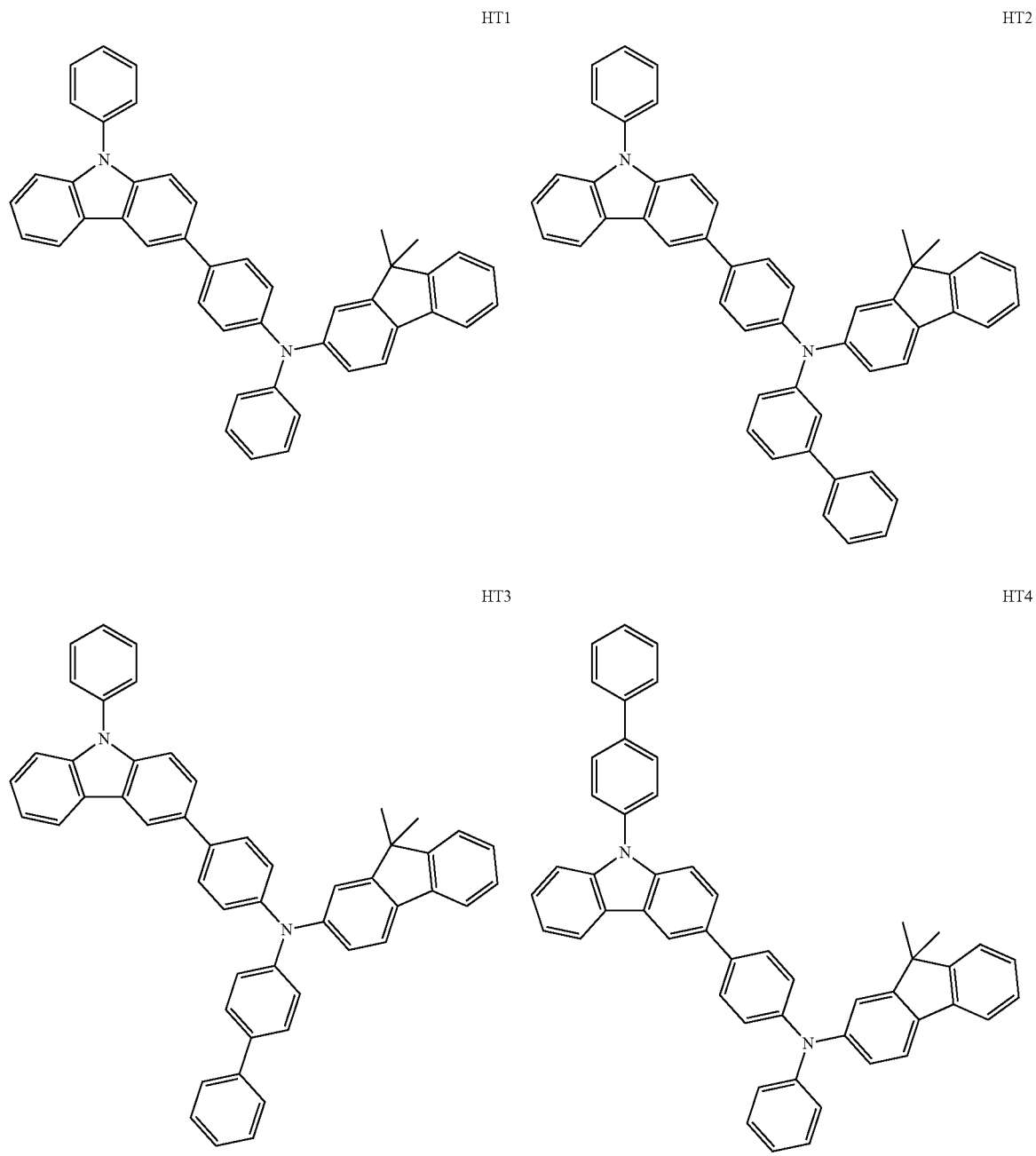

-continued
HT5
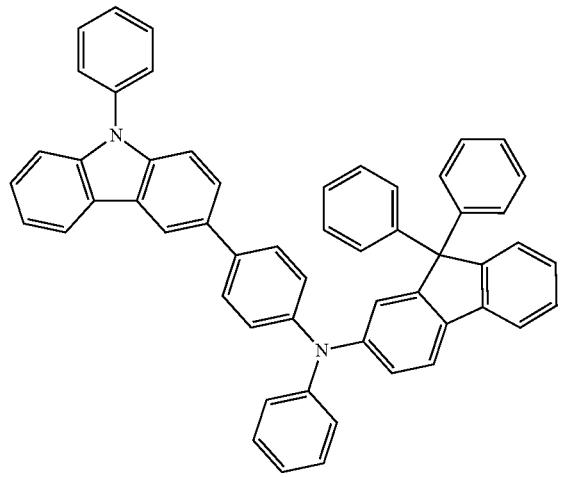
HT6
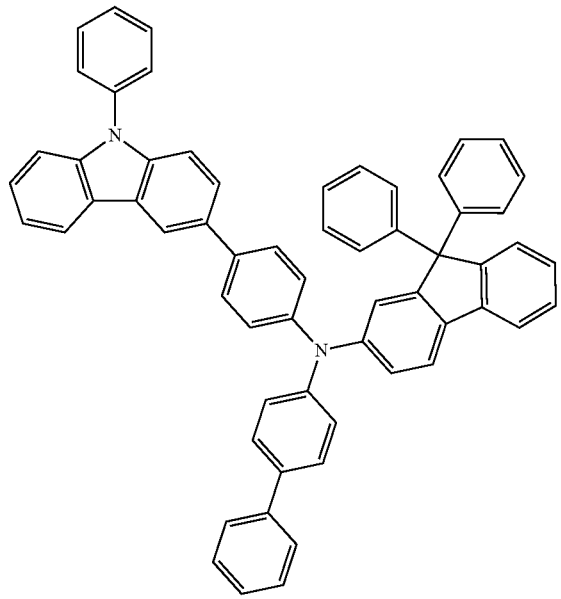
HT7
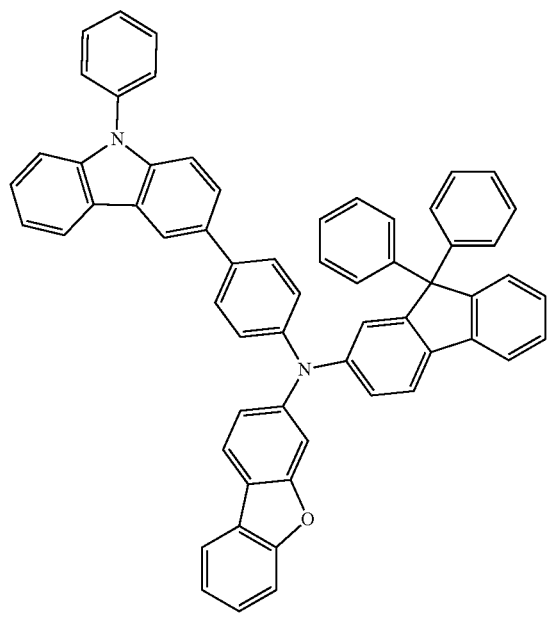
HT8
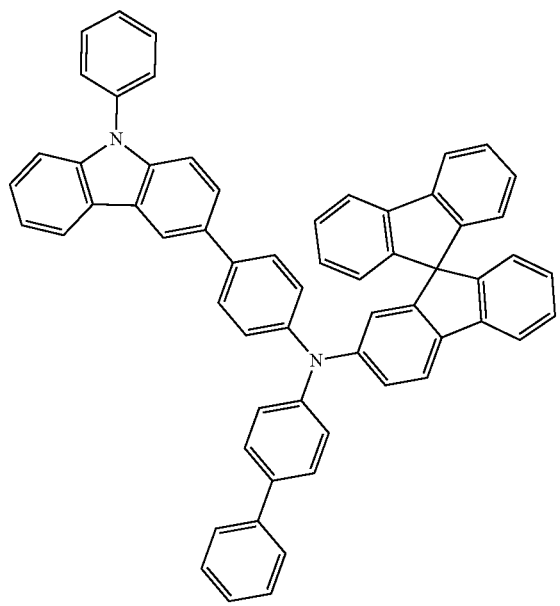

HT9
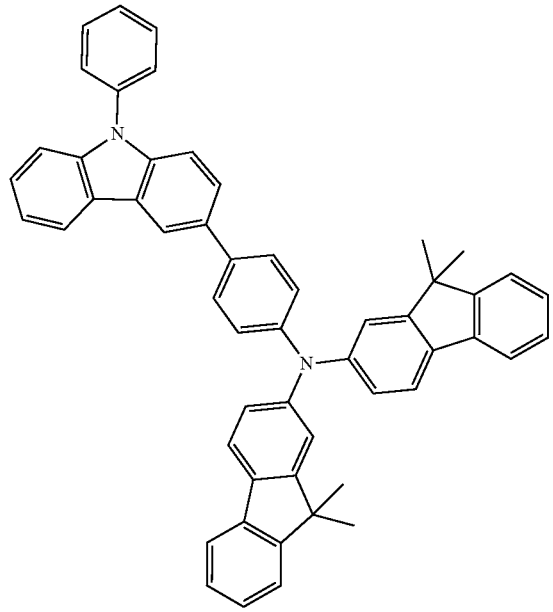
HT10
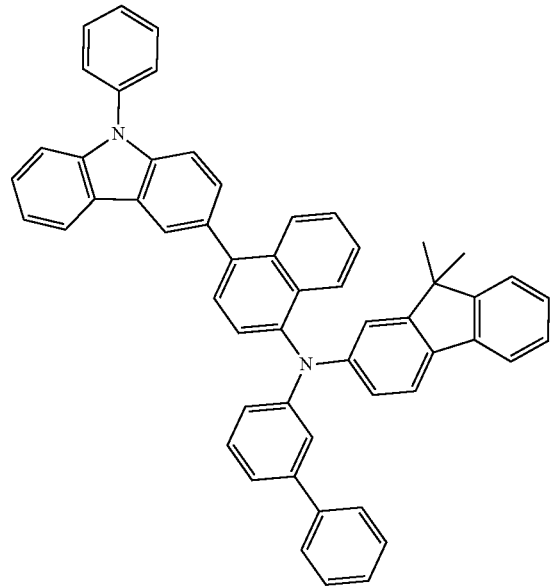
HT11
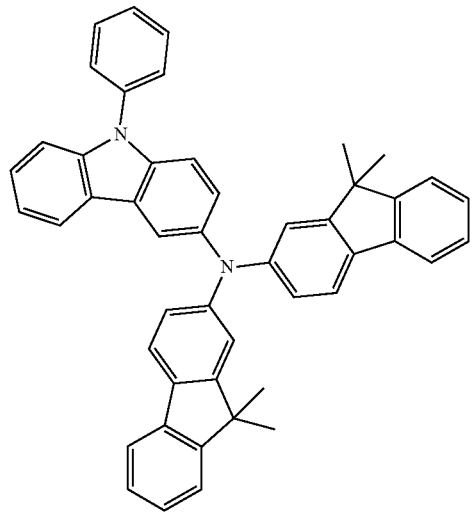
HT12
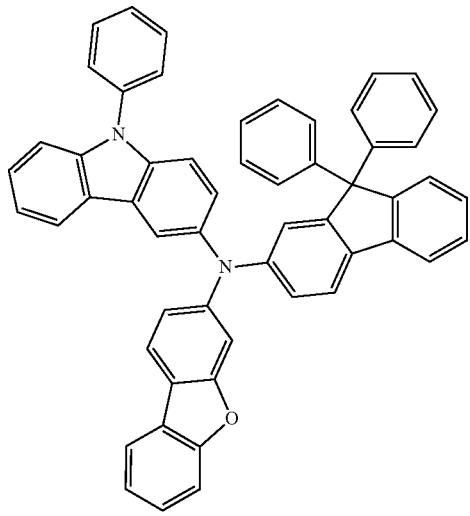

-continued
HT13
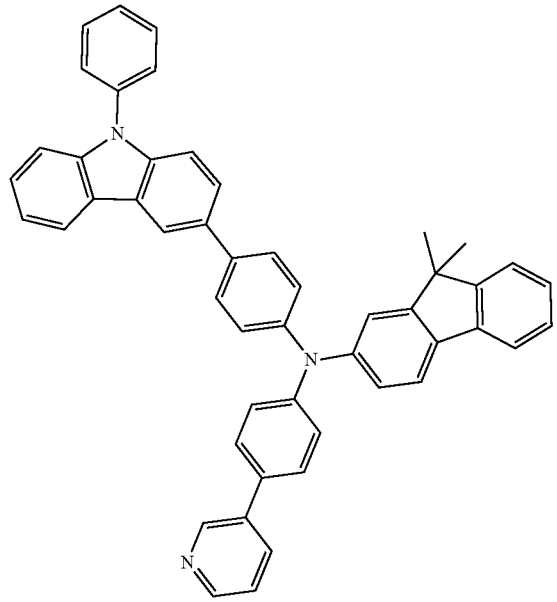
HT14
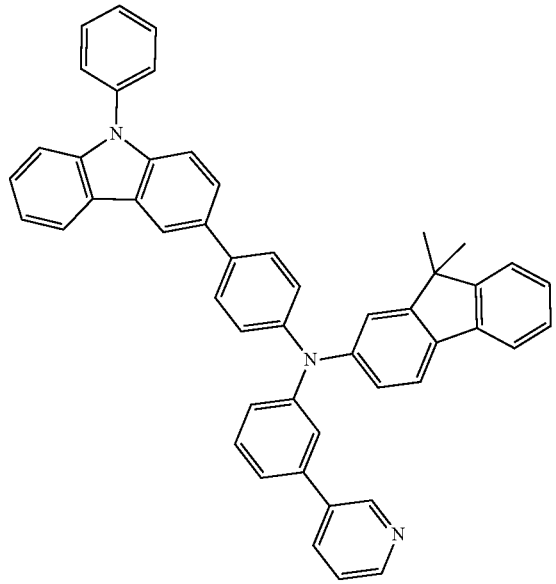
HT15
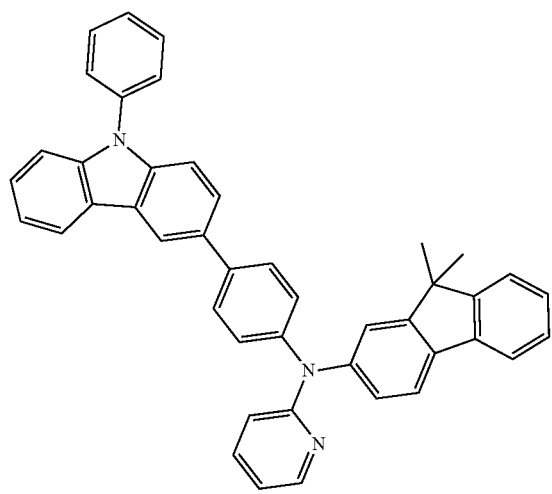
HT16
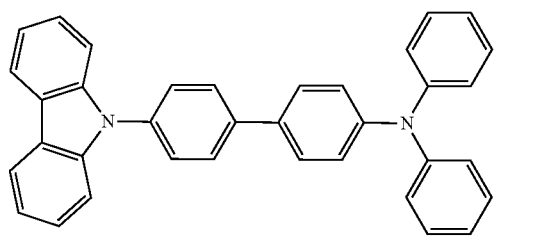
HT17
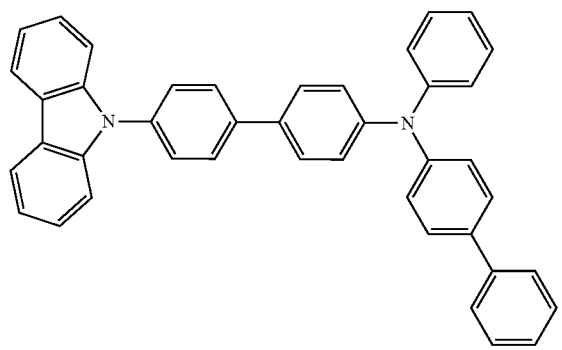
HT18
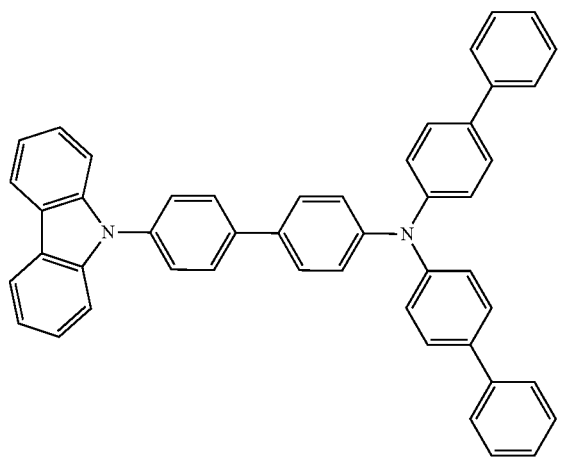

-continued
HT19
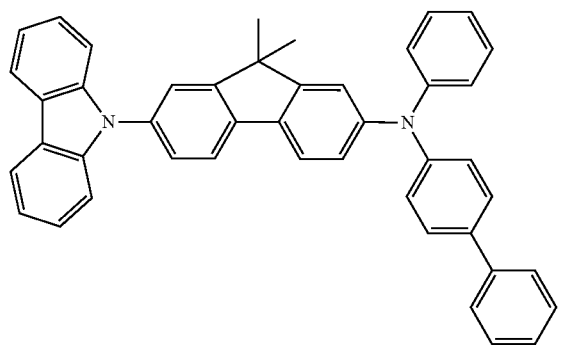
HT20
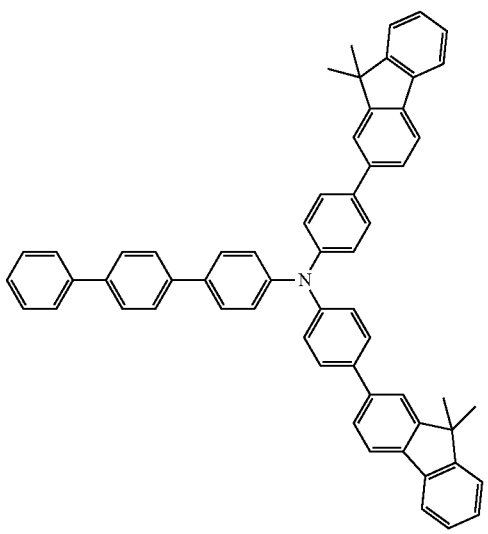
HT21
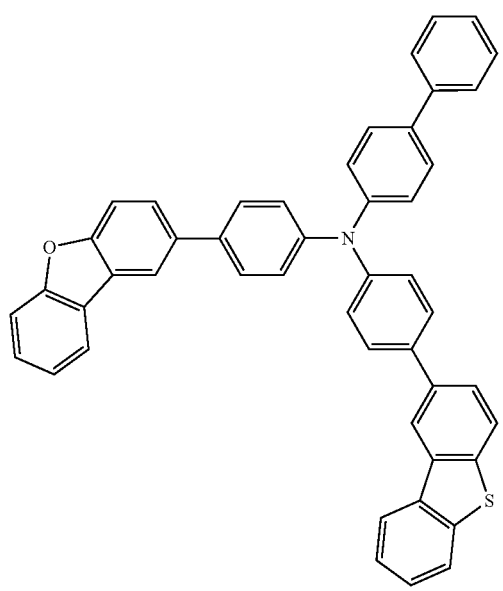
HT22
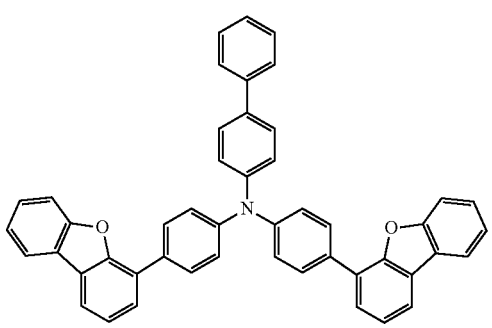
HT23
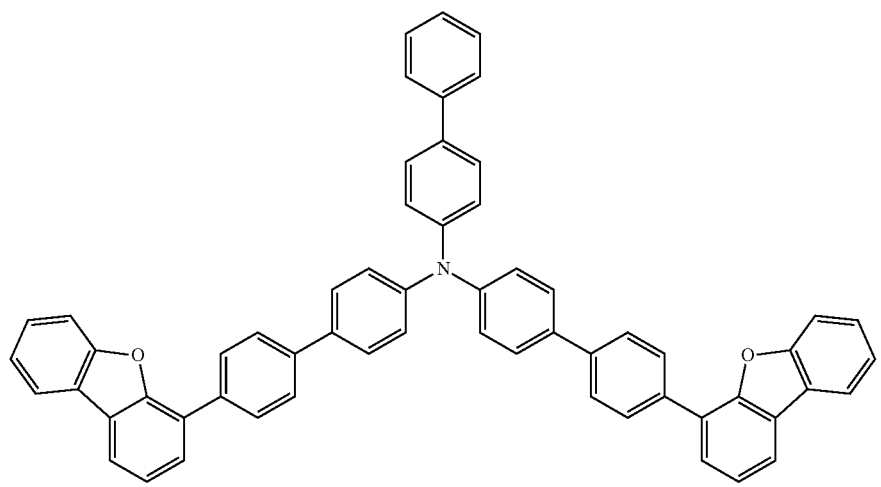

HT24
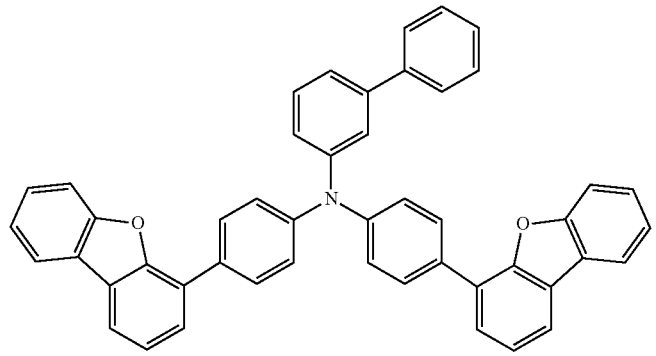
HT25 HT26
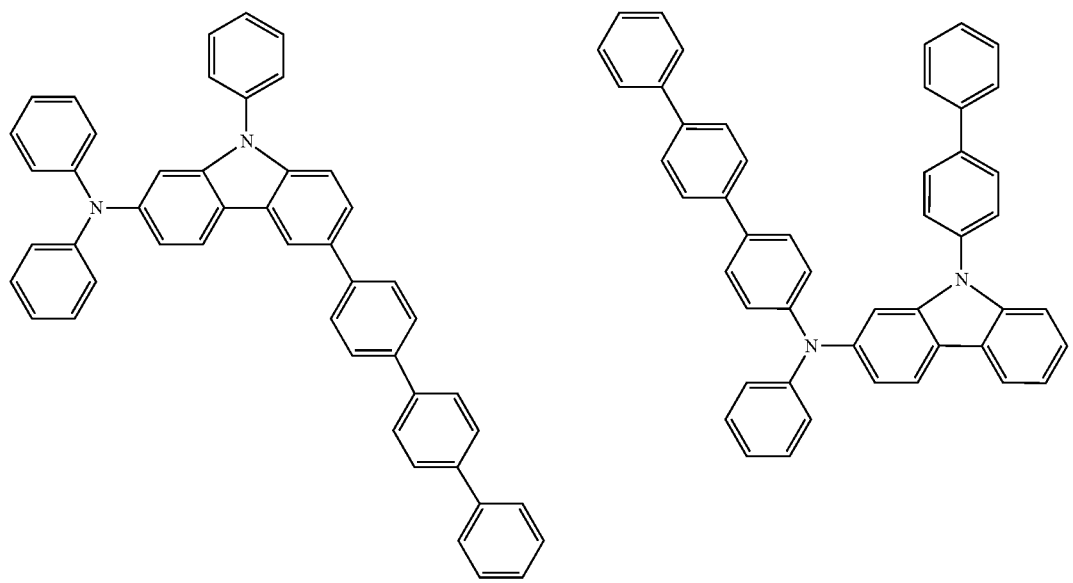
HT27
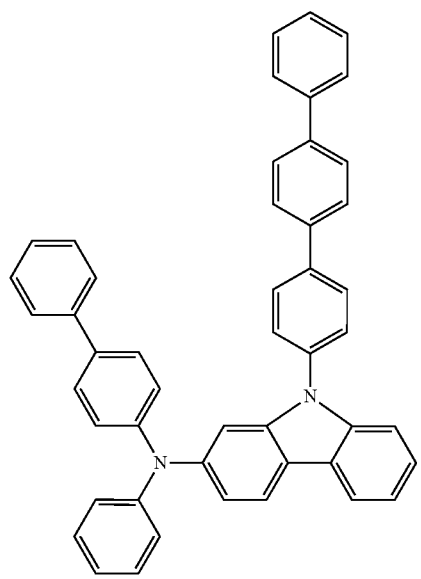

HT28
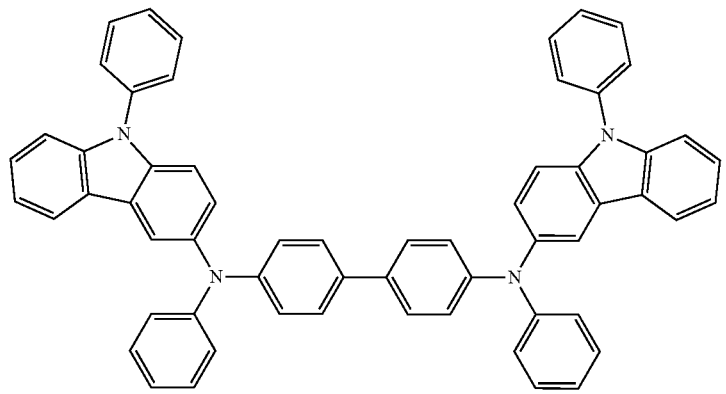
HT29
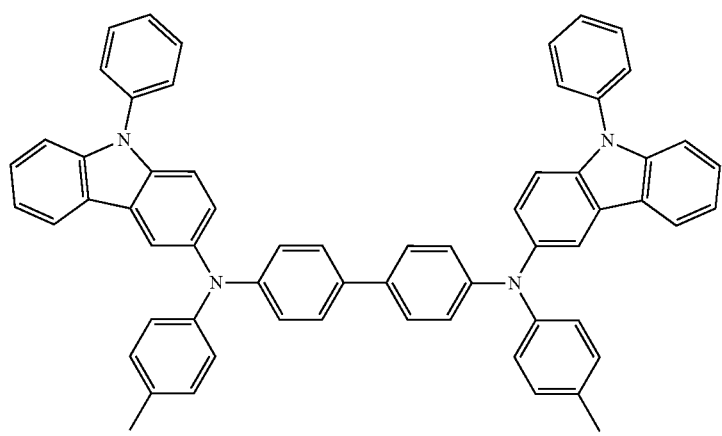
HT30
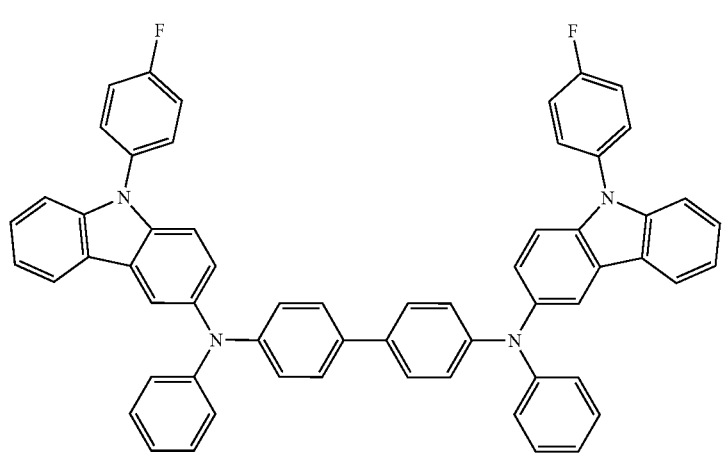

HT31
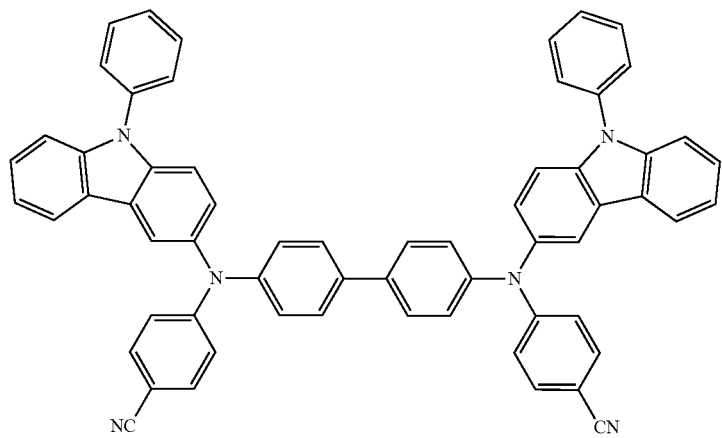
HT32
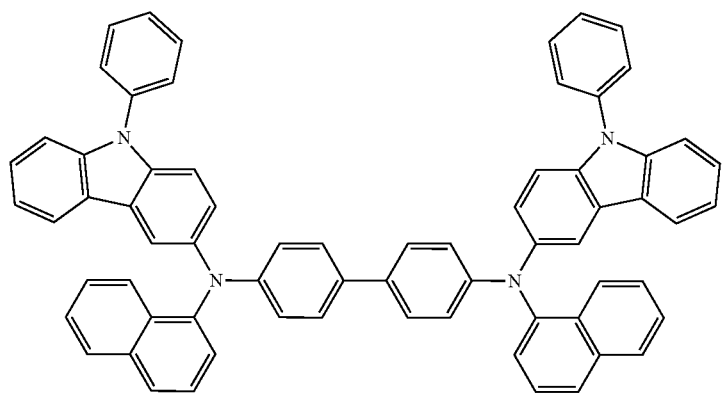
HT33
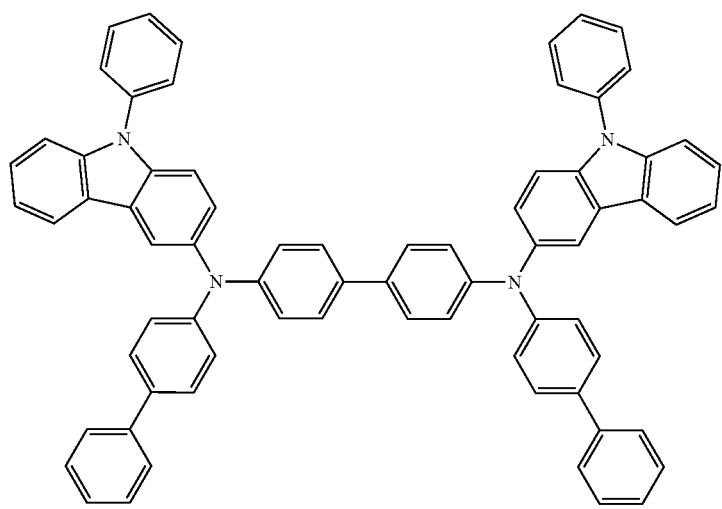

-continued
HT34
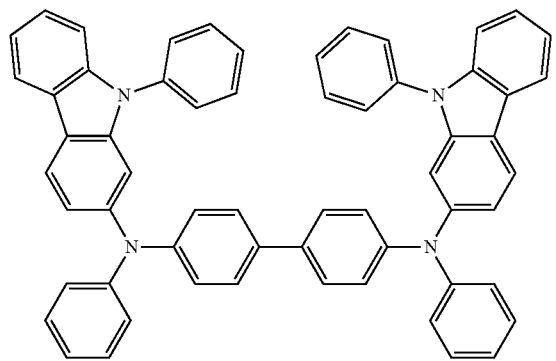
HT35
HT36
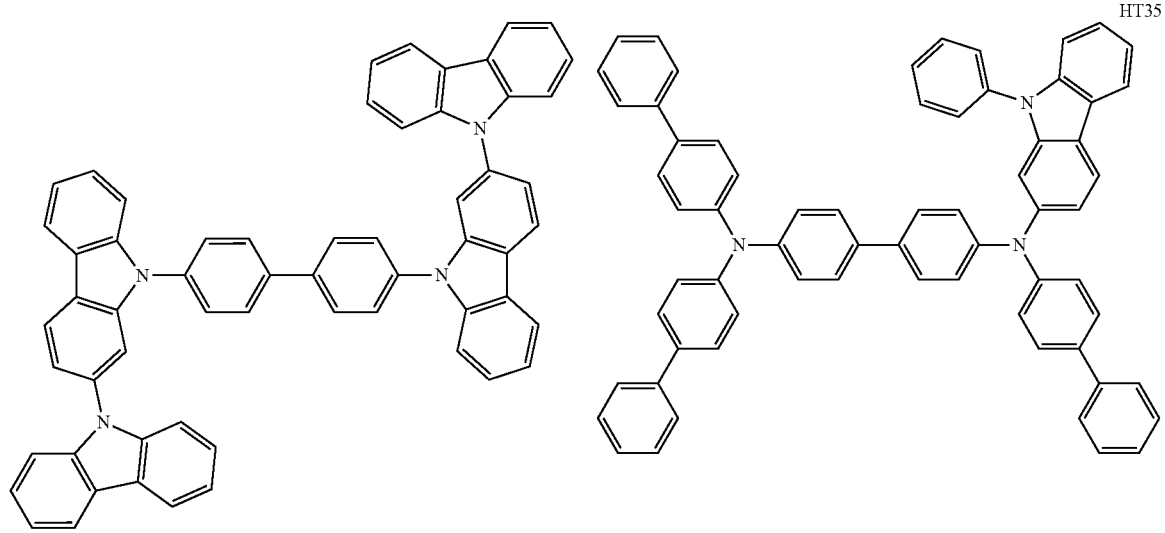
HT37
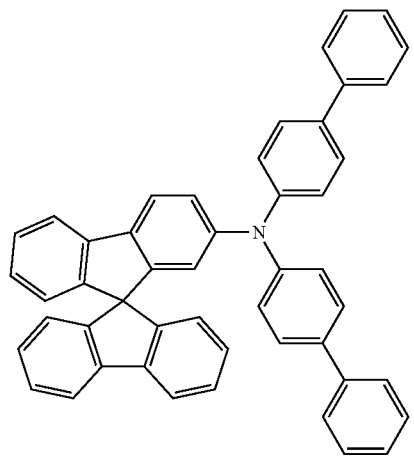
HT38
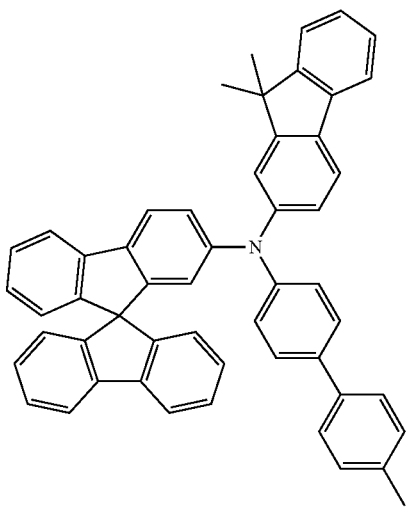

-continued
HT39
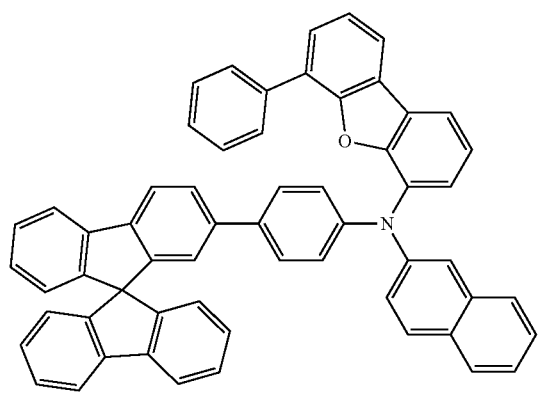
HT40
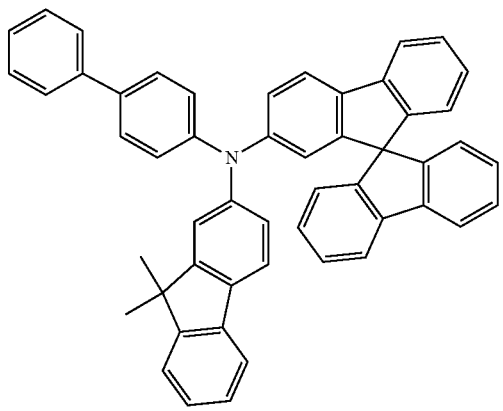
HT41
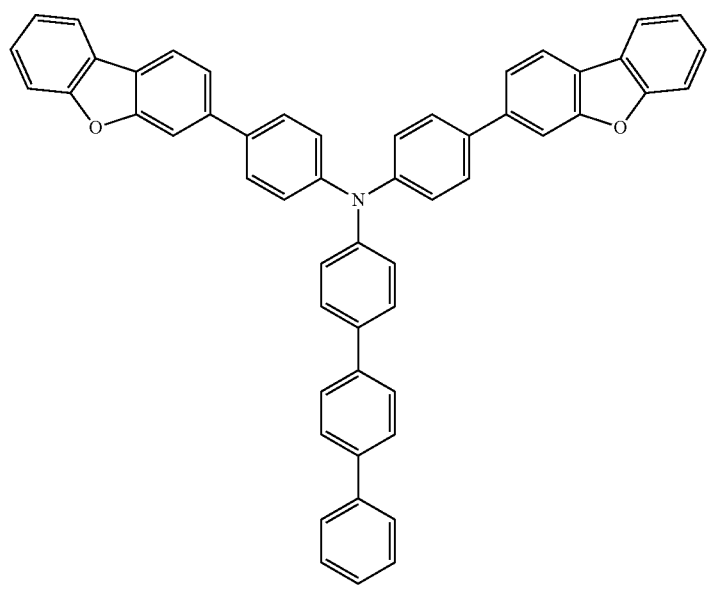
HT42
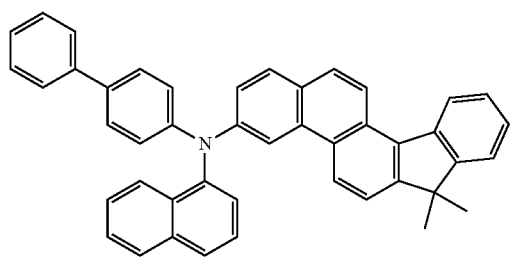
HT43
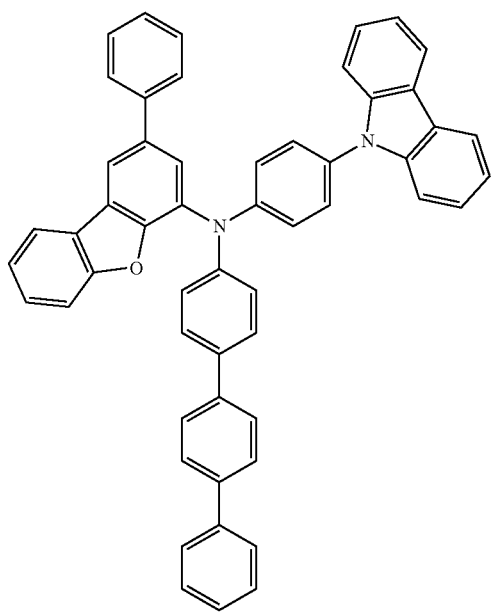

-continued
HT44
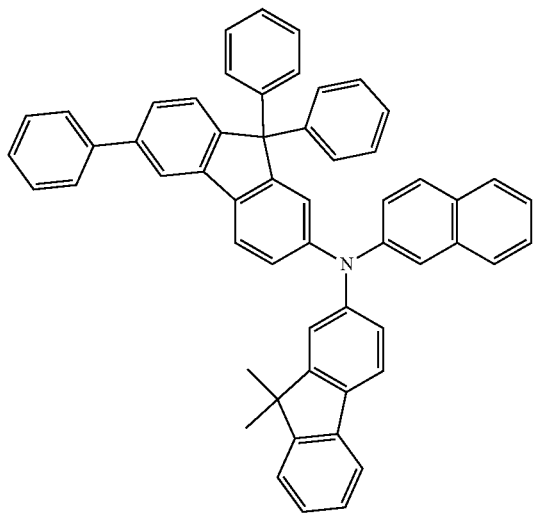
HT45
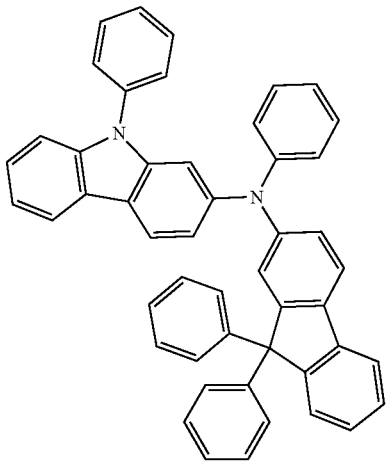
HT46
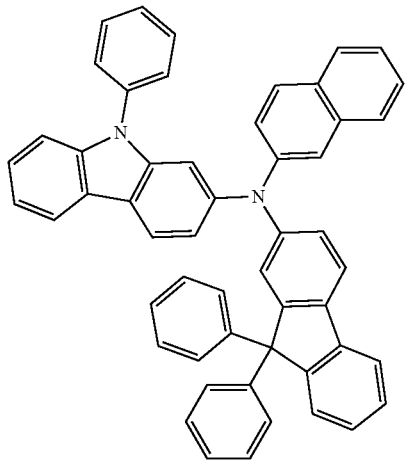
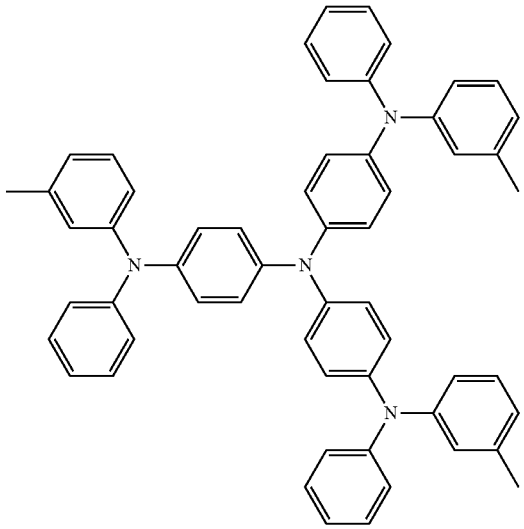
m-MTDATA
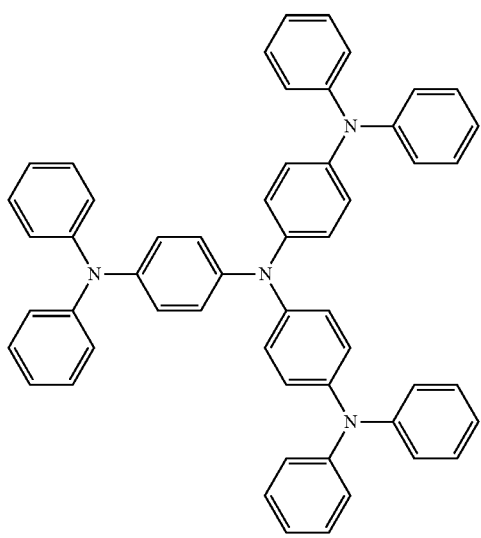
TDATA -continued
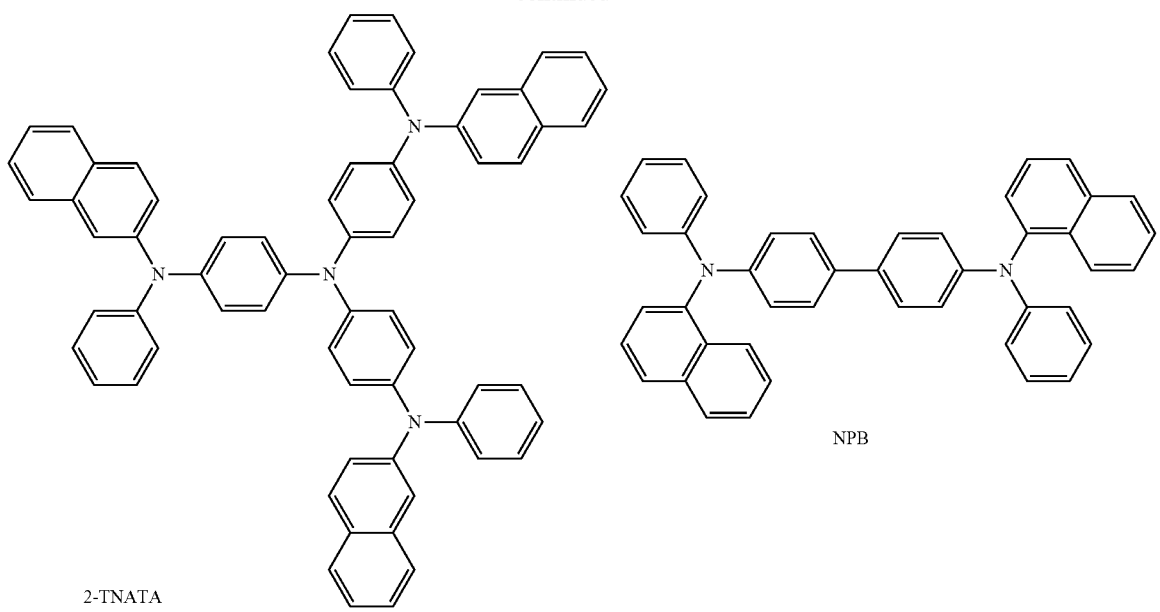
2-TNATA
NPB
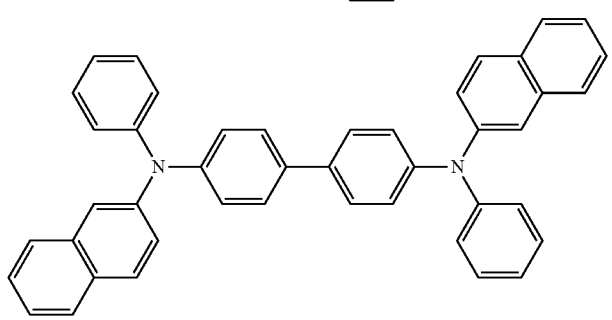
B-NPB
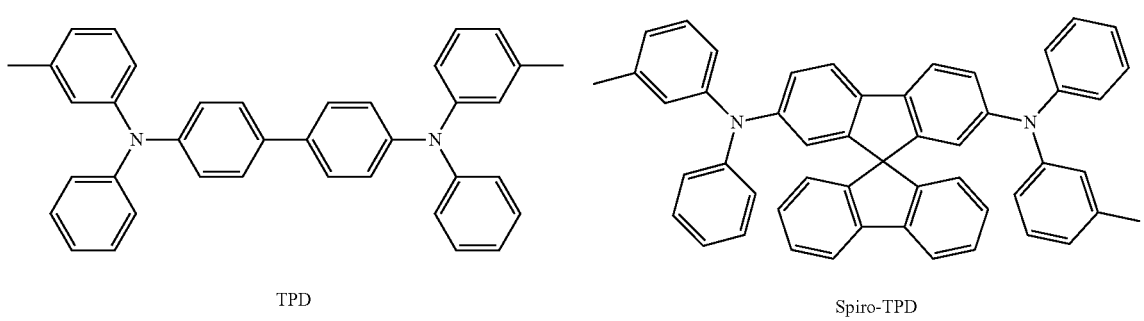
TPD
Spiro-TPD
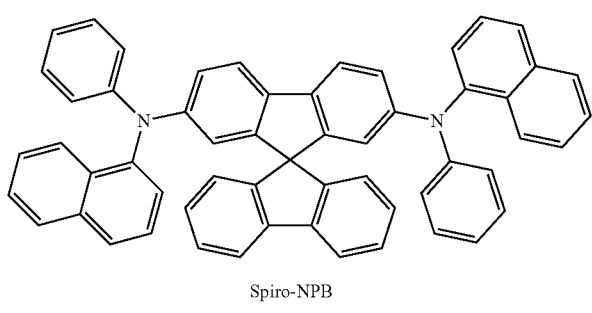
Spiro-NPB

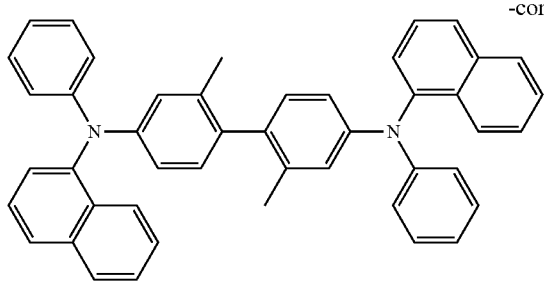

methylated-NPB

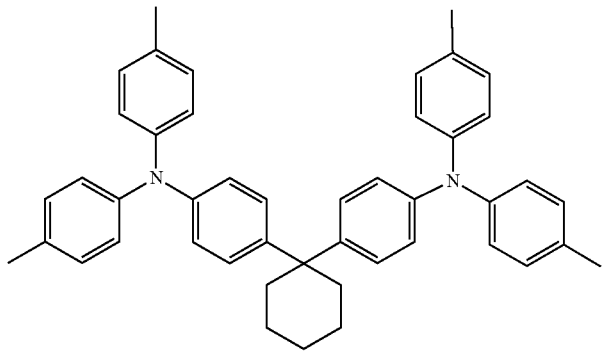

TAPC

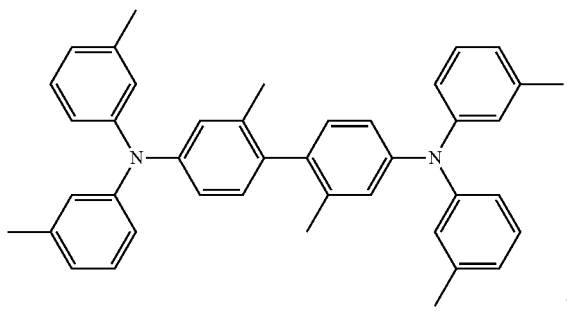

HMTPD

The thickness of the hole transport region may be in a range of about 50 Angstroms (Å) to about 10,000 Å, for example, about 100 Å to about 4,000 Å. When the hole transport region includes a hole transport layer, an electron blocking layer, or any combination thereof, the thickness of the hole transport layer may be in a range of about 50 Å to about 2,000 Å, or for example, about 100 Å to about 1,500 Å. When the thicknesses of the hole transport region and the hole transport layer are within any of these ranges, excellent hole transport characteristics may be obtained without a substantial increase in driving voltage.

The emission auxiliary layer may increase light emission efficiency by compensating for an optical resonance distance according to the wavelength of light emitted by an emission layer. The electron blocking layer may prevent leakage of electrons to a hole transport region from the emission layer. Materials that may be included in the hole transport region may also be included in an emission auxiliary layer and an electron blocking layer.

p-Dopant

The hole transport region may include a charge generating material as well as the aforementioned materials to improve conductive properties of the hole transport region. The charge generating material may be substantially homogeneously or non-homogeneously dispersed (for example, as a single layer consisting of charge generating material) in the hole transport region.

The charge generating material may include, for example, a p-dopant.

In some embodiments, a lowest unoccupied molecular orbital (LUMO) energy level of the p-dopant may be −3.5 eV or less.

In some embodiments, the p-dopant may include a quinone derivative, a compound containing a cyano group, a compound containing element EL1 and element EL2, or any combination thereof.

Examples of the quinone derivative may include TCNQ, F4-TCNQ, and the like.

Examples of the compound containing a cyano group include HAT-CN, a compound represented by Formula 221, and the like:

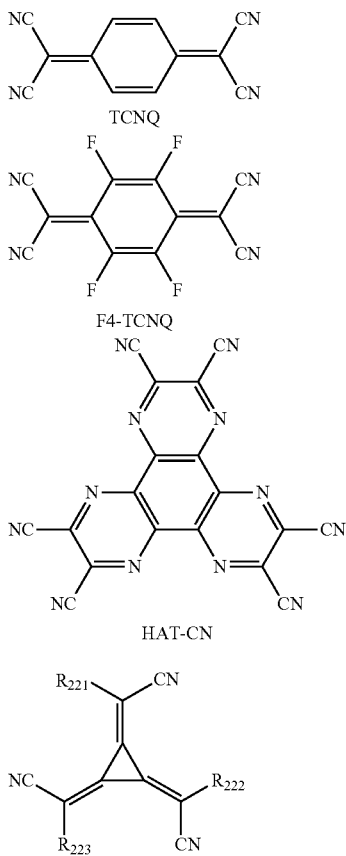

Formula 221 wherein, in Formula 221,
$R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, at least one of R221 to $R_{223}$ may each independently be: a $C_3$-$C_{60}$ carbocyclic group or a $C_1$-$C_{60}$ heterocyclic group, substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be a metal, a metalloid, or a combination thereof, and element EL2 may be non-metal, a metalloid, or a combination thereof.

Examples of the metal may include: an alkali metal (e.g., lithium (Li), sodium (Na), potassium (K), rubidium (Rb), cesium (Cs), or the like); an alkaline earth metal (e.g., beryllium (Be), magnesium (Mg), calcium (Ca), strontium (Sr), barium (Ba), or the like); a transition metal (e.g., titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), or the like); post-transition metal (e.g., zinc (Zn), indium (In), tin (Sn), or the like); a lanthanide metal (e.g., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or the like); and the like.

Examples of the metalloid may include silicon (Si), antimony (Sb), tellurium (Te), and the like.

Examples of the non-metal may include oxygen (O), halogen (e.g., F, Cl, Br, I, and the like), and the like.

For example, the compound containing element EL1 and element EL2 may include a metal oxide, a metal halide (e.g., metal fluoride, metal chloride, metal bromide, metal iodide, and the like), a metalloid halide (e.g., a metalloid fluoride, a metalloid chloride, a metalloid bromide, a metalloid iodide, and the like), a metal telluride, or any combination thereof.

Examples of the metal oxide may include a tungsten oxide (e.g., WO, $W_2O_3$, $WO_2$, $WO_3$, or $W_{2O5}$), a vanadium oxide (e.g., VO, $V_2O_3$, $VO_2$, or $V_2O_5$), a molybdenum oxide (MoO, $Mo_2O_3$, $MoO_2$, $MoO_3$, or $Mo_2O_5$), and a rhenium oxide (e.g., $ReO_3$).

Examples of the metal halide may include alkali metal halide, alkaline earth metal halide, transition metal halide, post-transition metal halide, lanthanide metal halide, and the like.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, and the like.

Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include a titanium halide (e.g., $TiF_4$, $TiCl_4$, $TiBr_4$, or $TiI_4$), a zirconium halide (e.g., $ZrF_4$, $ZrCl_4$, $ZrBr_4$, or $ZrI_4$), a hafnium halide (e.g., $HfF_4$, $HfCl_4$, $HfBr_4$, or $HfI_4$), a vanadium halide (e.g., $VF_3$, $VCl_3$, $VBr_3$, or $VI_3$), a niobium halide (e.g., $NbF_3$, $NbCl_3$, $NbBr_3$, or $NbI_3$), a tantalum halide (e.g., $TaF_3$, $TaCl_3$, $TaBr_3$, or $TaI_3$), a chromium halide (e.g., $CrF_3$, $CrCl_3$, $CrBr_3$, or $CrI_3$), a molybdenum halide (e.g., $MoF_3$, $MoCl_3$, $MoBr_3$, or $MoI_3$), a tungsten halide (e.g., $WF_3$, $WCl_3$, $WBr_3$, or $WI_3$), a manganese halide (e.g., $MnF_2$, $MnCl_2$, $MnBr_2$, or $MnI_2$), a technetium halide (e.g., $TcF_2$, $TcCl_2$, $TcBr_2$, or $TcI_2$), a rhenium halide (e.g., $ReF_2$, $ReCl_2$, $ReBr_2$, or $ReI_2$), an iron halide (e.g., $FeF_2$, $FeCl_2$, $FeBr_2$, or $FeI_2$), a ruthenium halide (e.g., $RuF_2$, $RuCl_2$, $RuBr_2$, or $RuI_2$), an osmium halide (e.g., OsF2, $OsCl_2$, $OsBr_2$, or $OsI_2$), a cobalt halide (e.g., $CoF_2$, $CoCl_2$, $CoBr_2$, or $CoI_2$), a rhodium halide (e.g., $RhF_2$, $RhCl_2$, $RhBr_2$, or $RhI_2$), an iridium halide (e.g., $IrF_2$, $IrCl_2$, $IrBr_2$, or $IrI_2$), a nickel halide (e.g., $NiF_2$, $NiCl_2$, $NiBr_2$, or $NiI_2$), a palladium halide (e.g., $PdF_2$, $PdCl_2$, $PdBr_2$, or $PdI_2$), a platinum halide (e.g., $PtF_2$, $PtCl_2$, $PtBr_2$, or $PtI_2$), a copper halide (e.g., CuF, CuCl, CuBr, or CuI), a silver halide (e.g., AgF, AgCl, AgBr, or AgI), and a gold halide (e.g., AuF, AuCl, AuBr, or AuI).

Examples of the post-transition metal halide may include a zinc halide (e.g., $ZnF_2$, $ZnCl_2$, $ZnBr_2$, or $ZnI_2$), an indium halide (e.g., $InI_3$), and a tin halide (e.g., $SnI_2$).

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, and $SmI_3$.

Examples of the metalloid halide may include an antimony halide (e.g., $SbCl_5$).

Examples of the metal telluride may include an alkali metal telluride (e.g., $Li_2Te$, $Na_2Te$, $K_2Te$, $Rb_2Te$, or $Cs_2Te$), an alkaline earth metal telluride (e.g., BeTe, MgTe, CaTe, SrTe, or BaTe), a transition metal telluride (e.g., $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, or $Au_2Te$), a post-transition metal telluride (e.g., ZnTe), and a lanthanide metal telluride (e.g., LaTe, CeTe, PrTe, NdTe, PmTe, EuTe, GdTe, TbTe, DyTe, HoTe, ErTe, TmTe, YbTe, or LuTe).

Emission Layer in Interlayer 130

When the light-emitting device 10 is a full color light-emitting device, the emission layer may be patterned into a red emission layer, a green emission layer, and/or a blue emission layer, according to a sub-pixel. In one or more embodiments, the emission layer may have a stacked structure. The stacked structure may include two or more layers selected from a red emission layer, a green emission layer, and a blue emission layer. The two or more layers may be in direct contact with each other. In some embodiments, the two or more layers may be separated from each other. In one or more embodiments, the emission layer may include two or more materials. The two or more materials may include a red light-emitting material, a green light-emitting material, or a blue light-emitting material. The two or more materials may be mixed with each other in a single layer. The two or more materials mixed with each other in the single layer may emit white light.

The emission layer may include a host and a dopant. The host and the dopant may be understood by referring to the descriptions of the host and the dopant provided herein.

The amount of the dopant in the emission layer may be in a range of about 0.01 parts to about 15 parts by weight based on 100 parts by weight of the host.

The thickness of the emission layer may be in a range of about 100 Å to about 1,000 Å, and in some embodiments, about 200 Å to about 600 Å. When the thickness of the emission layer is within any of these ranges, improved luminescence characteristics may be obtained without a substantial increase in driving voltage.

Host

The host may include a compound represented by Formula 301:

Formula 301 wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ may each be understood by referring to the description of $Q_1$ provided herein.

In some embodiments, when xb11 in Formula 301 is 2 or greater, at least two $Ar_{301}$(s) may be bound via a single bond.

In some embodiments, the host may include a compound represented by Formula 301-1, a compound represented by Formula 301-2, or any combination thereof:

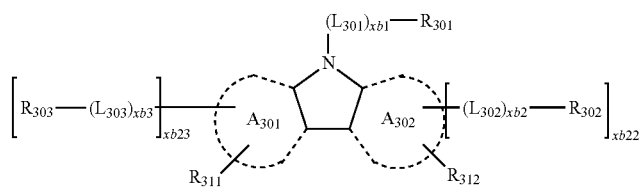

Formula 301-1

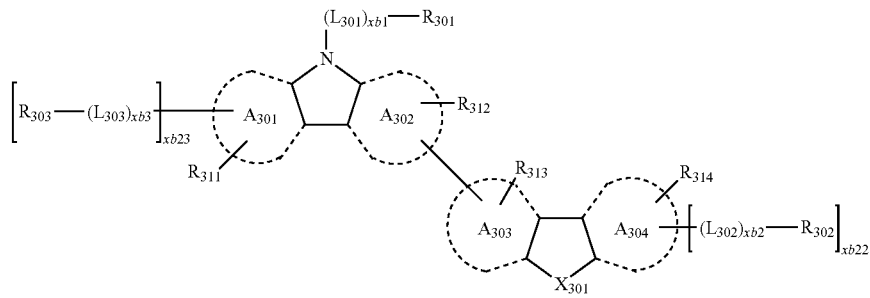

Formula 301-2 wherein, in Formulas 301-1 to 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[($L_{304}$)$_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may respectively be understood by referring to the descriptions of $L_{301}$, xb1, and R301 provided herein, $L_{302}$ to $L_{304}$ may each be understood by referring to the description of $L_{301}$ provided herein, xb2 to xb4 may each be understood by referring to the description of xb1 provided herein, and $R_{302}$ to $R_{305}$ and $R_{311}$ to $R_{314}$ may each be understood by referring to the description of $R_{301}$ provided herein.

In some embodiments, the host may include an alkaline earth-metal complex, a post-transitional metal complex, or any combination thereof. For example, the host may include a Be complex (e.g., Compound H55), a Mg complex, a Zn complex, or any combination thereof.

In some embodiments, the host may include one of Compounds H1 to H124, 9,10-di(2-naphthyl)anthracene (ADN), 2-methyl-9,10-bis(naphthalen-2-yl)anthracene (MADN), 9,10-di(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof:

H1

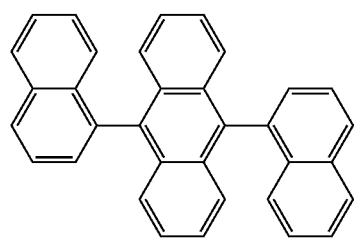

H2

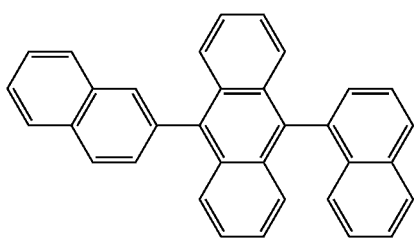

H3

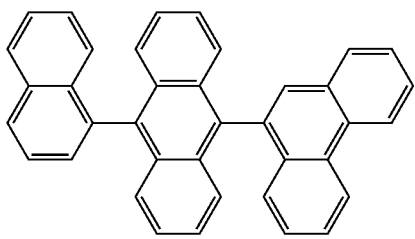

H4

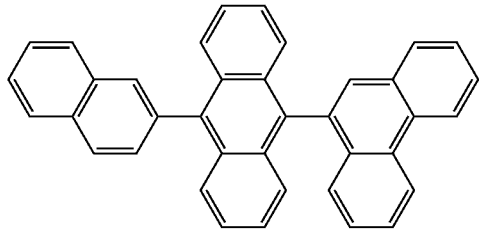

H5

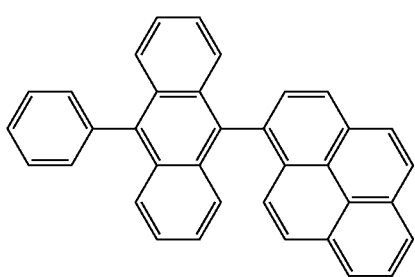

-continued

H6

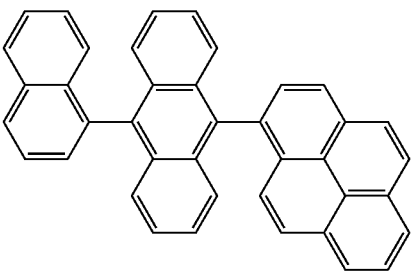

H7

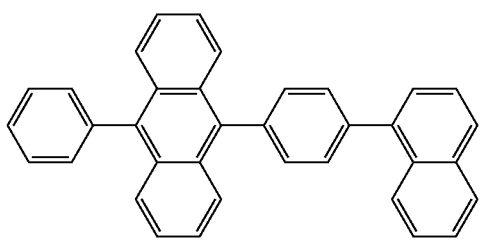

H8

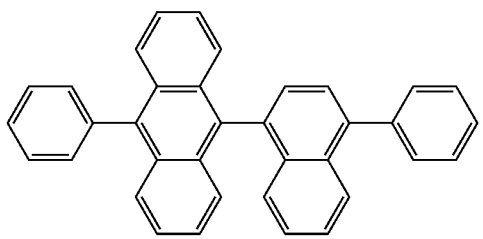

H9

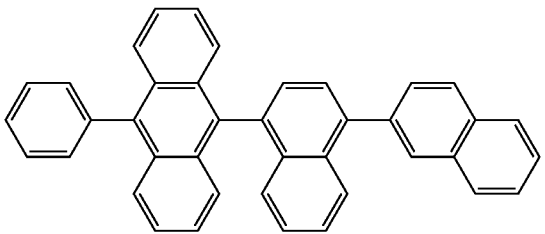

H10

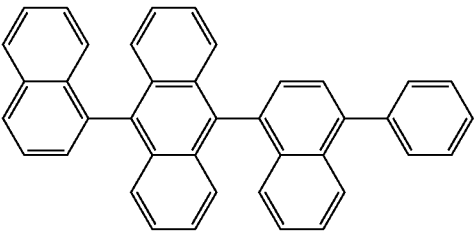

H11

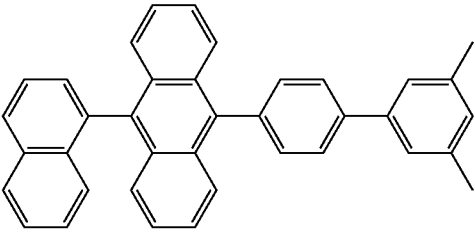

-continued
H12
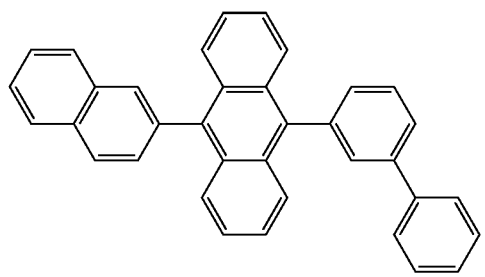
H13
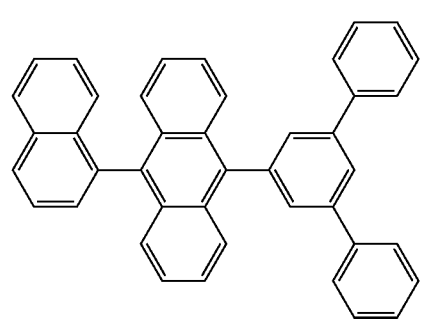
H14
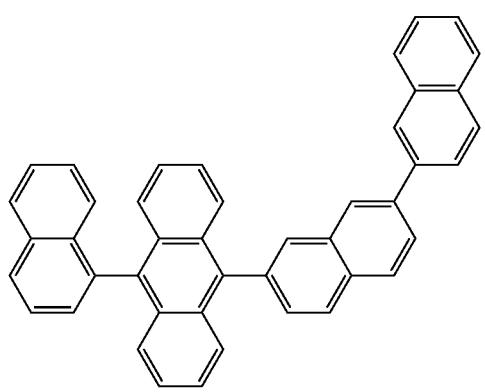
H15
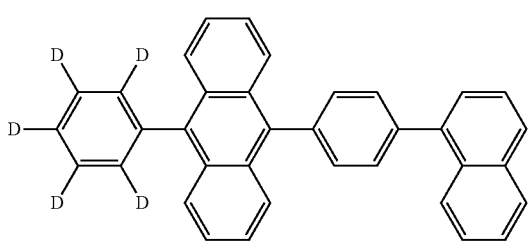
H16
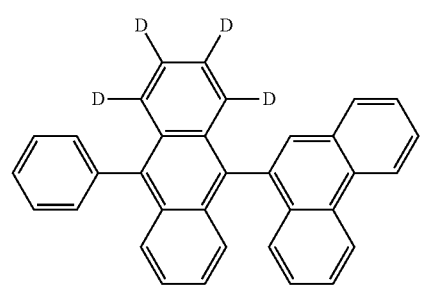
-continued
H17
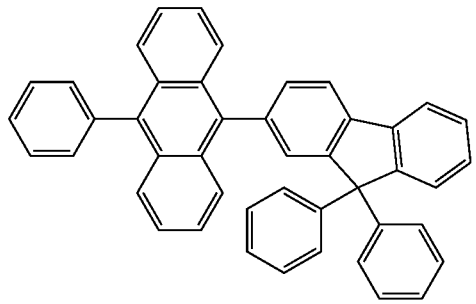
H18
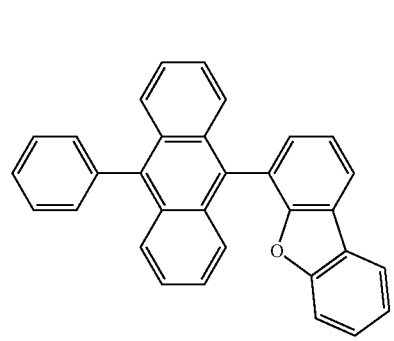
H19
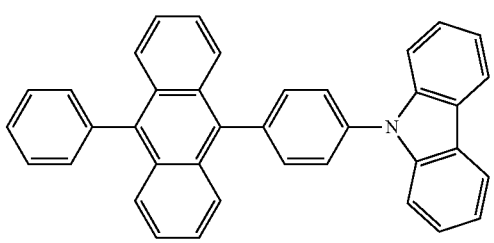
H20
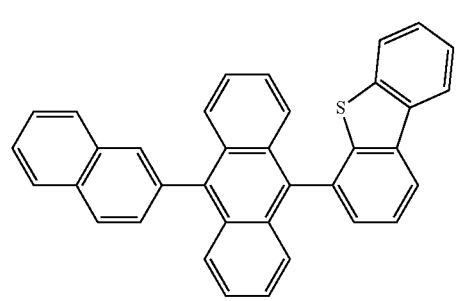
H21
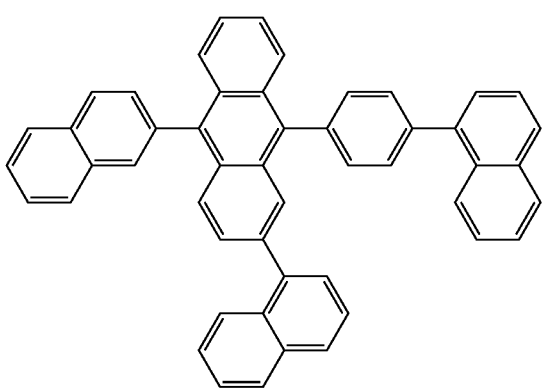

H22
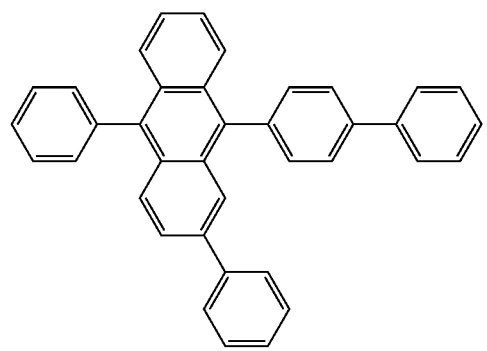
H23
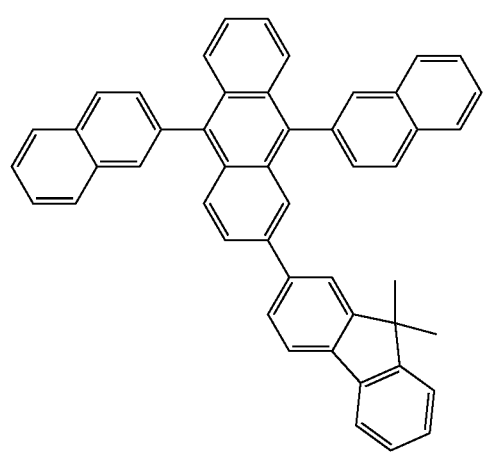
H24
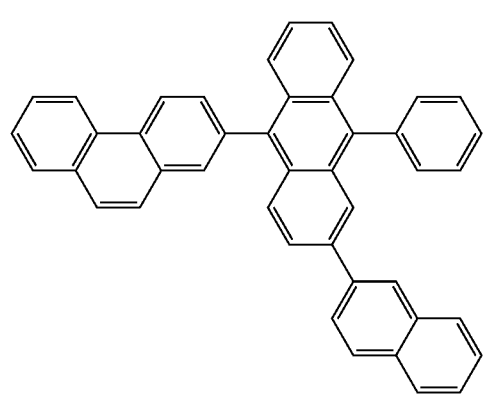
H25
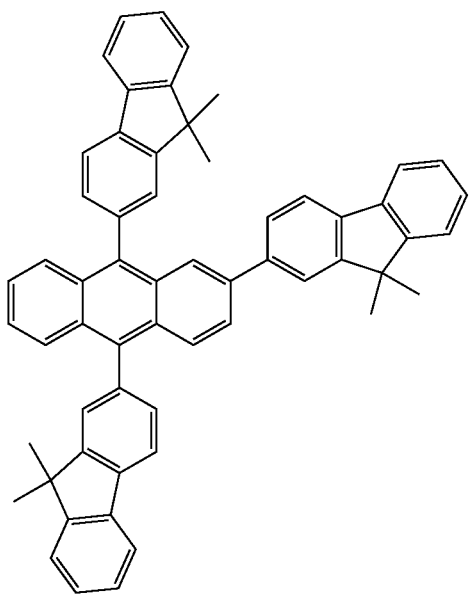
H26
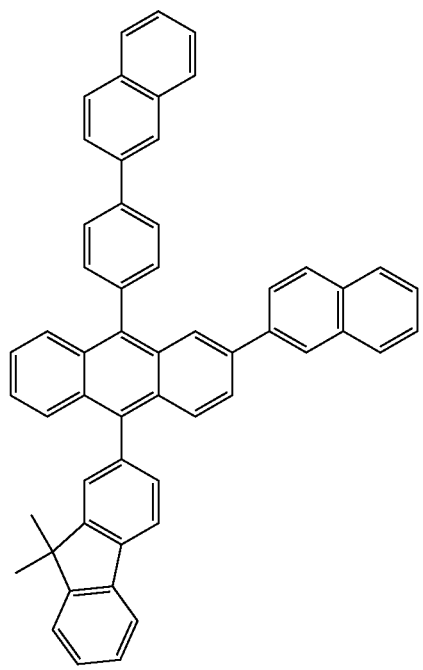

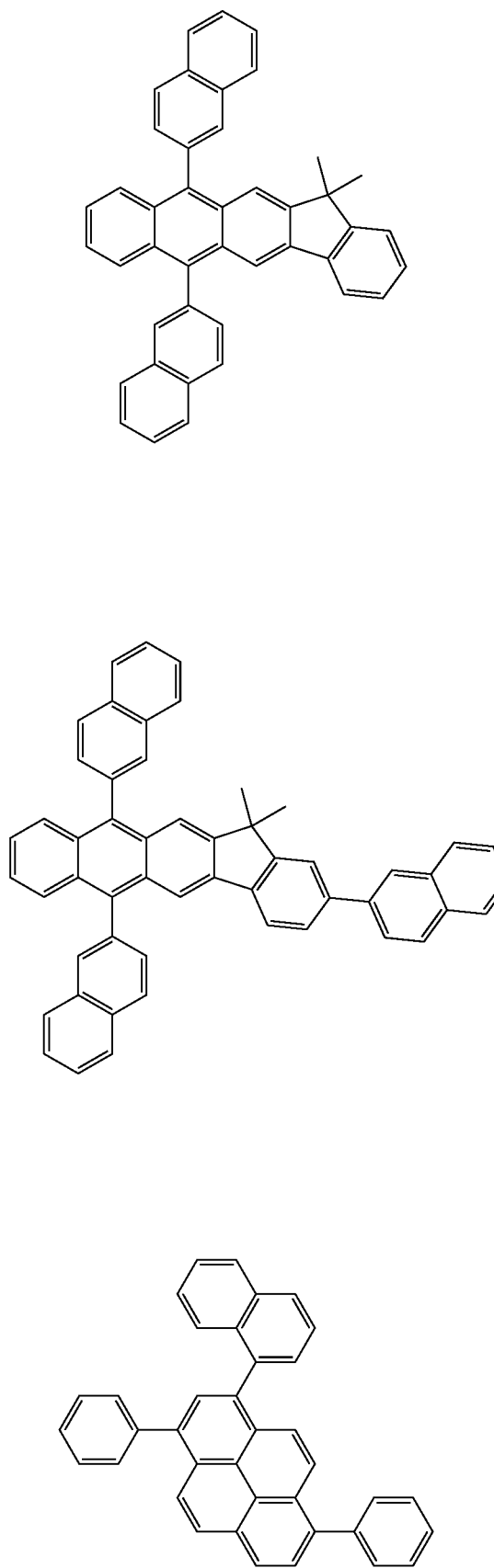
H27
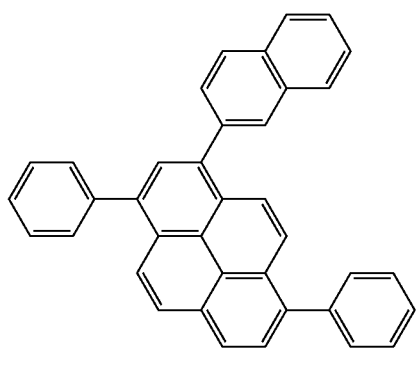
H28
H29
H30
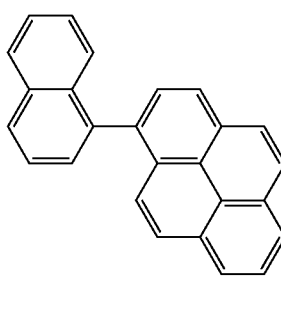
H31
H32
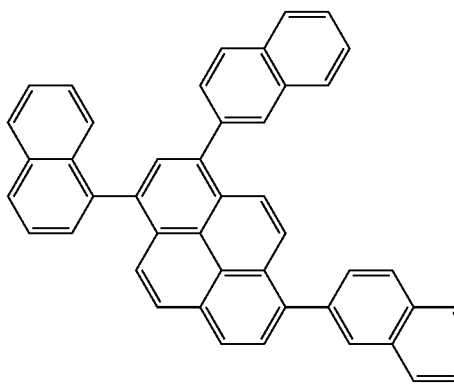
H33
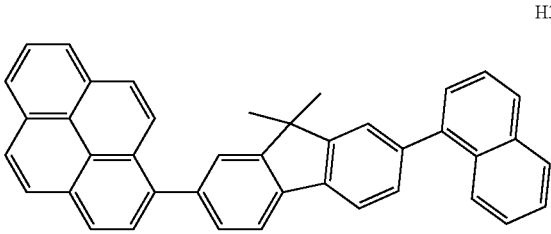
H34
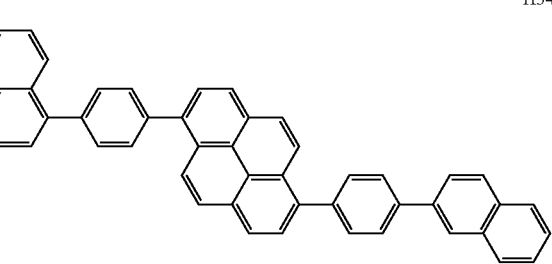

H35
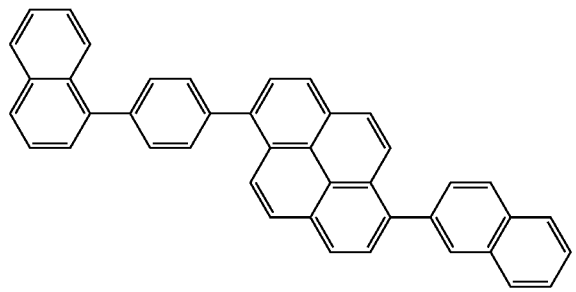
H36
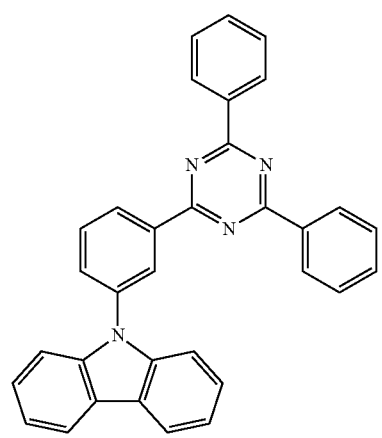
H37
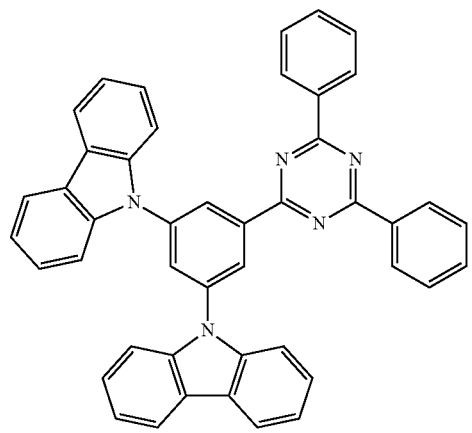
H38
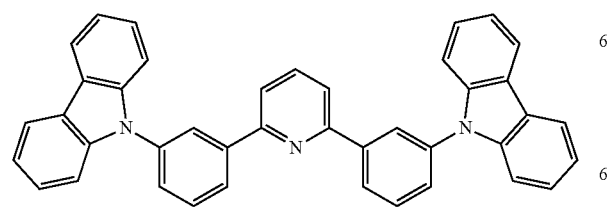
H39
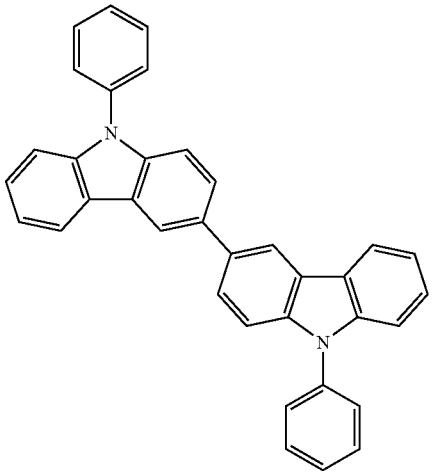
H40
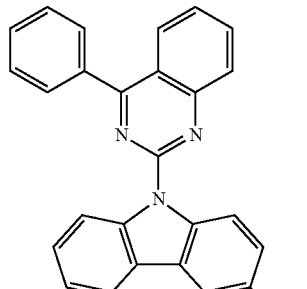
H41
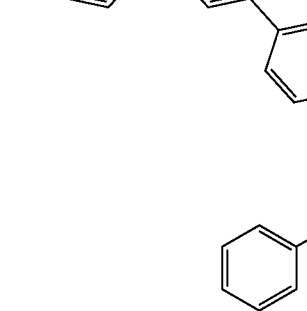

H42 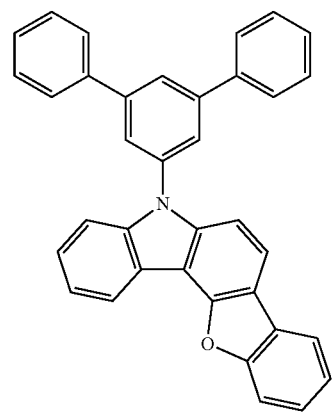
H43 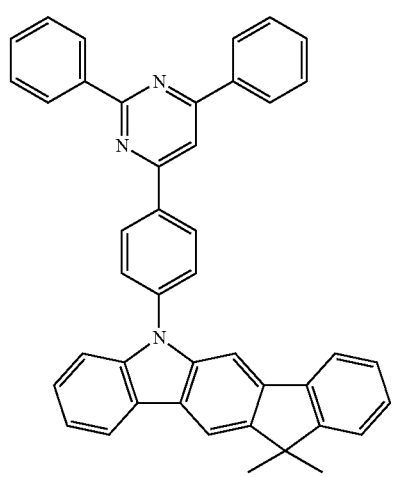
H44 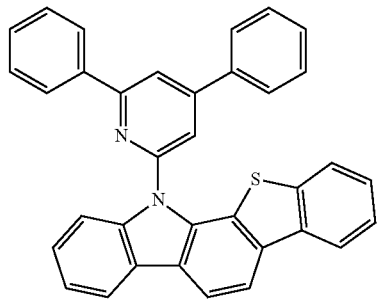
H45 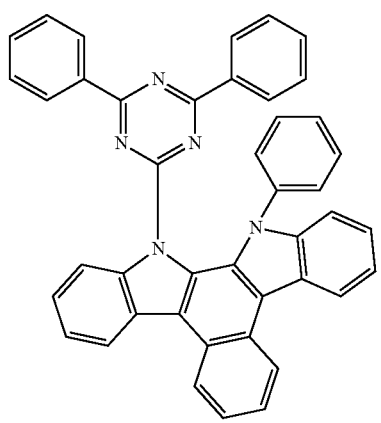
H46 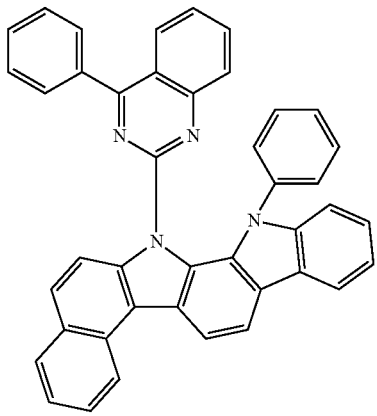
H47 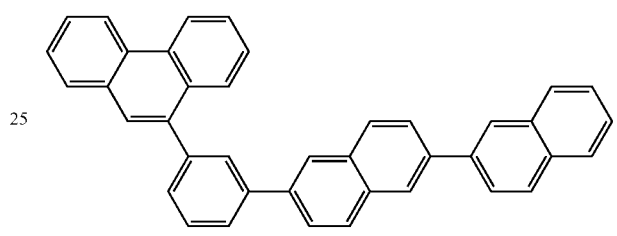
H48 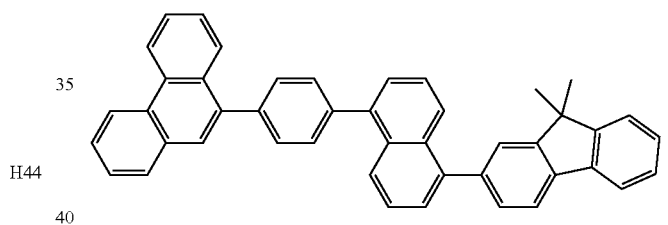
H49 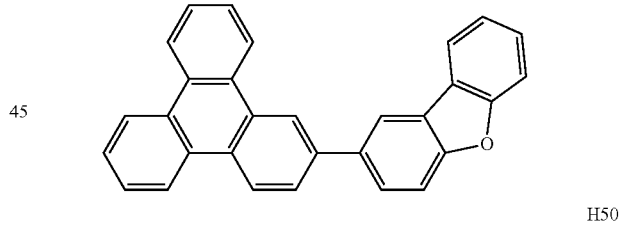
H50 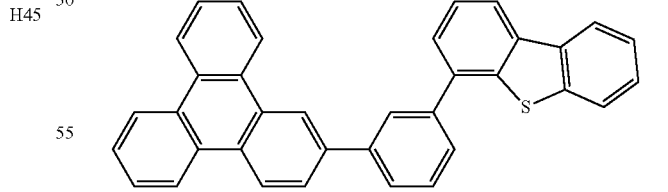
H51 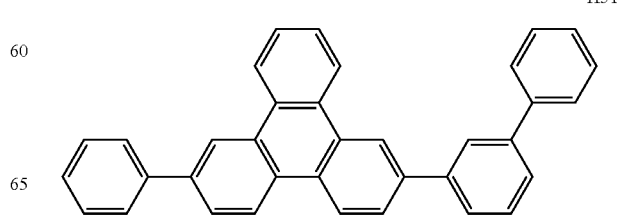

H52
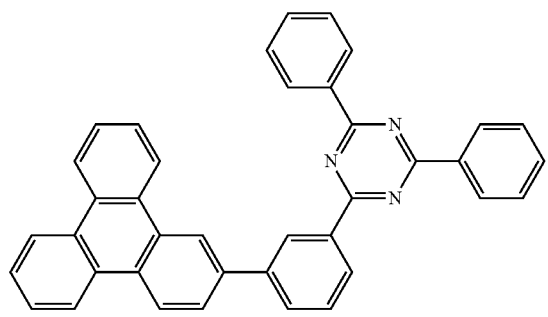
H53
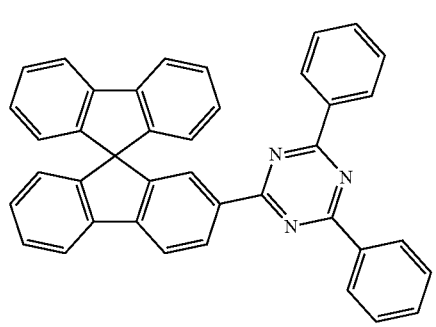
H54
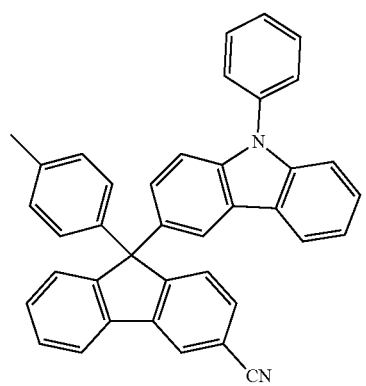
H55
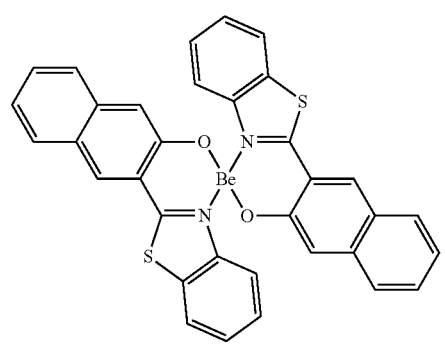
H56
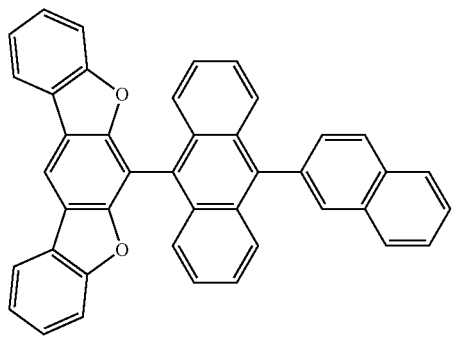
H57
H58
H59

H60
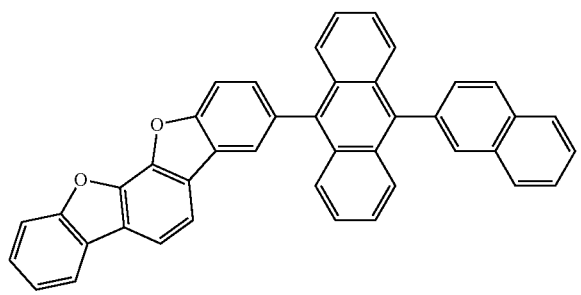
H61
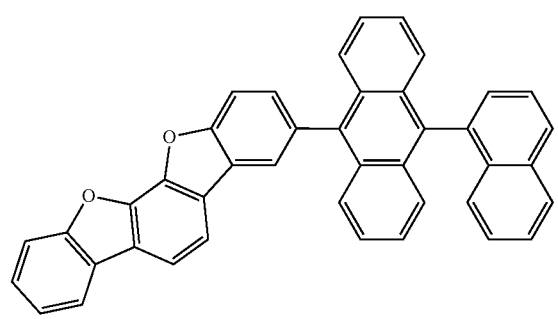
H62
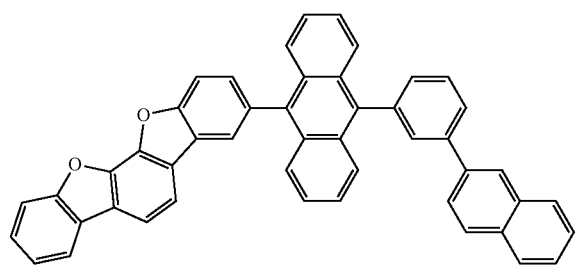
H63
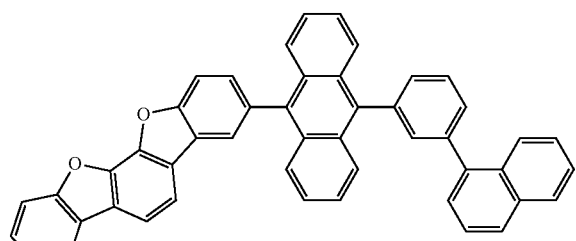
H64
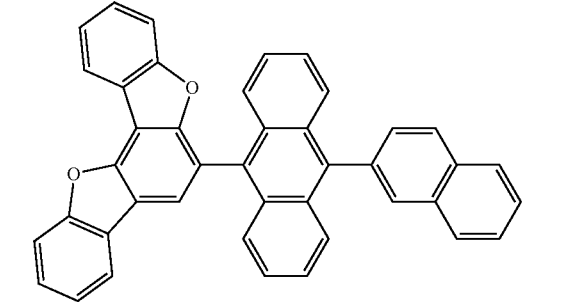
H65
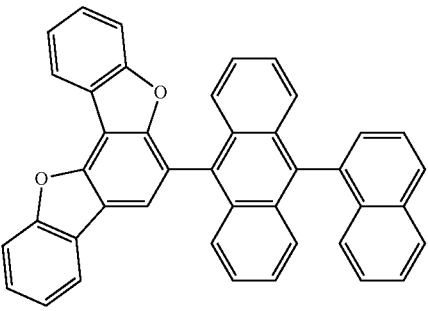
H66
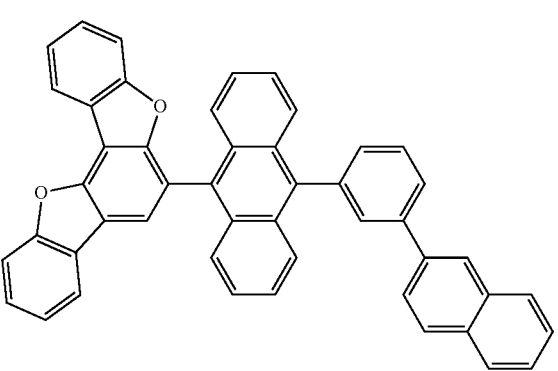
H67
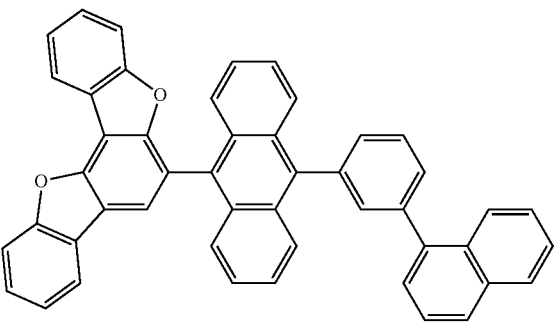
H68
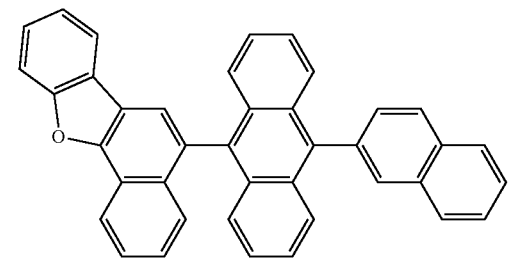
H69
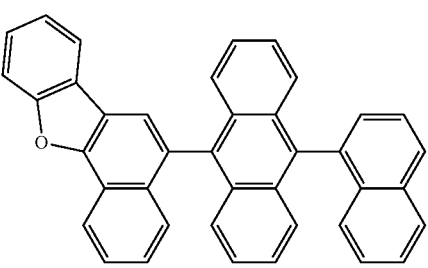

H70
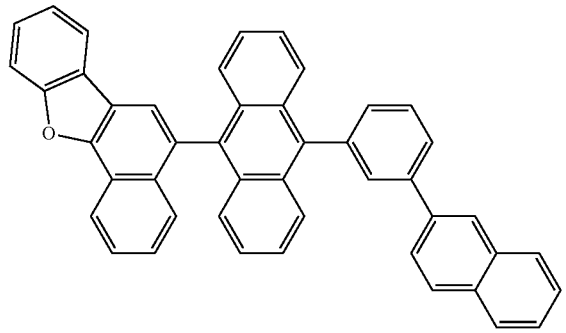
H71
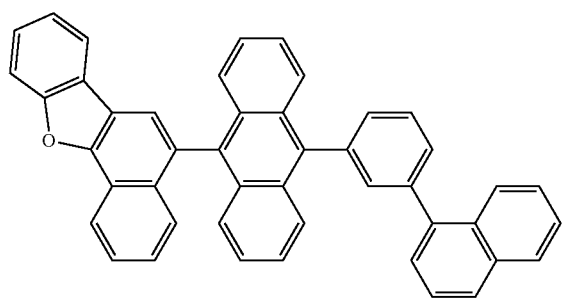
H72
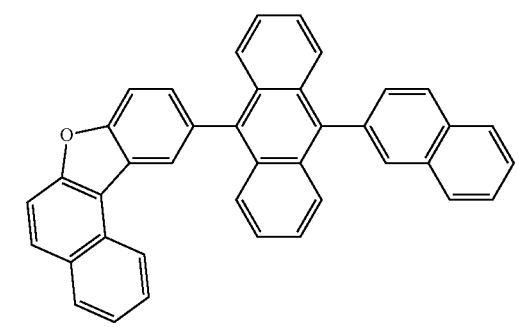
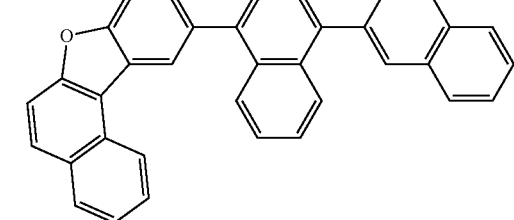
H73
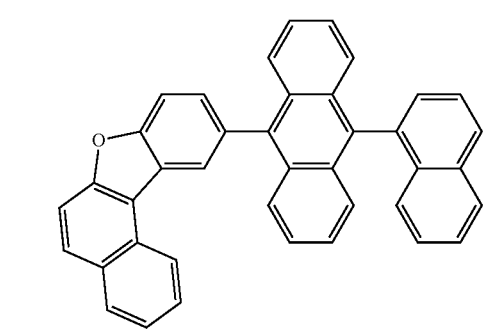
H74
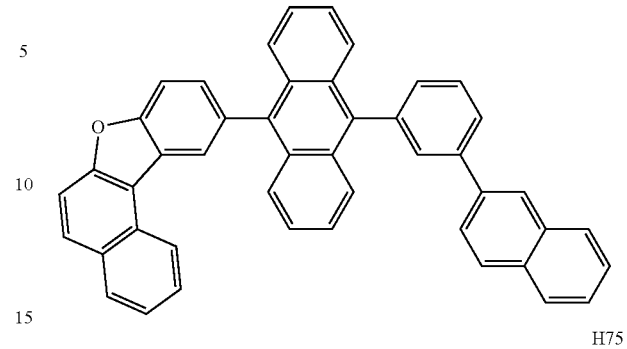
H75
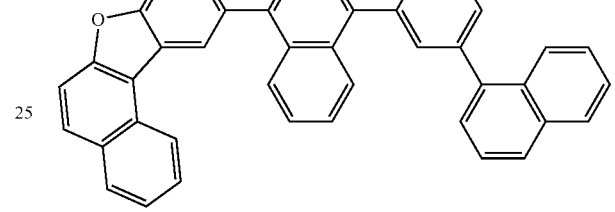
H76
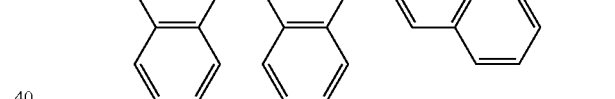
H77
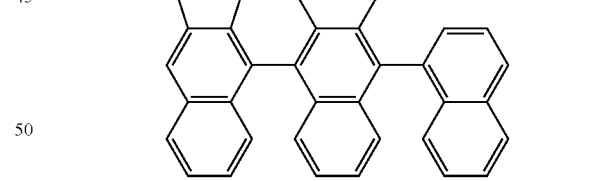
H78
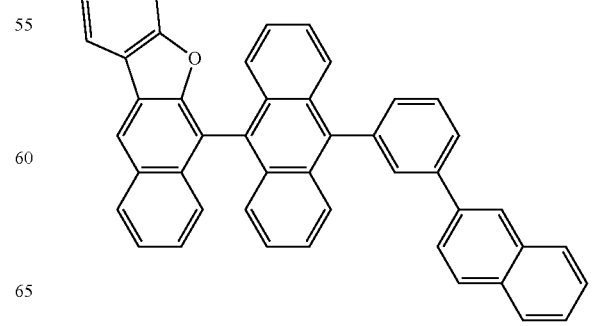

H79
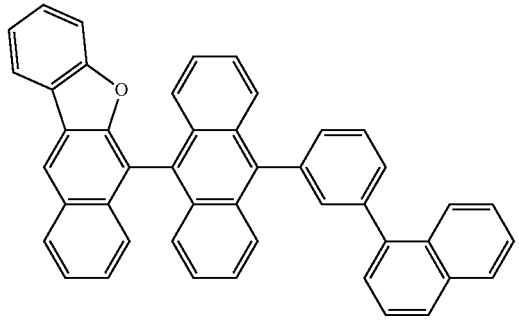
H83
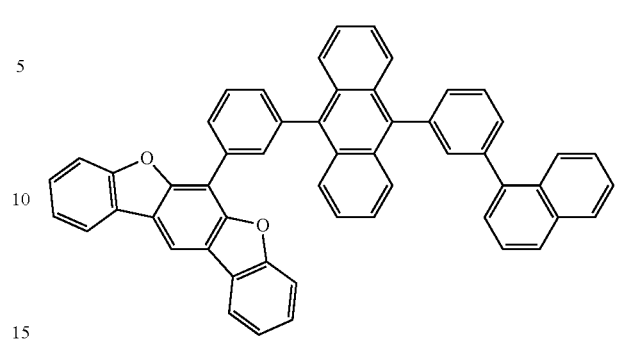
H80
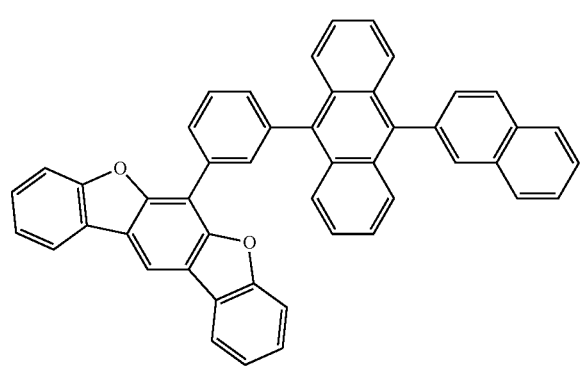
H84
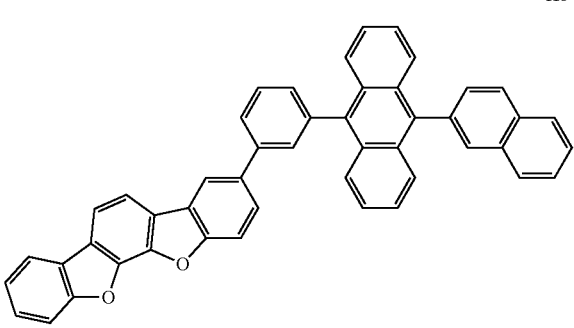
H81
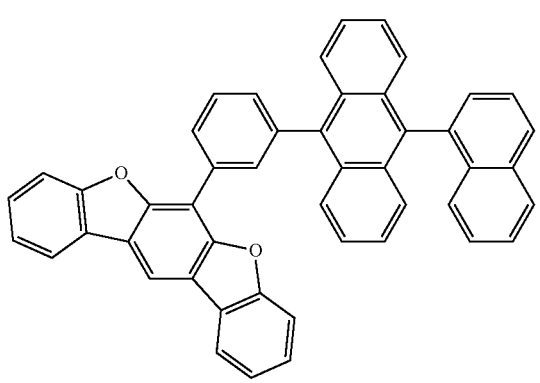
H85
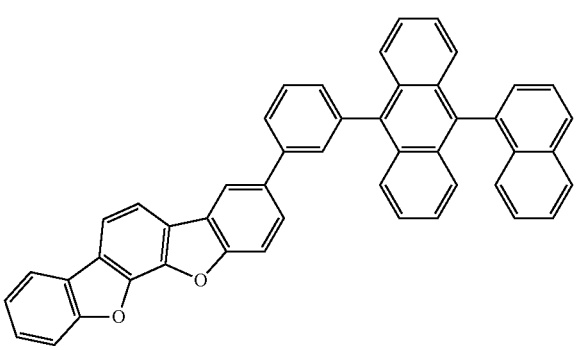
H82
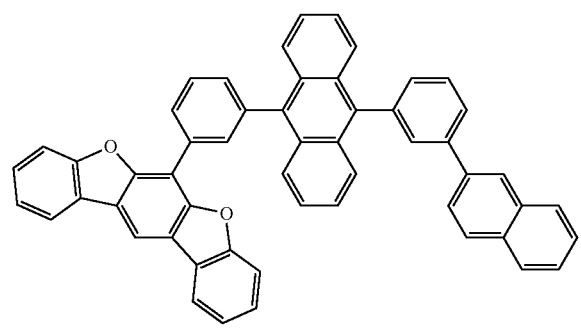
H86
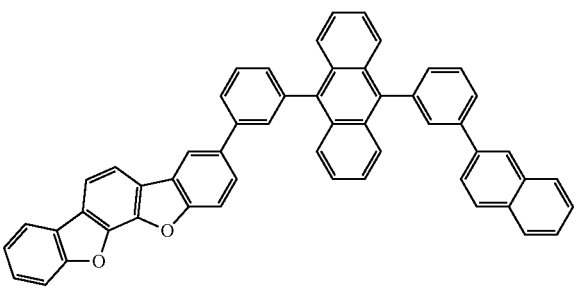

H87
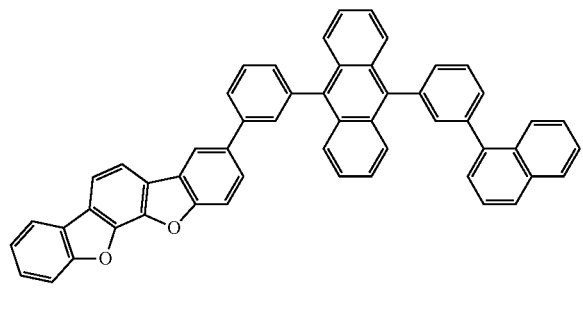
H88
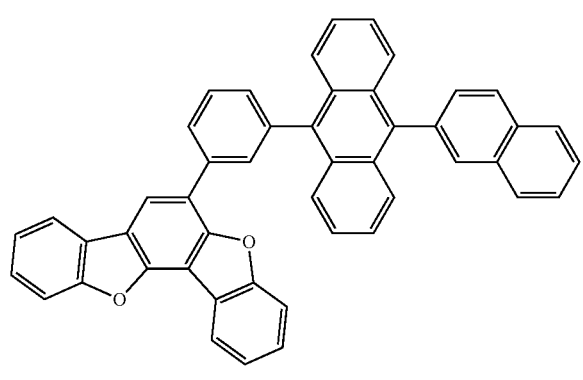
H89
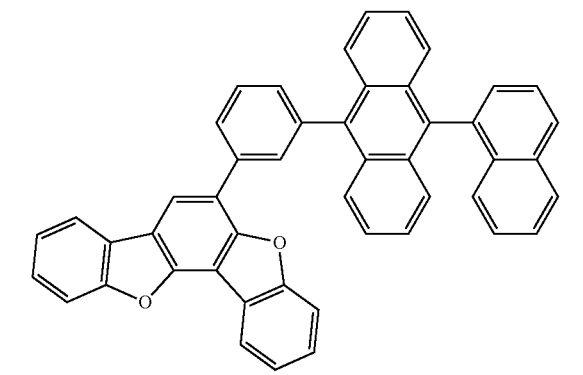
H90
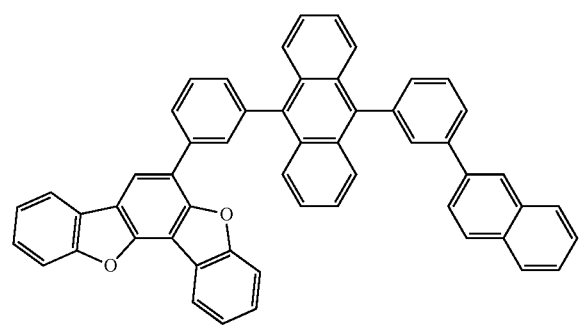
H91
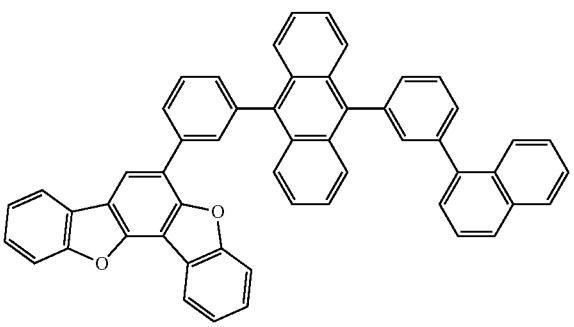
H92
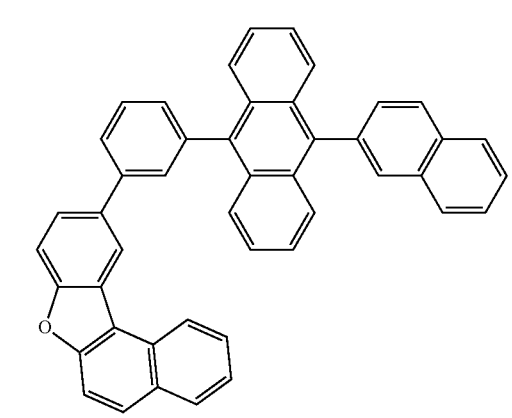
H93
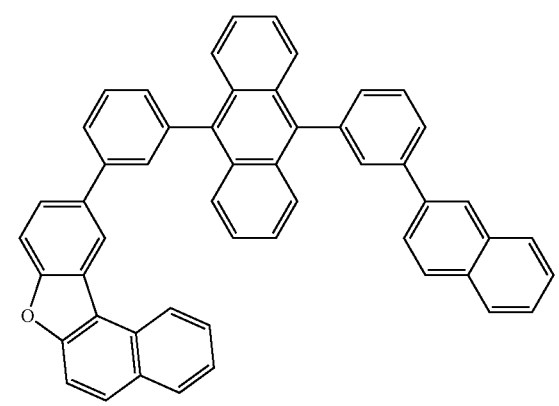
H94

H95
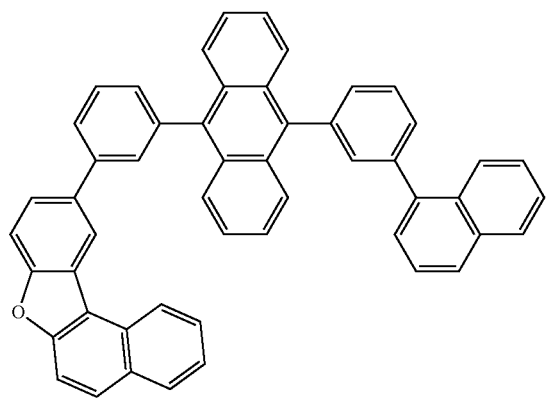
H96
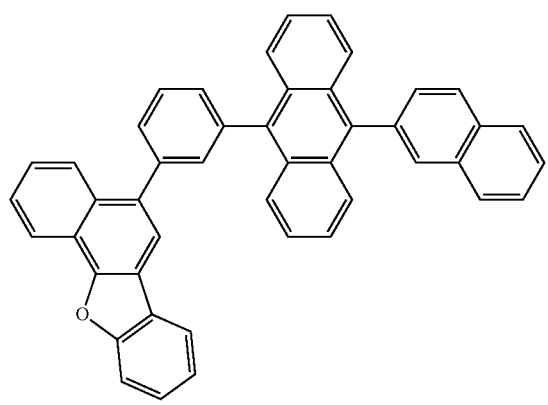
H97
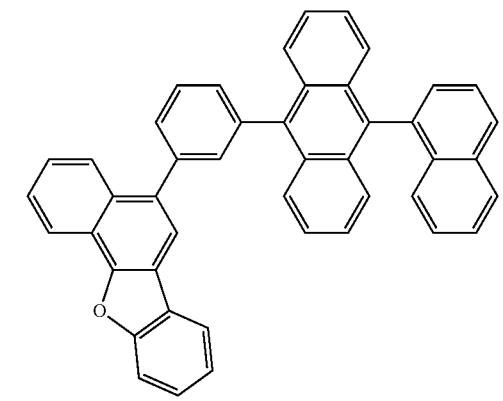
H98
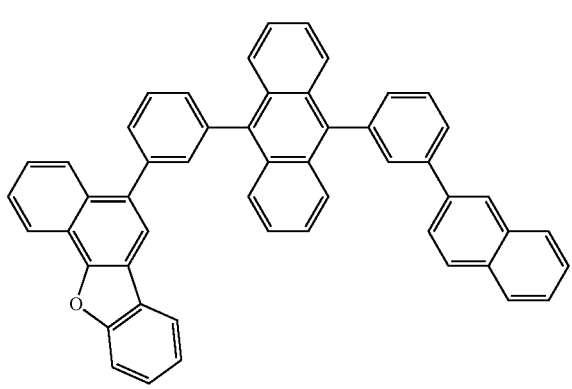
H99
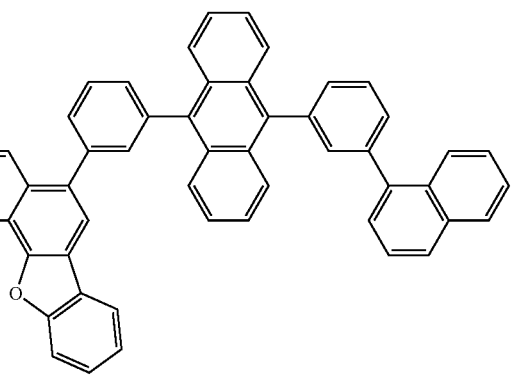
H100
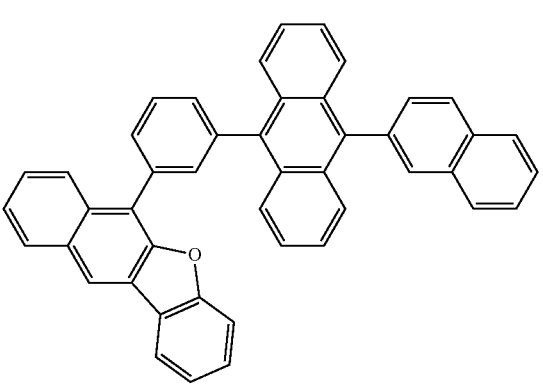
H101
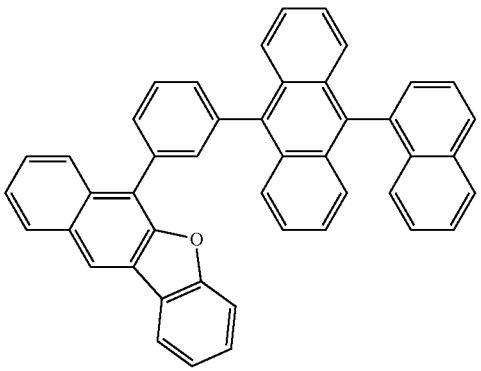
H102
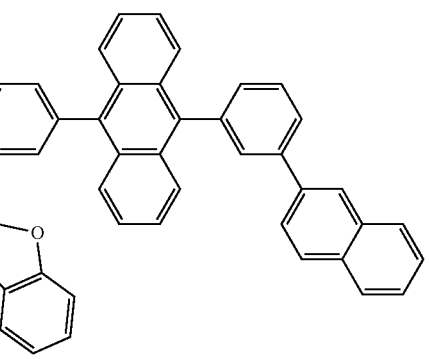

H103
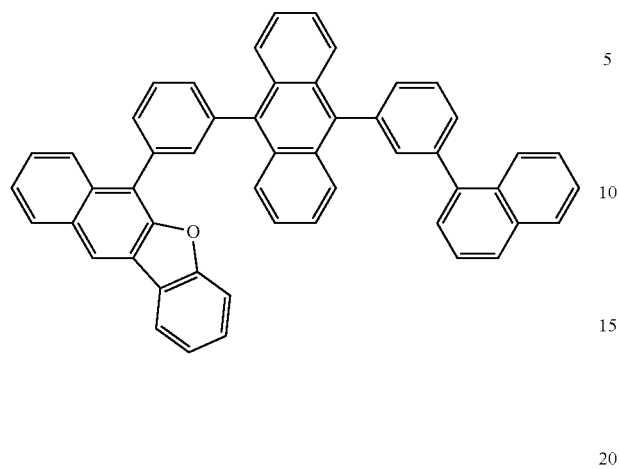
H106
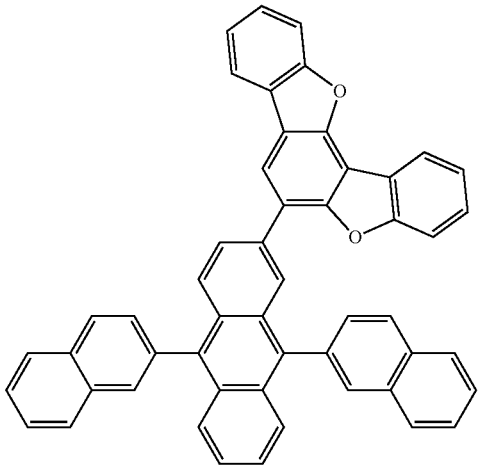
H104
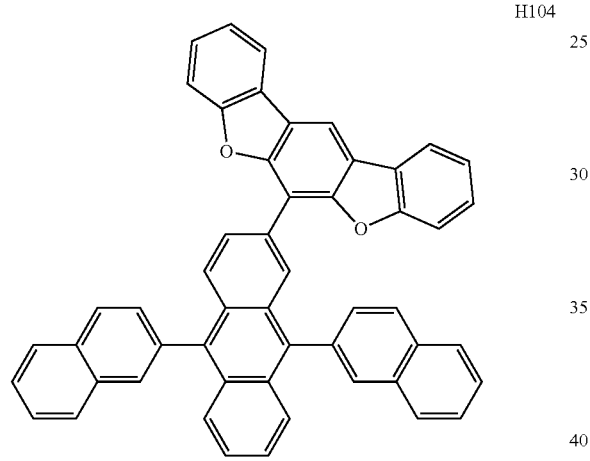
H105
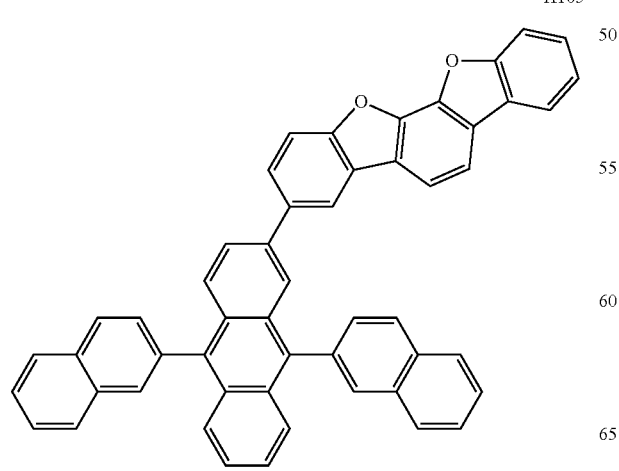
H107
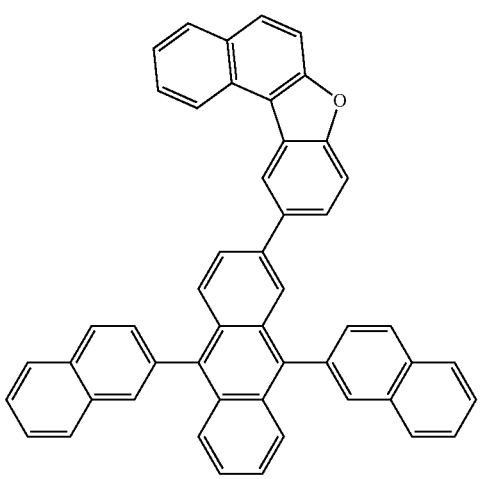

83 84
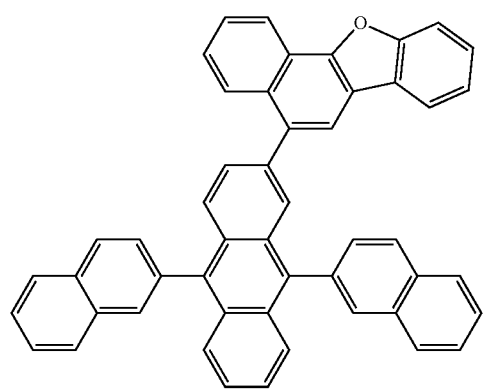 H108
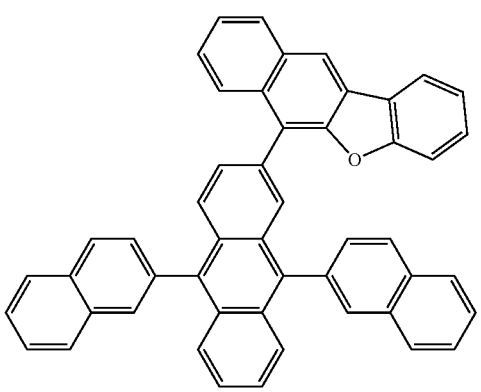 H109
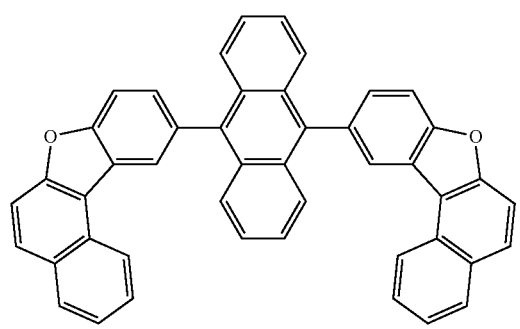 H110
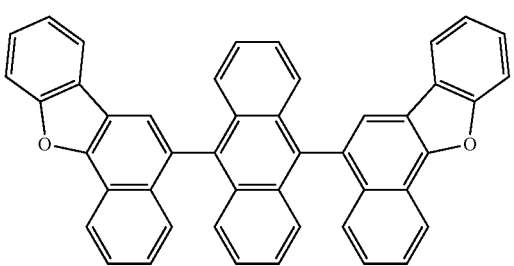 H111
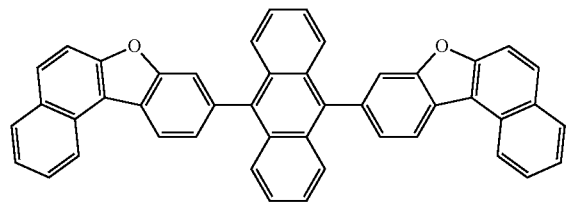 H112
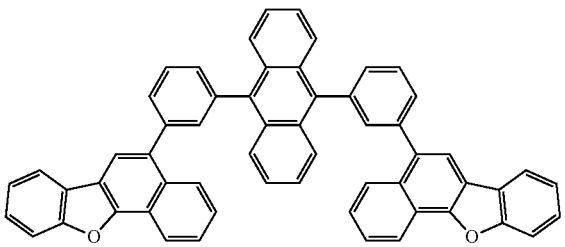 H113
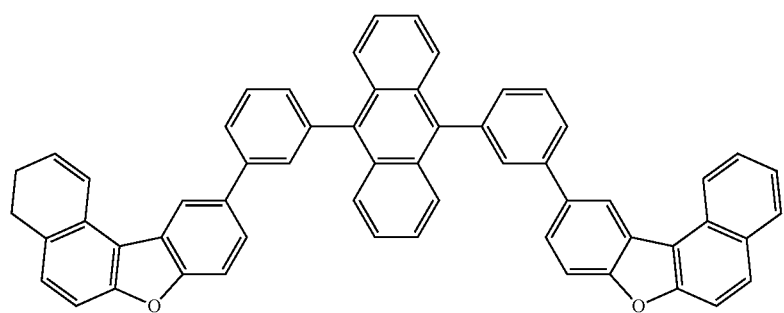 H114

-continued
H115
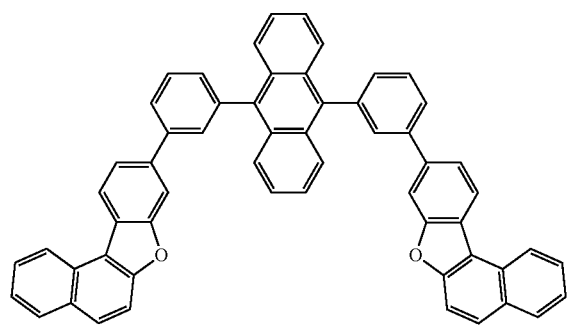
H116
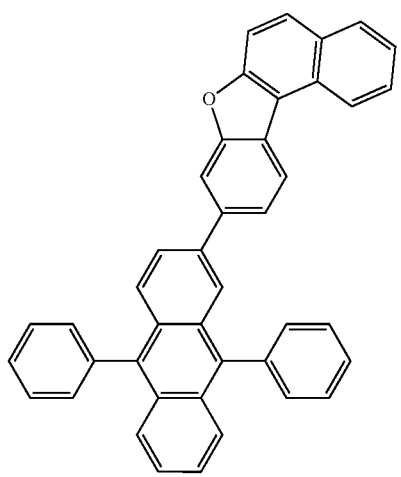
H117
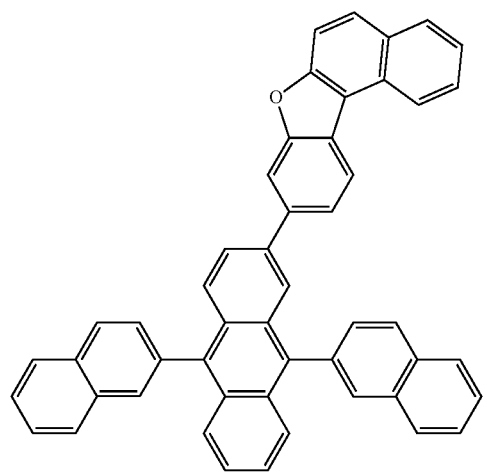
H118
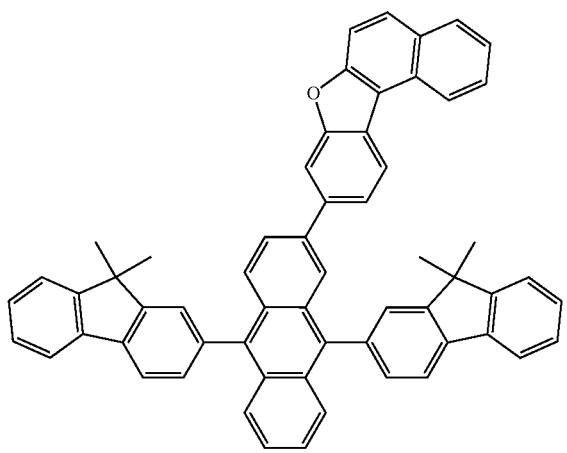
H119
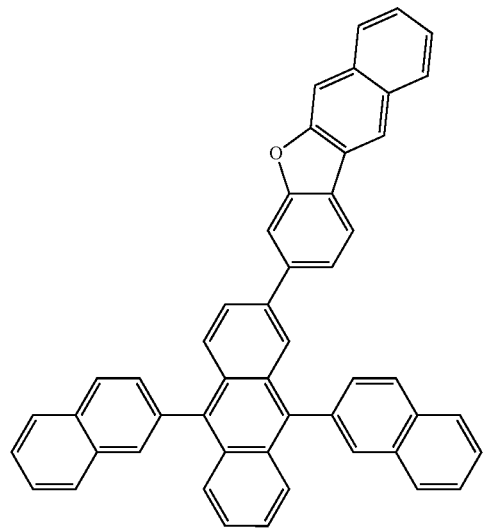
H120
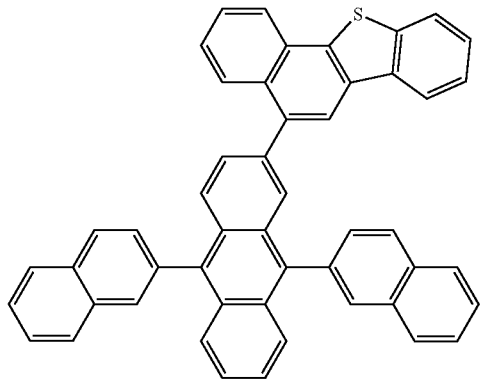

H121

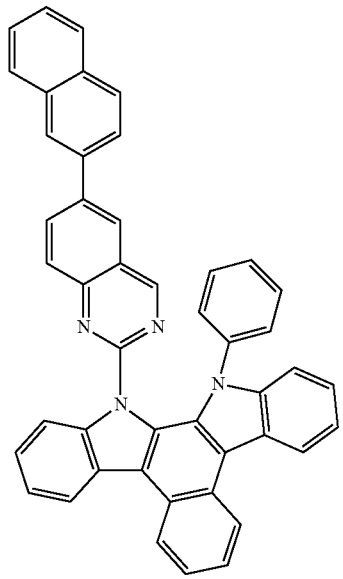

H122

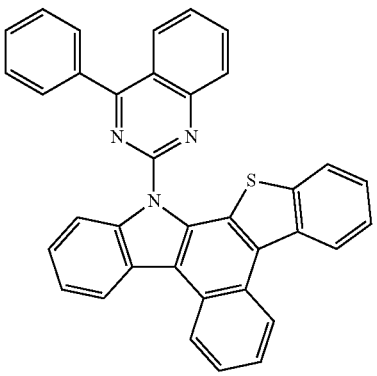

H123

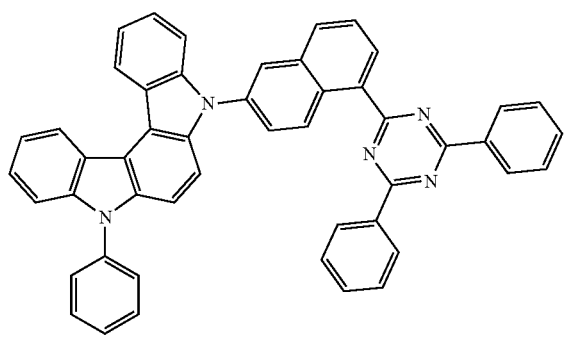

H124

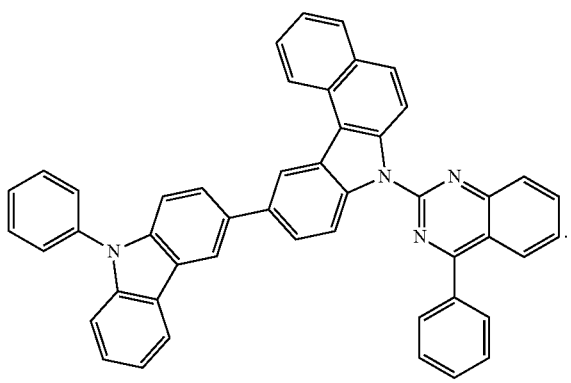

Phosphorescent Dopant

The phosphorescent dopant may include at least one transition metal as a center metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In some embodiments, the phosphorescent dopant may include an organometallic complex represented by Formula 401:

$$M(L_{401})_{xc1}(L_{402})_{xc2}$$ Formula 401

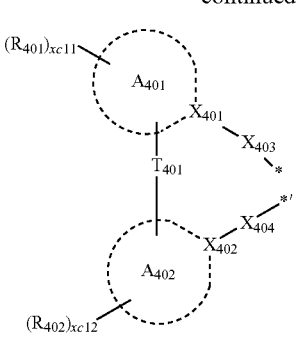

Formula 402 wherein, in Formulas 401 and 402,

M may be transition metal (e.g., iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, and when xc1 is 2 or greater, at least two $L_{401}$(s) may be identical to or different from each other, $L_{402}$ may be an organic ligand, and xc2 may be an integer from 0 to 4, and when xc2 is 2 or greater, at least two $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_{60}$ heterocyclic group, $T_{401}$ may be a single bond, —O—, —S—, —C(=O)—, —N($Q_{411}$)-, —C($Q_{411}$)($Q_{412}$)-, —C($Q_{411}$)=C($Q_{412}$)-, —C($Q_{411}$)=, or =C=, $X_{403}$ and $X_{404}$ may each independently be a chemical bond (e.g., a covalent bond or a coordinate bond), O, S, N($Q_{413}$), B($Q_{413}$), P($Q_{413}$), C($Q_{413}$)($Q_{414}$), or Si($Q_{413}$)($Q_{414}$), wherein $Q_{411}$ to $Q_{414}$ may each be understood by referring to the description of $Q_1$ provided herein, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), wherein Q401 to Q403 may each be understood by referring to the description of $Q_1$ provided herein, xc11 and xc12 may each independently be an integer from 0 to 10, and

* and *' in Formula 402 each indicate a binding site to M in Formula 401.

For example, in Formula 402, i) $X_{401}$ may be nitrogen, and $X_{402}$ may be carbon, or ii) $X_{401}$ and $X_{402}$ may each be nitrogen.

In one or more embodiments, when xc1 in Formula 402 is 2 or greater, two ring $A_{401}$(s) of at least two $L_{401}$(s) may optionally be bound via $T_{402}$ as a linking group, or two ring $A_{402}$(s) may optionally be bound via $T_{403}$ as a linking group (see Compounds PD1 to PD4 and PD7). $T_{402}$ and $T_{403}$ may each be understood by referring to the description of $T_{401}$ provided herein.

In Formula 401, $L_{402}$ may be any suitable organic ligand. For example, $L_{402}$ may be a halogen group, a diketone group (e.g., an acetylacetonate group), a carboxylic acid group (e.g., a picolinate group), —C(=O), an isonitrile group, —CN, or a phosphorus group (e.g., a phosphine group or a phosphite group).

The phosphorescent dopant may be, for example, one of Compounds PD1 to PD25, G-1 to G-12, or any combination thereof:

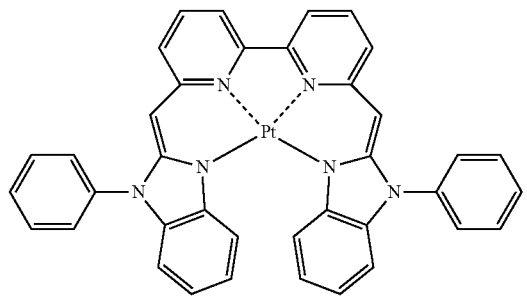

PD1

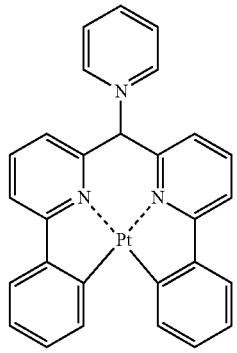

PD2

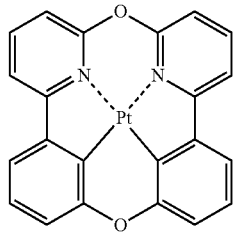

PD3

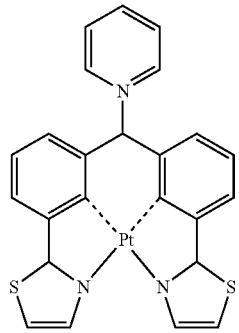

PD4

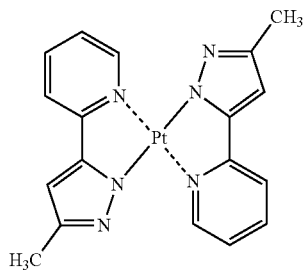

PD5

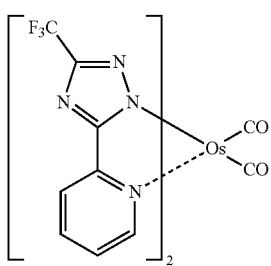
PD6
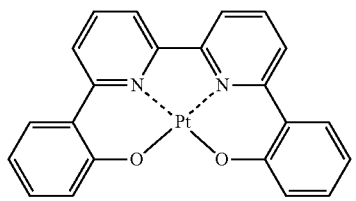
PD7
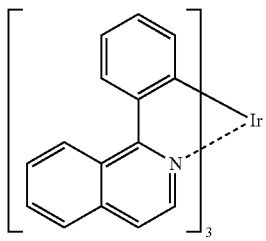
PD8
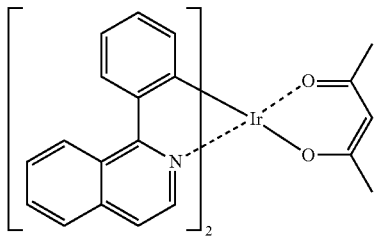
PD9
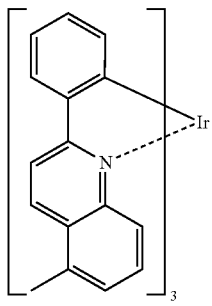
PD10
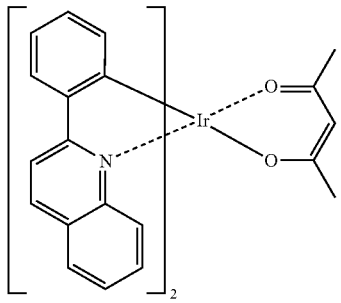
PD11
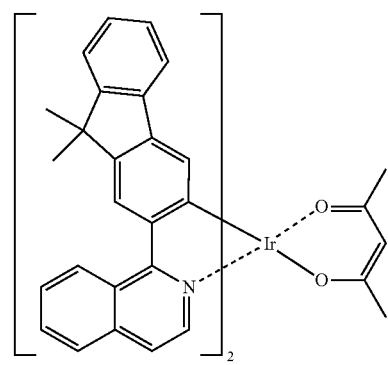
PD12
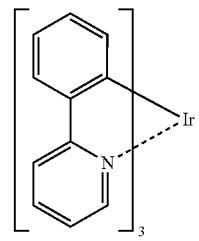
PD13
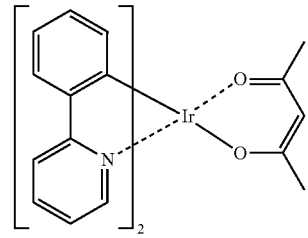
PD14
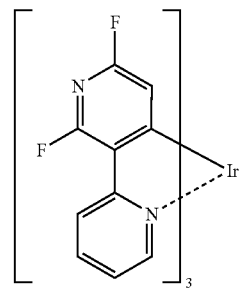
PD15
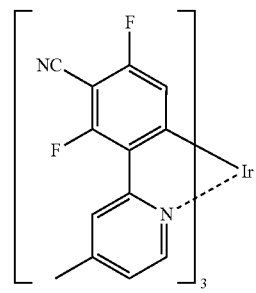
PD16

PD17
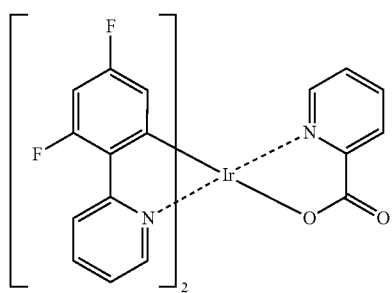
PD18
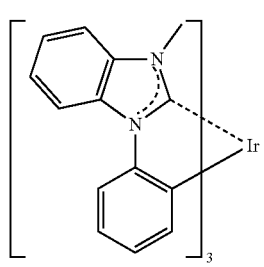
PD19
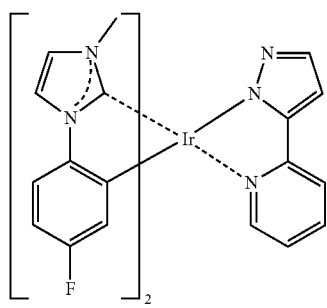
PD20
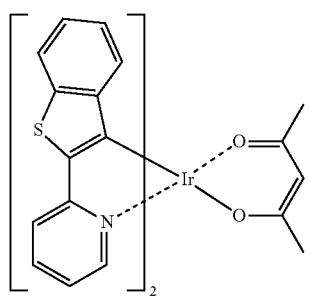
PD21
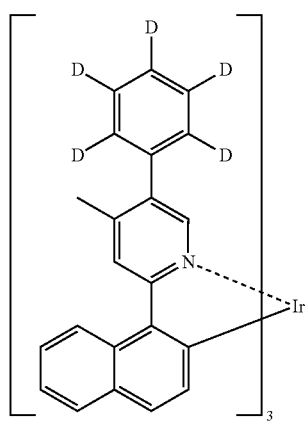
PD22
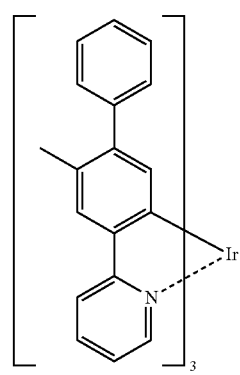
PD23
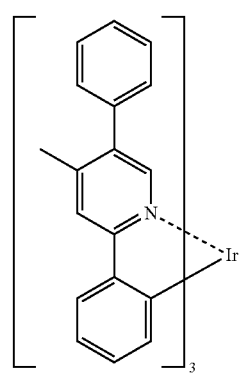
PD24
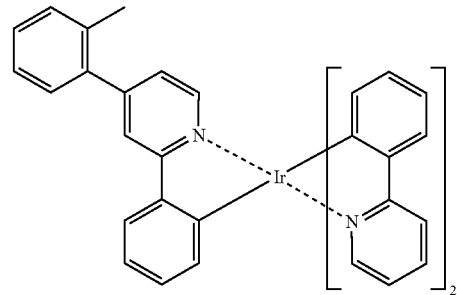
PD25
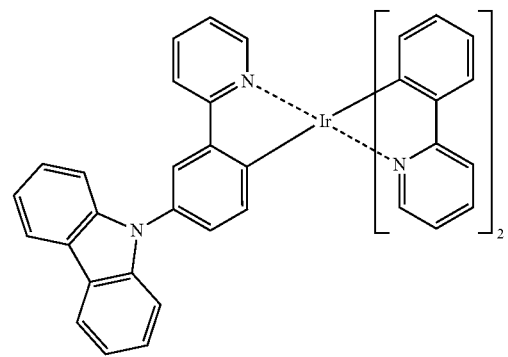

-continued
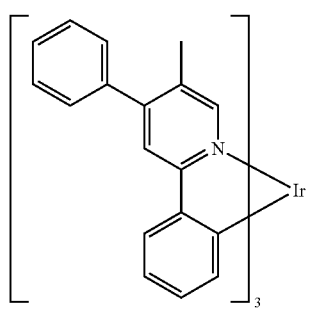
G-1
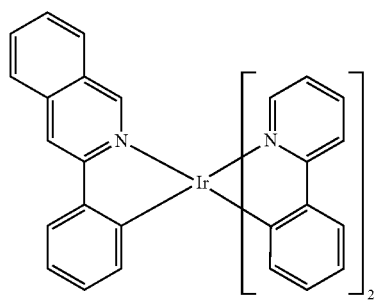
G-2
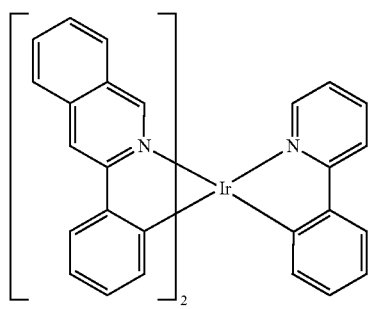
G-3
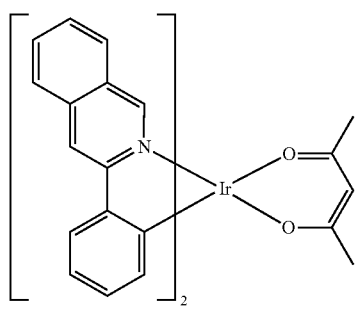
G-4
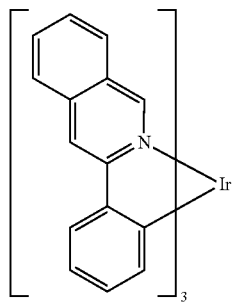
G-5
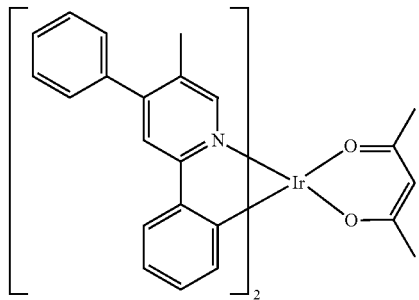
G-6
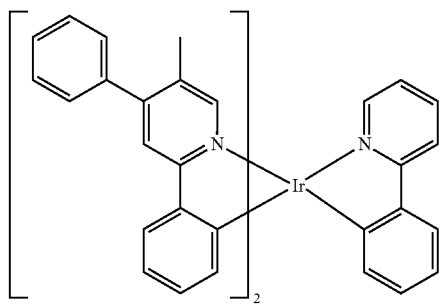
G-7
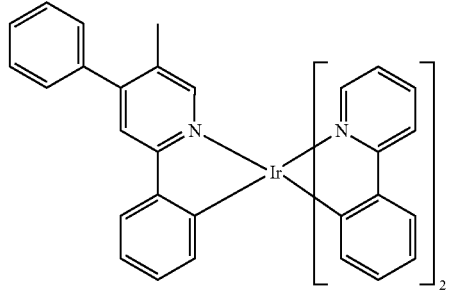
G-8
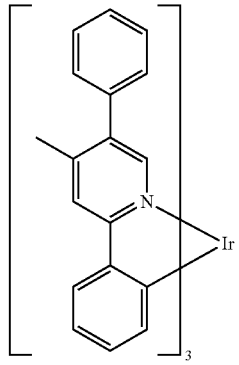
G-9

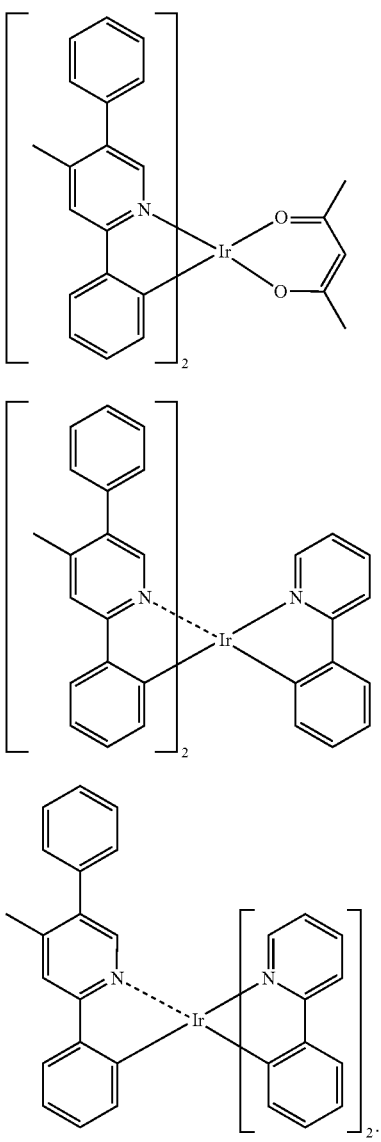

The fluorescent dopant may include an amine group-containing compound, a styryl group-containing compound, or any combination thereof.

In some embodiments, the fluorescent dopant may include a compound represented by Formula 501:

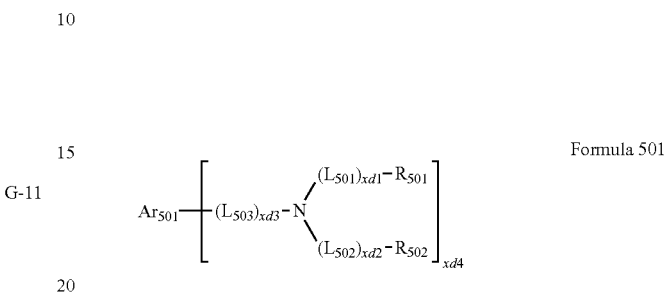

Formula 501 wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In some embodiments, in Formula 501, Arsoi may include a condensed ring group (e.g., an anthracene group, a chrysene group, or a pyrene group) in which at least three monocyclic groups are condensed.

In some embodiments, xd4 in Formula 501 may be 2.

In some embodiments, the fluorescent dopant may include one of Compounds FD1 to FD36, DPVBi, DPAVBi, or any combination thereof:

FD1

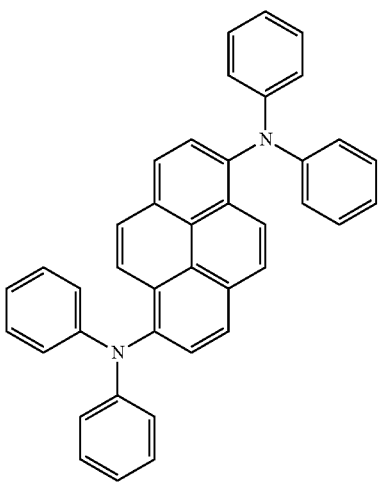

FD2

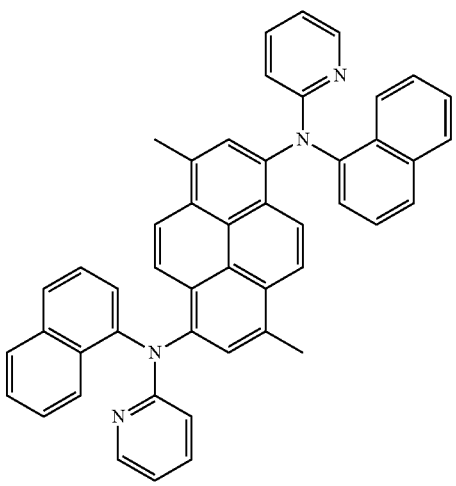

-continued
FD3
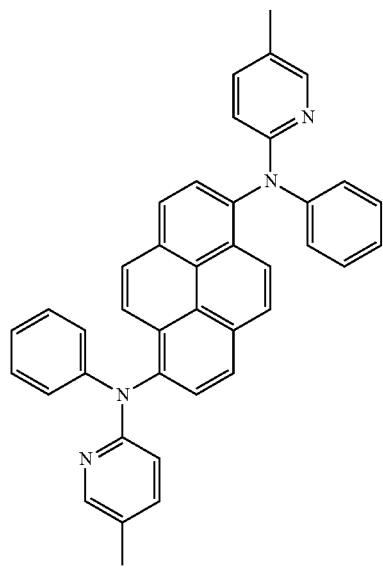
FD4
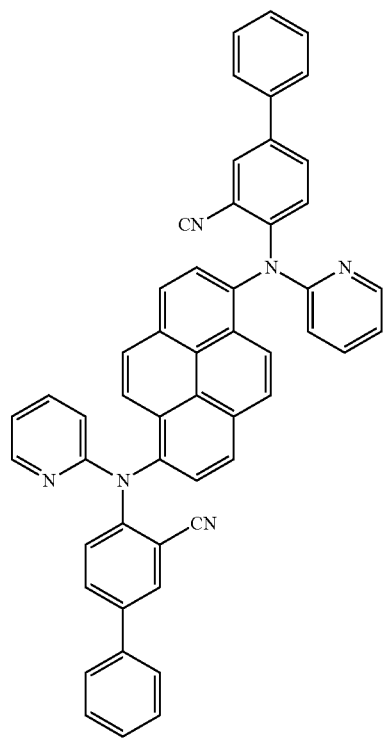
FD5
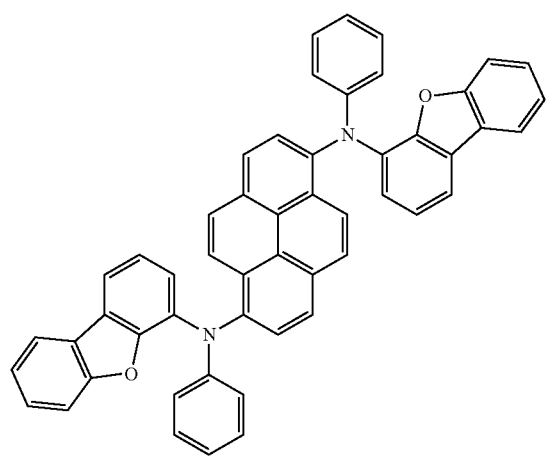
FD6
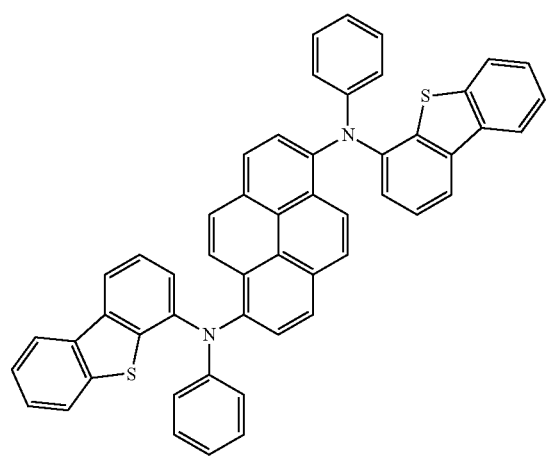

-continued
FD7
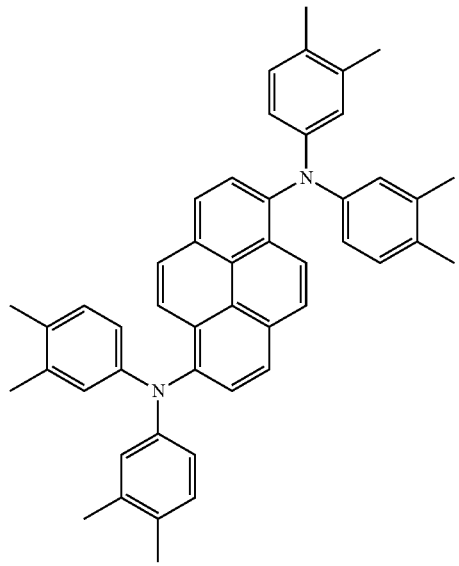
FD8
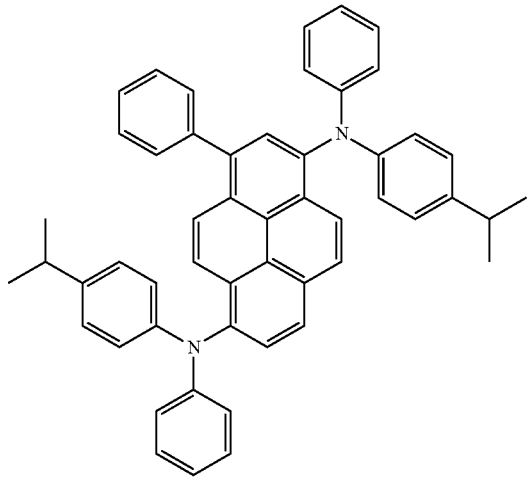
FD9
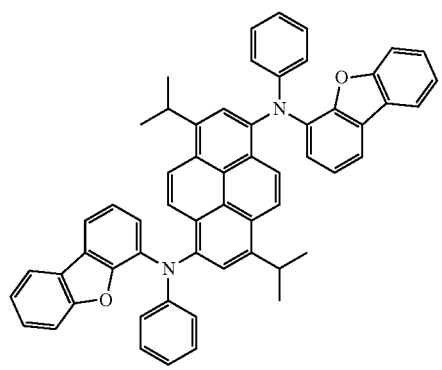
FD10
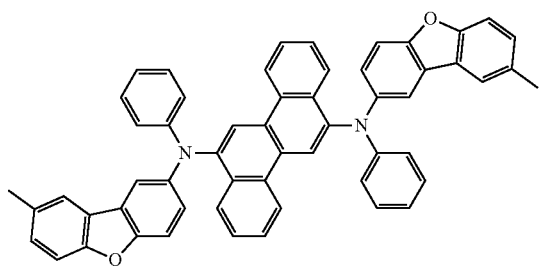
FD11
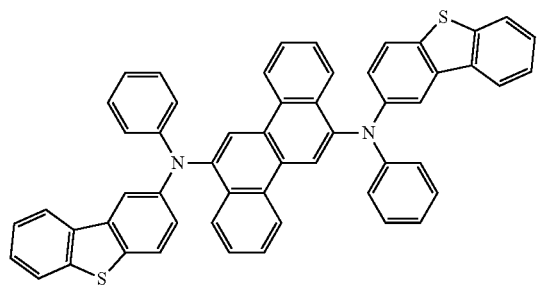
FD12
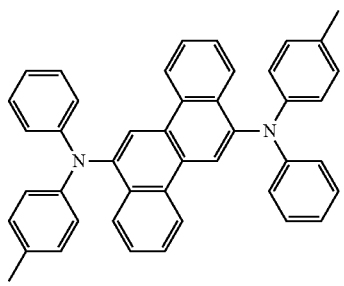
FD13
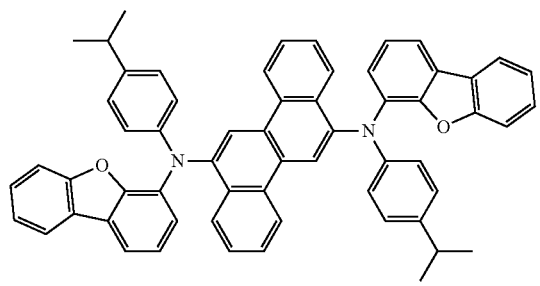
FD14
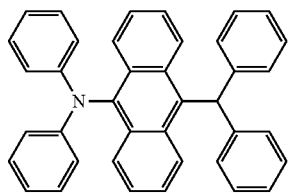

-continued
FD15
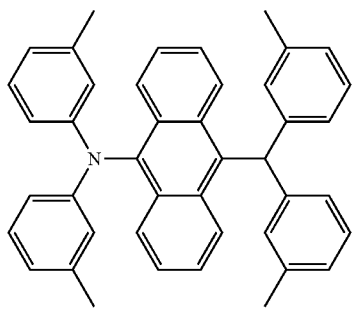
FD16
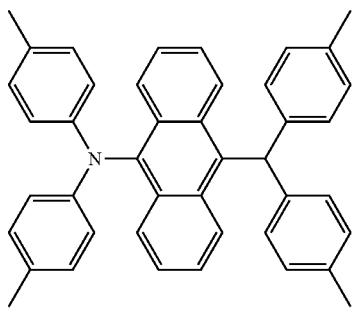
FD17
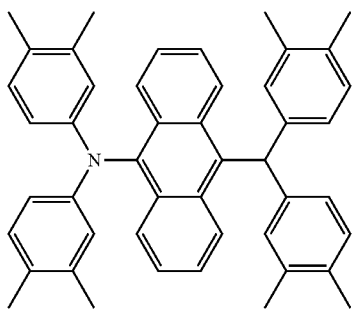
FD18
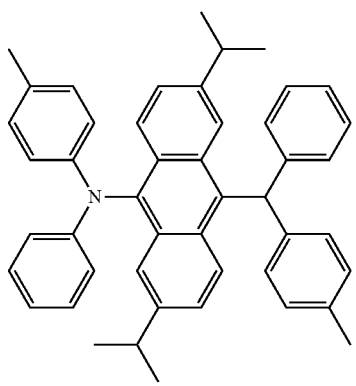
FD19
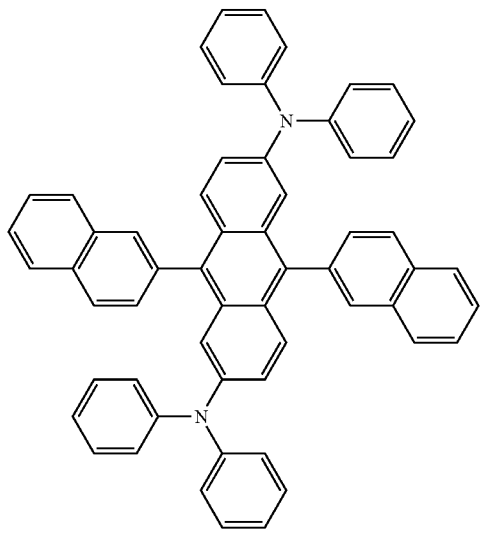
FD20
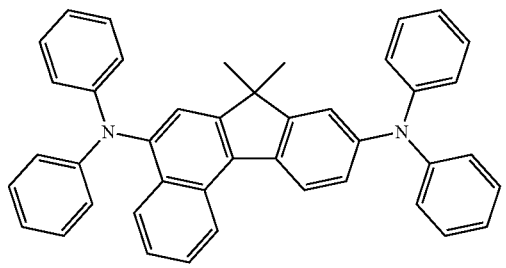
FD21
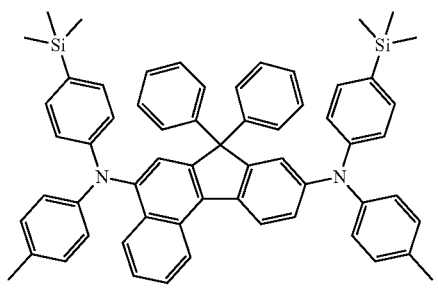
FD22
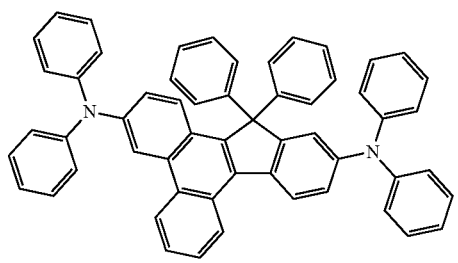

-continued
| FD23 | FD24 |
|---|---|
| 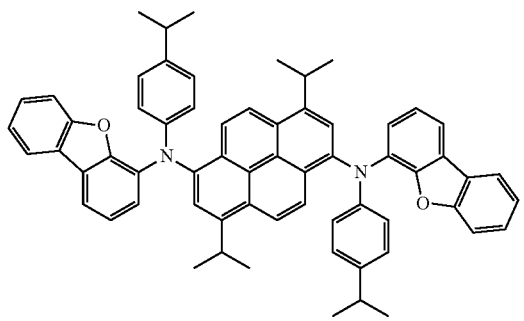 | 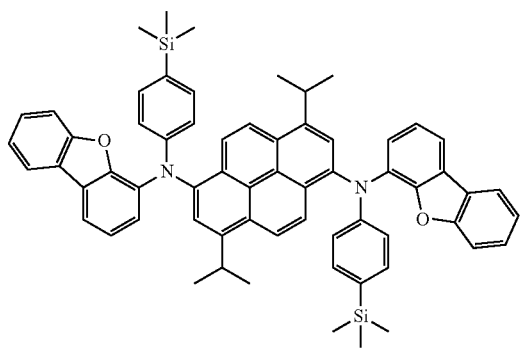 |
| FD25 | FD26 |
| 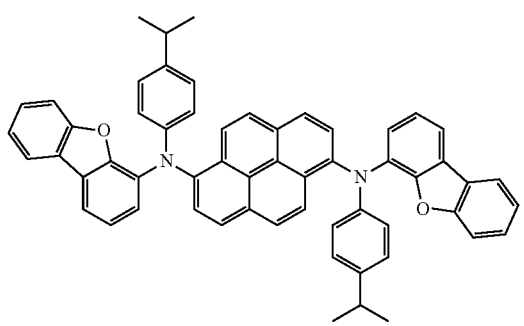 | 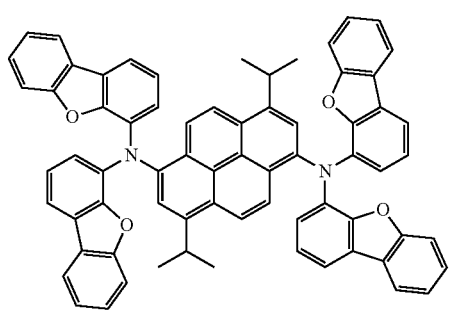 |
| FD27 | FD28 |
| 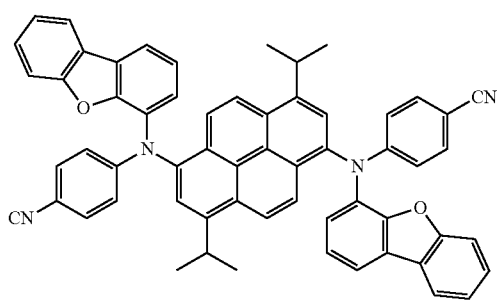 | 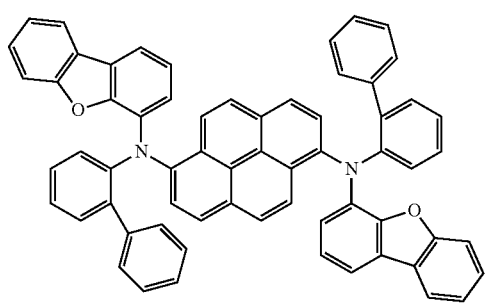 |
| FD29 | FD30 |
| 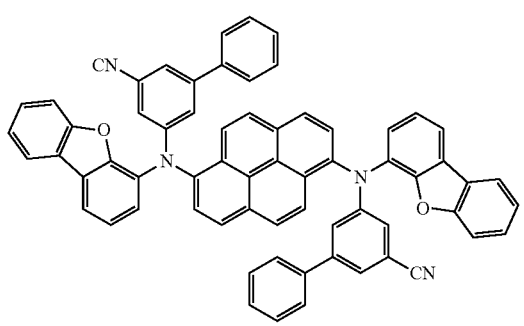 | 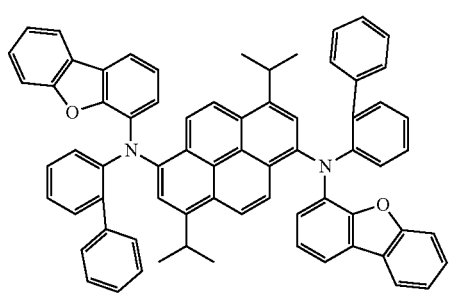 |

-continued
FD31
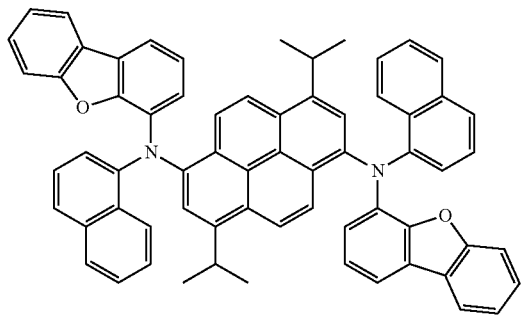
FD32
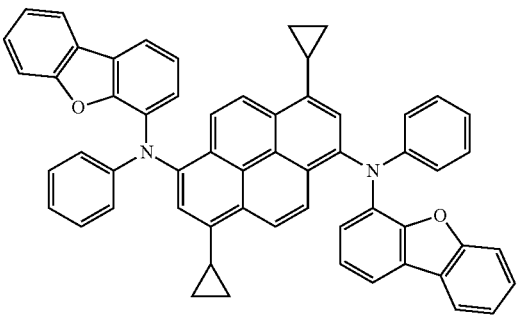
FD33
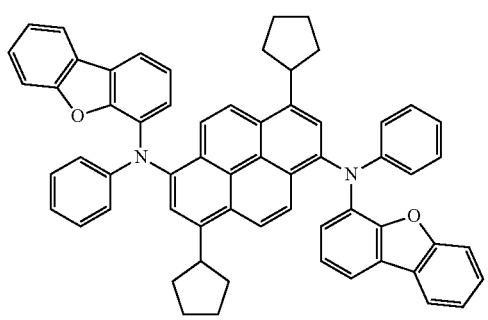
FD34
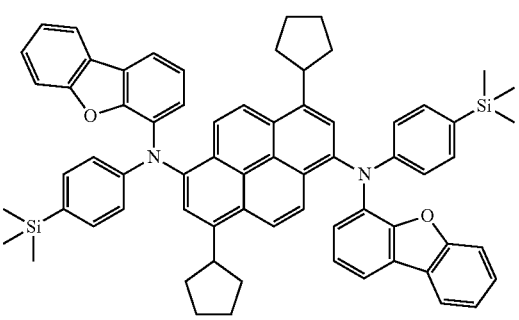
FD35
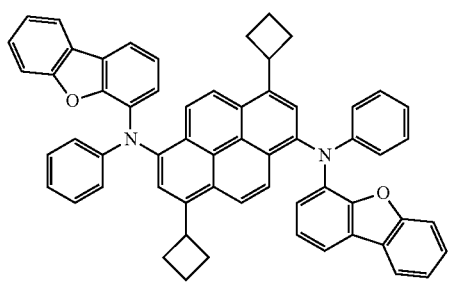
FD36
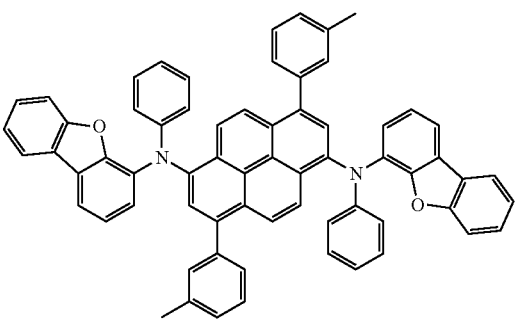
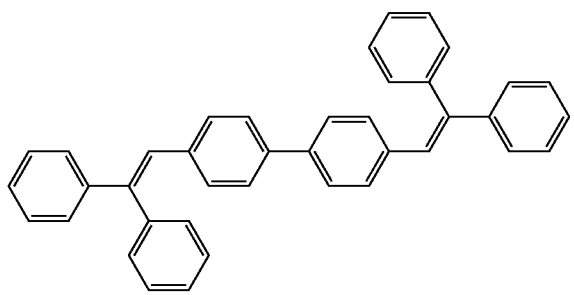
DPVBi
DPAVBi
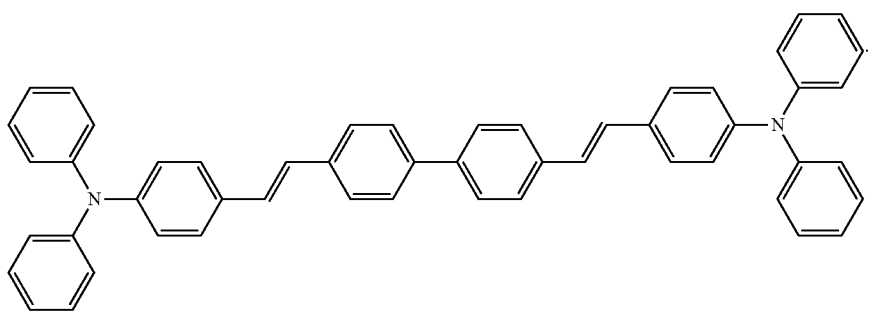

Delayed Fluorescence Dopant

The emission layer may include a delayed fluorescence dopant.

The delayed fluorescence dopant described herein may be any suitable compound that may emit delayed fluorescence according to a delayed fluorescence emission mechanism.

The delayed fluorescence dopant included in the emission layer may serve as a host or a dopant, depending on types of other materials included in the emission layer.

In some embodiments, a difference between a triplet energy level (eV) of the delayed fluorescence dopant and a singlet energy level (eV) of the delayed fluorescence dopant may be about 0 eV or greater and about 0.5 eV or less. When the difference between a triplet energy level (eV) of the delayed fluorescence dopant and a singlet energy level (eV) of the delayed fluorescence dopant is within this range, up-conversion from a triplet state to a singlet state in the delayed fluorescence dopant may be effectively occurred, thus improving luminescence efficiency and the like of the light-emitting device 10.

In some embodiments, the delayed fluorescence dopant may include: i) a material including at least one electron donor (e.g., a π electron-rich $C_3$-$C_{60}$ cyclic group such as a carbazole group) and at least one electron acceptor (e.g., a sulfoxide group, a cyano group, or a π electron-deficient nitrogen-containing $C_1$-$C_{60}$ cyclic group), ii) a material including a C8-$C_{60}$ polycyclic group including at least two cyclic groups condensed to each other and sharing boron (B), or any combination thereof.

Examples of the delayed fluorescence dopant may include at least one of Compounds DF1 to DF9:

DF1

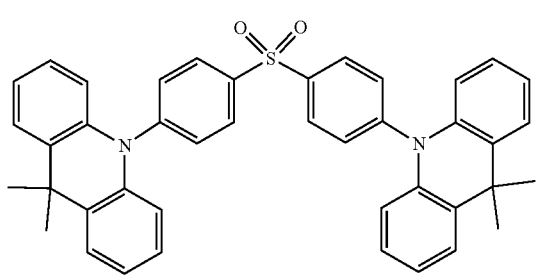

(DMAC-DPS)

DF2

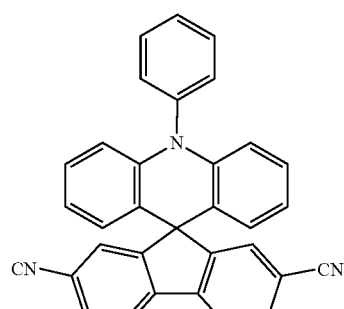

(ACRFLCN)

DF3

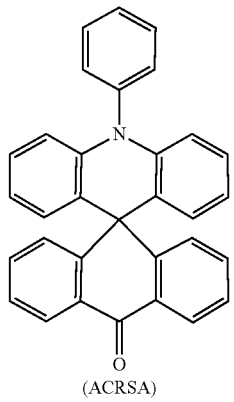

(ACRSA)

DF4

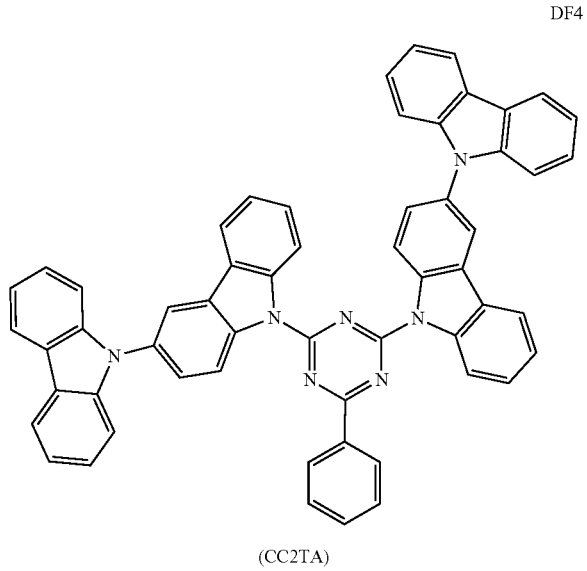

(CC2TA)

DF5

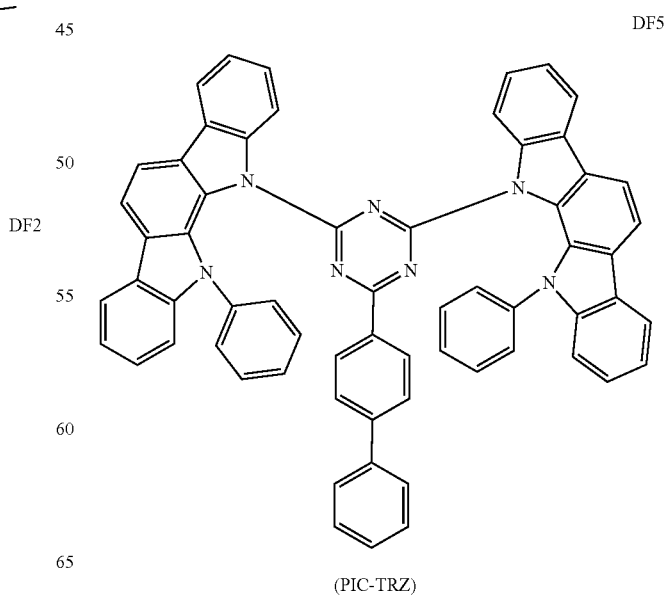

(PIC-TRZ)

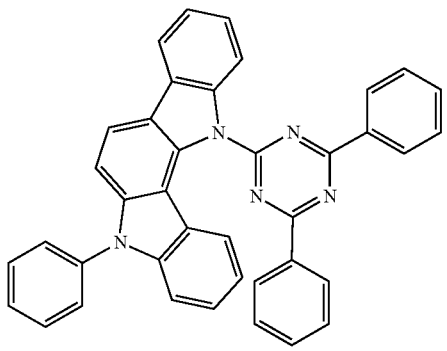

(PIC-TRZ2)

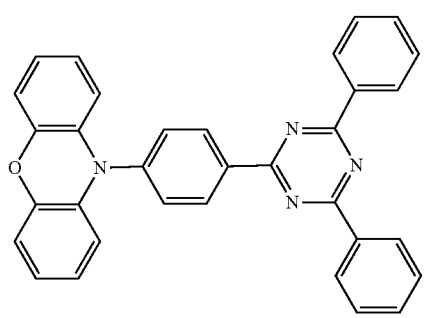

(PXZ-TRZ)

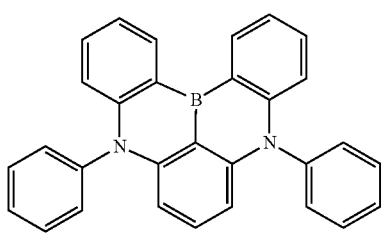

(DABNA-1)

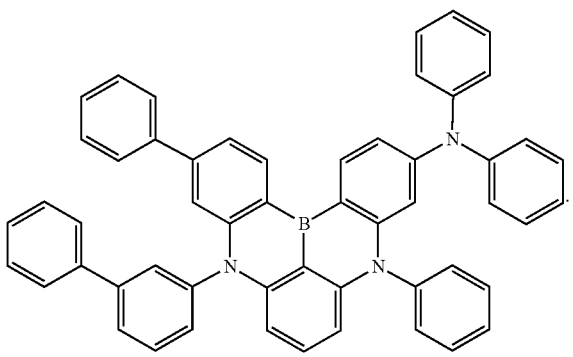

(DABNA-2)

Quantum Dots

The electronic apparatus may include quantum dots. For example, the electronic apparatus may include a color-conversion layer, and the color-conversion layer may include quantum dots.

The term "quantum dot" as used herein refers to a crystal of a semiconductor compound and may include any suitable material capable of emitting emission wavelengths of various lengths according to the size of the crystal.

The diameter of the quantum dot may be, for example, in a range of about 1 nm to about 10 nm.

Quantum dots may be synthesized by a wet chemical process, an organic metal chemical vapor deposition process, a molecular beam epitaxy process, or any similar process.

The wet chemical process is a method of growing a quantum dot particle crystal by mixing a precursor material with an organic solvent. When the crystal grows, the organic solvent may naturally serve as a dispersant coordinated on the surface of the quantum dot crystal and control the growth of the crystal. Thus, the wet chemical method may be easier to perform than the vapor deposition process such a metal organic chemical vapor deposition (MOCVD) or a molecular beam epitaxy (MBE) process. Further, the growth of quantum dot particles may be controlled with a lower manufacturing cost.

The quantum dot may include a group II-VI semiconductor compound; a group III-V semiconductor compound; a group III-VI semiconductor compound; a group semiconductor compound; a group IV-VI semiconductor compound; a group IV element or compound; or any combination thereof.

Examples of the group II-VI semiconductor compound may include a binary compound such as CdS, CdSe, CdTe, ZnS, ZnSe, ZnTe, ZnO, HgS, HgSe, HgTe, MgSe, or MgS; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the group III-V semiconductor compound may include a binary compound such as GaN, GaP, GaAs, GaSb, AlN, AlP, AlAs, AlSb, InN, InP, InAs, or InSb; a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. In some embodiments, the group III-V semiconductor compound may further include a group II element. Examples of the group III-V semiconductor compound further including the group II element may include InZnP, InGaZnP, InAlZnP, and the like.

Examples of the group III-VI semiconductor compound may include a binary compound such as GaS, GaSe, $Ga_2Se_3$, GaTe, InS, InSe, $In_2Se_3$, or InTe; or a ternary compound such as $InGaS_3$ or $InGaSe_3$; or any combination thereof.

Examples of the group semiconductor compound may include a ternary compound such as $AgInS$, $AgInS_2$, $CuInS$, $CuInS_2$, $CuGaO_2$, $AgGaO_2$, or $AgAlO_2$; or any combination thereof.

Examples of the group IV-VI semiconductor compound may include a binary compound such as SnS, SnSe, SnTe, PbS, PbSe, or PbTe; a ternary compound such as SnSeS, SnSeTe, SnSTe, PbSeS, PbSeTe, PbSTe, SnPbS, SnPbSe, or SnPbTe; a quaternary compound such as SnPbSSe, SnPbSeTe, or SnPbSTe; or any combination thereof.

The group IV element or compound may be a single element material such as Si or Ge; a binary compound such as SiC or SiGe; or any combination thereof.

Individual elements included in the multi-element compound, such as a binary compound, a ternary compound, and a quaternary compound, may be present in a particle thereof at a uniform or non-uniform concentration.

The quantum dot may have a single structure in which the concentration of each element included in the quantum dot is uniform or a core-shell double structure. In some embodiments, materials included in the core may be different from materials included in the shell.

The shell of the quantum dot may serve as a protective layer for preventing chemical denaturation of the core to maintain semiconductor characteristics and/or as a charging layer for imparting electrophoretic characteristics to the quantum dot. The shell may be a monolayer or a multilayer. An interface between a core and a shell may have a concentration gradient where a concentration of elements present in the shell decreases toward the core.

Examples of the shell of the quantum dot include metal, metalloid, or nonmetal oxide, a semiconductor compound, or a combination thereof. Examples of the metal, the metalloid, or the nonmetal oxide may include a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, or $NiO$; a ternary compound such as $MgAl_2O_4$, $CoFe_2O_4$, $NiFe_2O_4$, or $CoMn_2O_4$; or any combination thereof. Examples of the semiconductor compound may include a group II-VI semiconductor compound; a group III-V semiconductor compound; a group III-VI semiconductor compound; a group semiconductor compound; a group IV-VI semiconductor compound; or any combination thereof. In some embodiments, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a full width of half maximum (FWHM) of a spectrum of an emission wavelength of about 45 nm or less, about 40 nm or less, or about 30 nm or less. When the FWHM of the quantum dot is within this range, color purity or color reproducibility may be improved. In addition, because light emitted through the quantum dots is emitted in all directions, an optical viewing angle may be improved.

In addition, the quantum dot may be specifically, a spherical, pyramidal, multi-arm, or cubic nanoparticle, nanotube, nanowire, nanofiber, or nanoplate particle.

By adjusting the size of the quantum dot, the energy band gap may also be adjusted, thereby obtaining light of various wavelengths in the quantum dot emission layer. By using quantum dots of various sizes, a light-emitting device that may emit light of various wavelengths may be realized. In some embodiments, the size of the quantum dot may be selected such that the quantum dot may emit red, green, and/or blue light. In addition, the size of the quantum dot may be selected such that the quantum dot may emit white light by combining various light colors.

Electron Transport Region in Interlayer 130

The electron transport region may have i) a single-layered structure consisting of a single layer consisting of a single material, ii) a single-layered structure consisting of a single layer including a plurality of different materials, or iii) a multi-layered structure having a plurality of layers including a plurality of different materials.

The electron transport region may include a buffer layer, an electron transport layer, a hole blocking layer, an electron injection layer, or any combination thereof. The buffer layer may include the first buffer layer and the second buffer layer.

For example, the electron transport region may include a first buffer layer/second buffer layer/electron transport layer structure, wherein layers of each structure are sequentially stacked on the emission layer in each stated order.

The electron transport region (e.g., a hole blocking layer or an electron transport layer in the electron transport region) may include a metal-free compound including at least one π electron-deficient nitrogen-containing $C_1$-$C_{60}$ cyclic group.

In some embodiments, the electron transport region may include a compound represented by Formula 601:

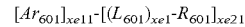
                                              Formula 601

$[Ar_{601}]_{xe11}-[(L_{601})_{xe1}-R_{601}]_{xe21}$ wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $-Si(Q_{601})(Q_{602})(Q_{603})$, $-C(=O)(Q_{601})$, $-S(=O)_2(Q_{601})$, or $-P(=O)(Q_{601})(Q_{602})$, wherein $Q_{601}$ to $Q_{603}$ may each be understood by referring to the description of $Q_1$ provided herein, xe21 may be 1, 2, 3, 4, or 5, and at least one of $Ar_{601}$, $L_{601}$, and $R_{601}$ may independently be a π electron-deficient nitrogen-containing $C_1$-$C_{60}$ cyclic group unsubstituted or substituted with at least one $R_{10a}$.

For example, in Formula 601, when xe11 is 2 or greater, at least two $Ar_{601}$(s) may be bound to each other via a single bond.

In some embodiments, in Formula 601, $Ar_{601}$ may be a substituted or unsubstituted anthracene group.

In some embodiments, the electron transport region may include a compound represented by Formula 601-1:

Formula 601-1

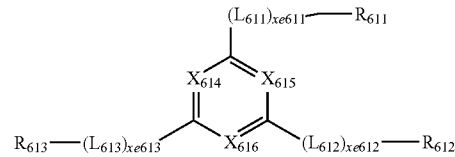

wherein, in Formula 601-1, least one of $X_{614}$ to $X_{616}$ may be N, $L_{611}$ to $L_{613}$ may each be understood by referring to the description of $L_{601}$ provided herein, xe611 to xe613 may each be understood by referring to the description of xe1 provided herein, $R_{611}$ to $R_{613}$ may each be understood by referring to the description of $R_{601}$ provided herein, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

$X_{614}$ may be N or $C(R_{614})$, $X_{615}$ may be N or $C(R_{615})$, $X_{616}$ may be N or $C(R_{616})$, and at For example, in Formulas 601 and 601-1, xe1 and xe611 to xe613 may each independently be 0, 1, or 2.
The electron transport region may include one of Compounds ET1 to ET45, 2,9-dimethyl-4,7-diphenyl-1,10-phenanthroline (BCP), 4,7-diphenyl-1,10-phenanthroline (Bphen), Alq$_3$, BAlq, TAZ, NTAZ, or any combination thereof:
ET1
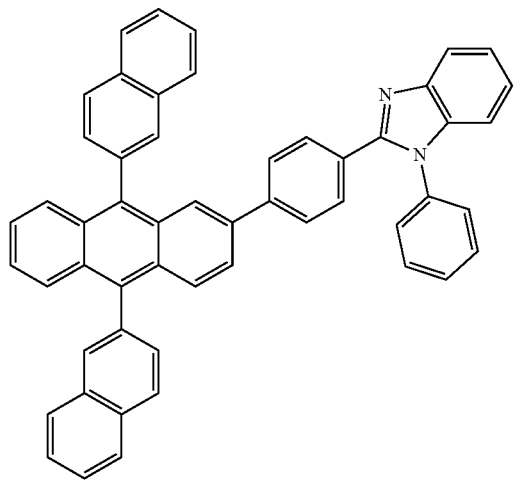
ET2
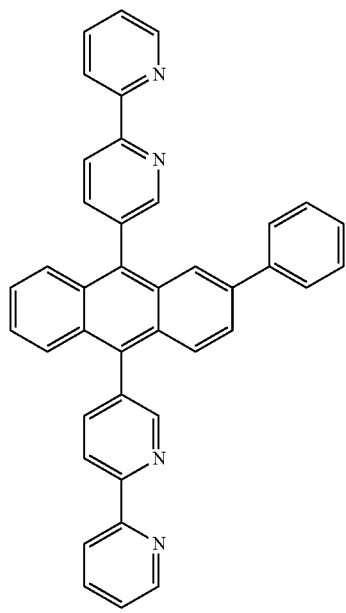
ET3
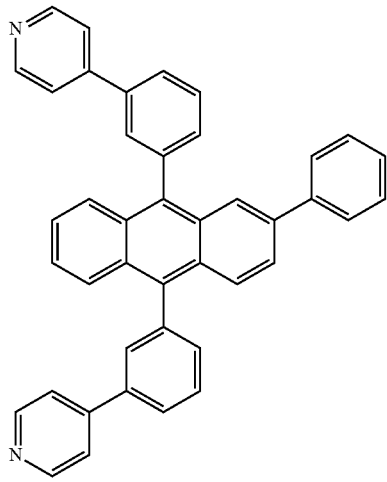
ET4
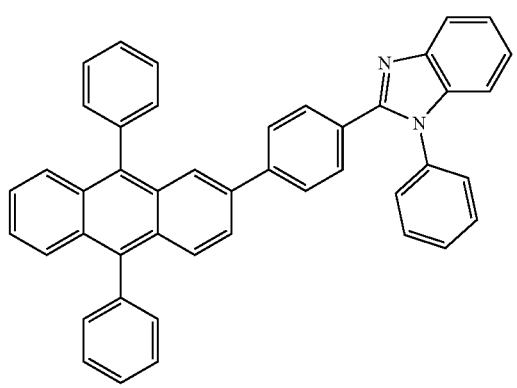
ET5
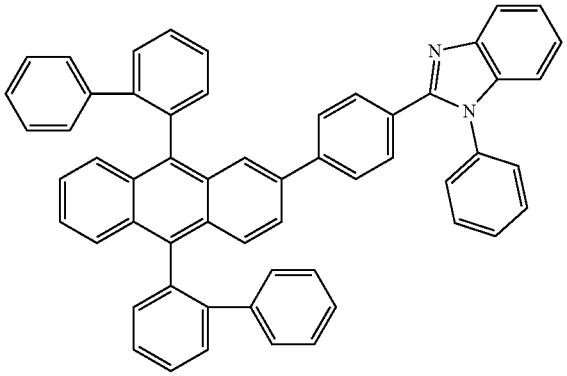

ET6
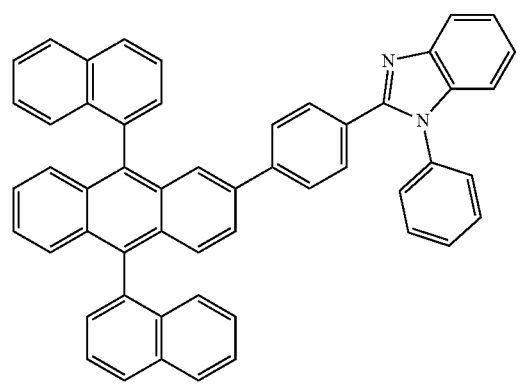
ET7
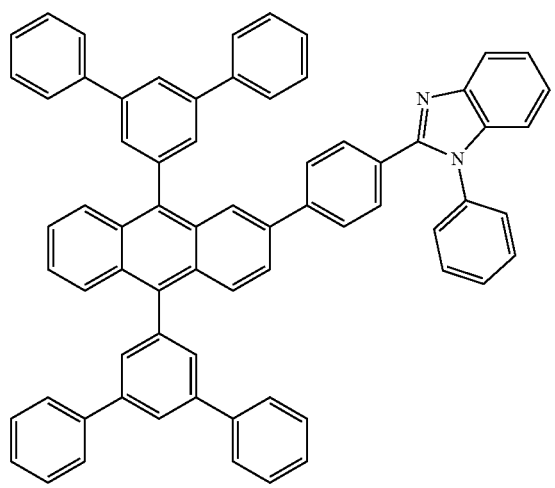
ET8
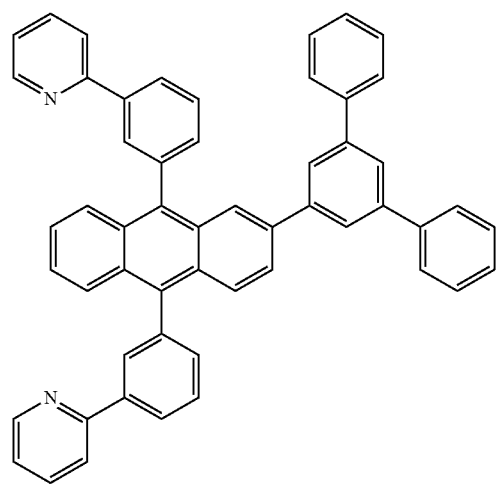
ET9
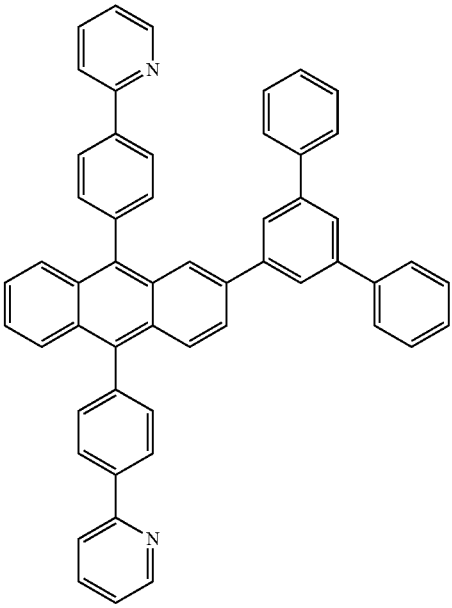
ET10
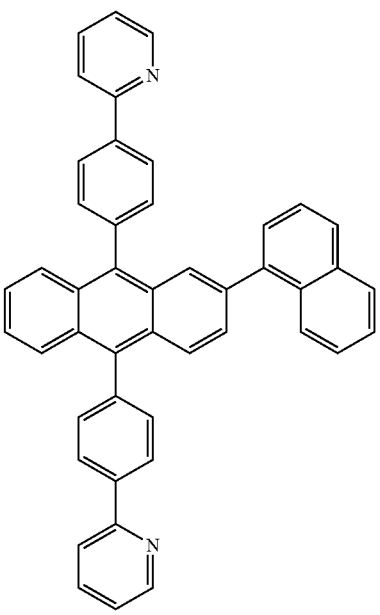

ET11
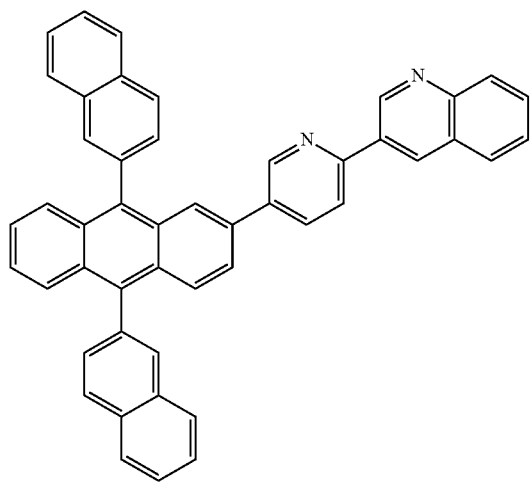
ET12
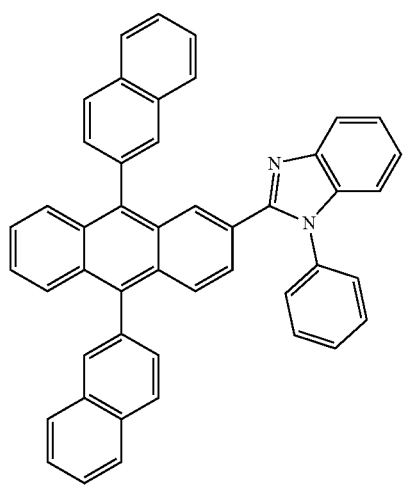
ET13
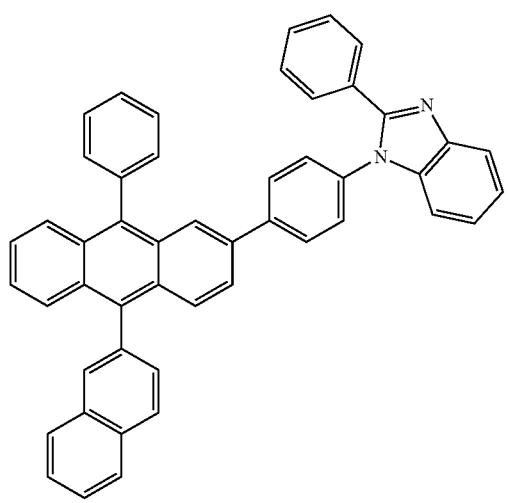
ET14
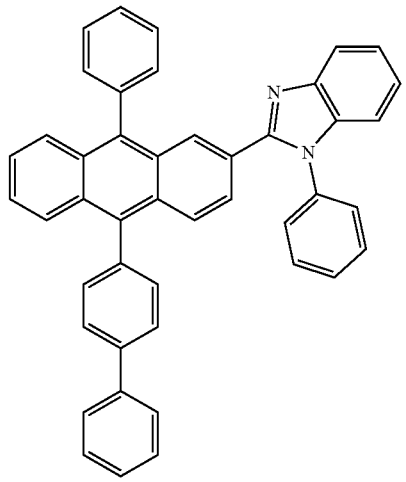
ET15
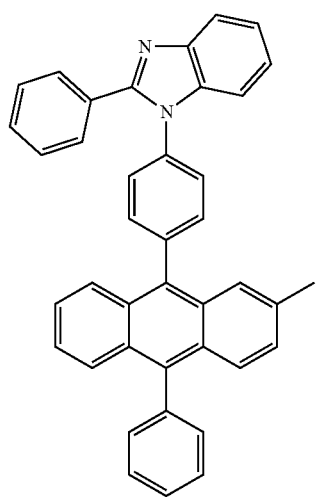
ET16
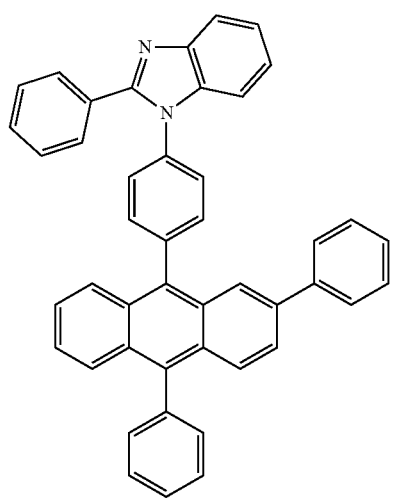

ET17
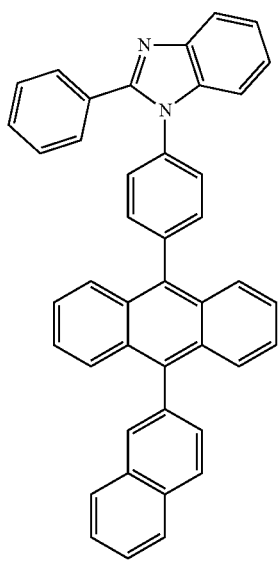
ET18
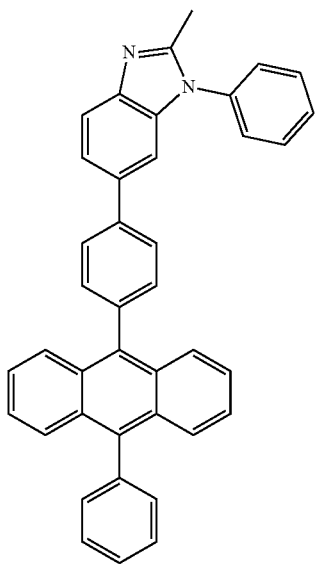
ET19
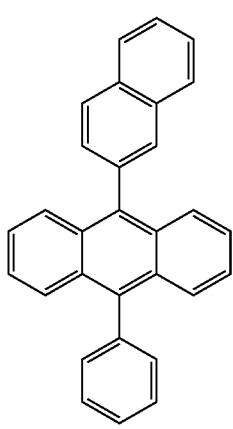
ET20
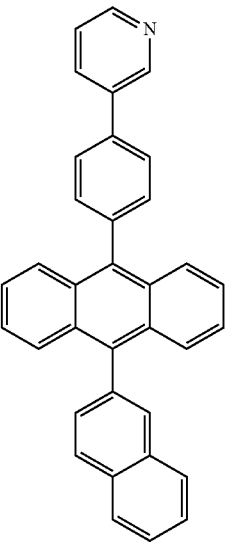
ET21
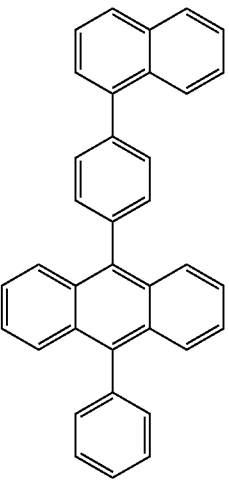
ET22
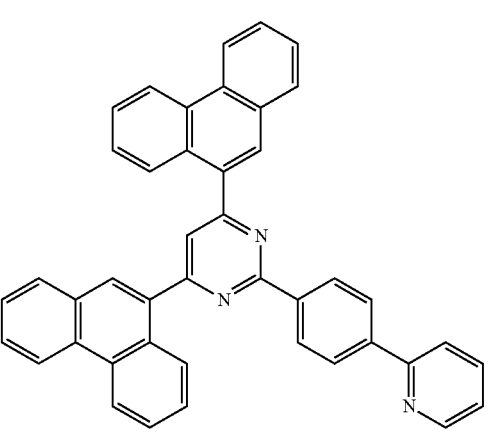

ET23
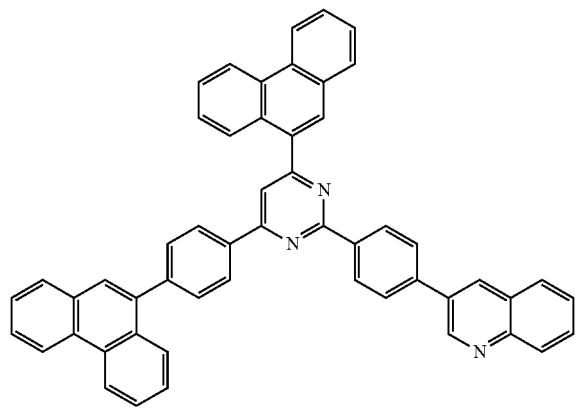
ET26
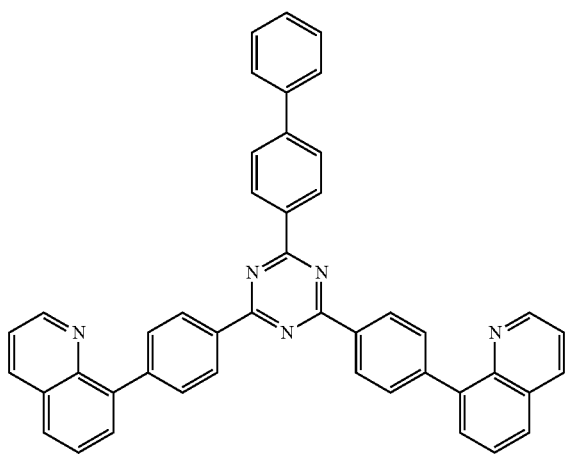
ET24
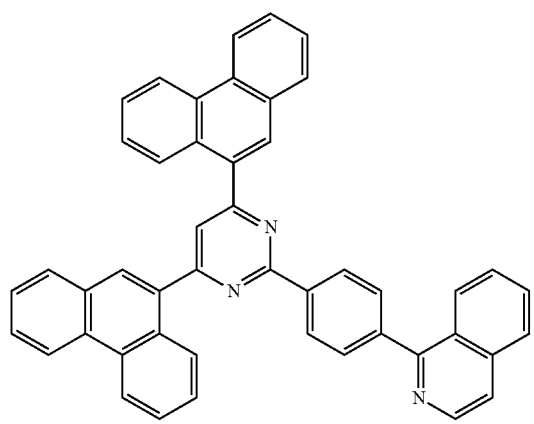
ET27
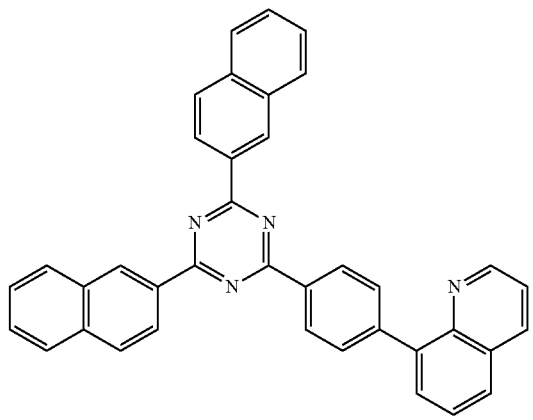
ET25
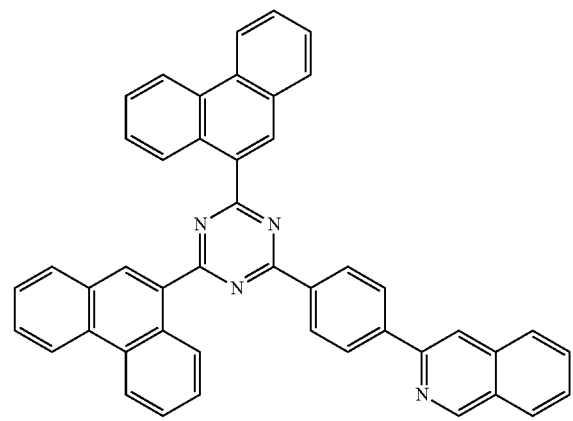
ET28
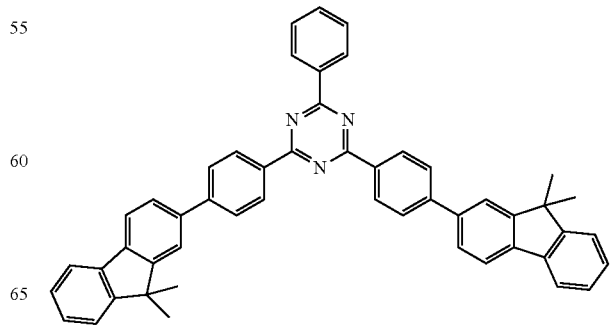

ET29
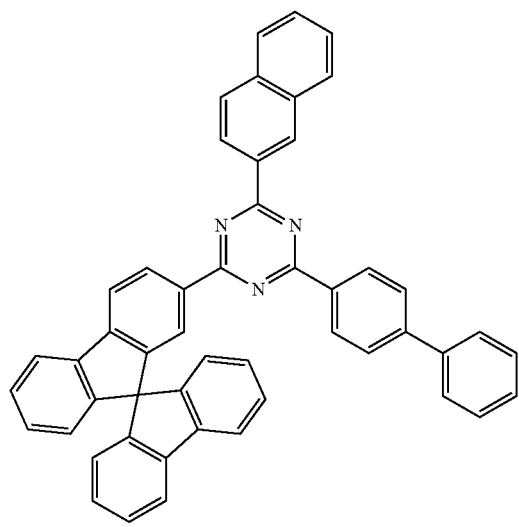
ET30
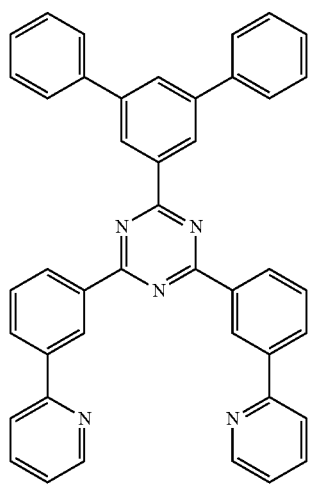
ET31
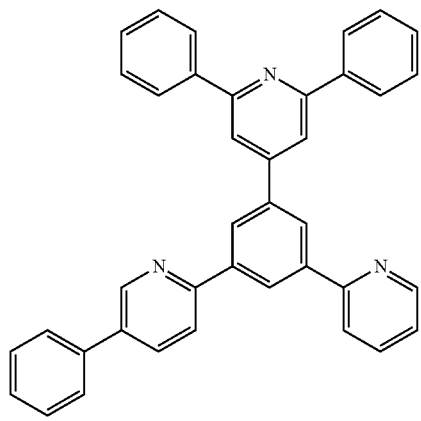
ET32
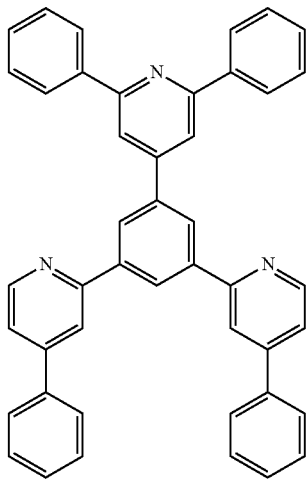
ET33
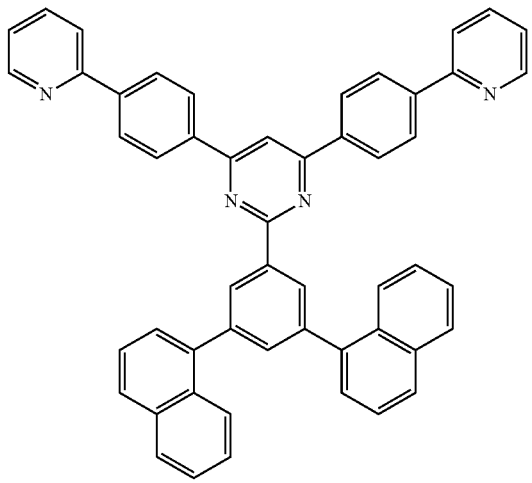
ET34
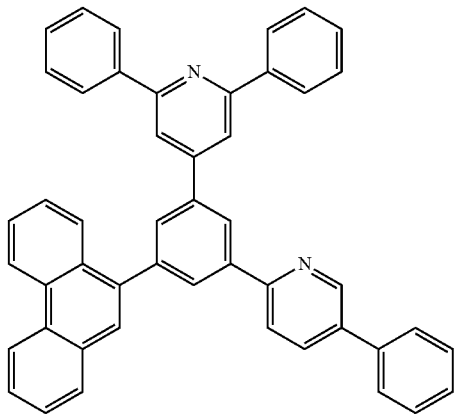

ET35
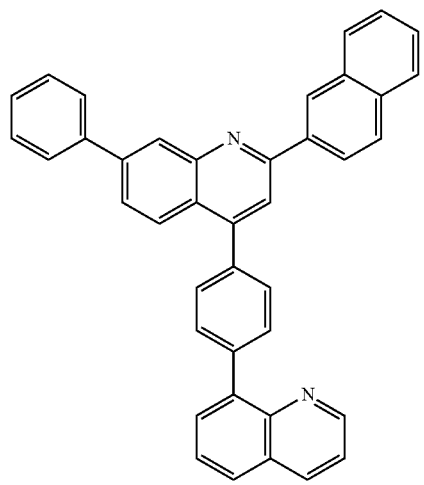
ET36
ET37
ET38
ET39
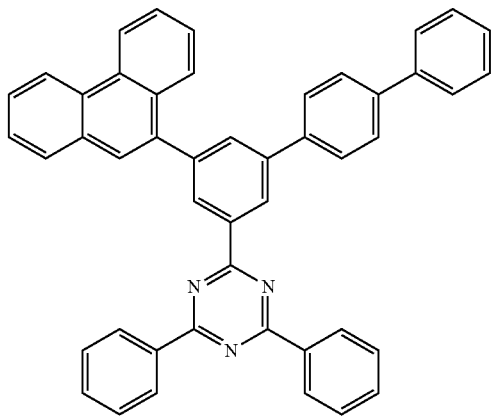
ET40
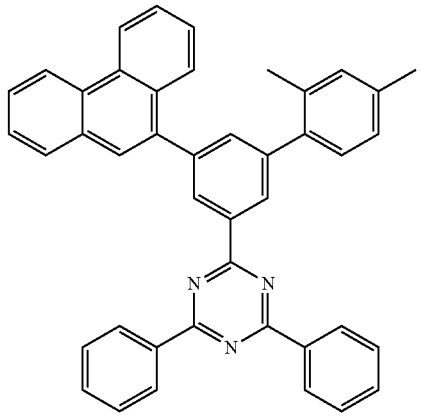
ET41
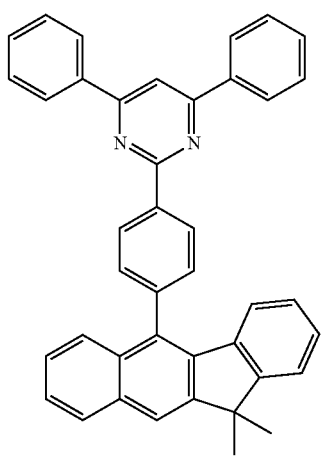

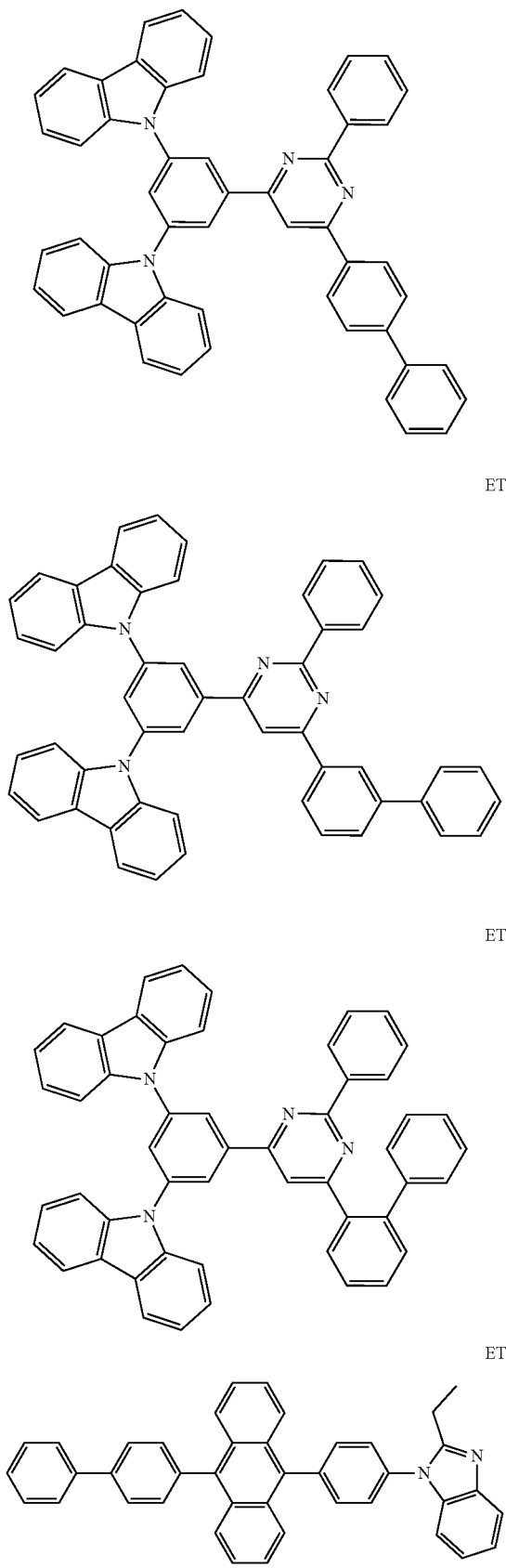
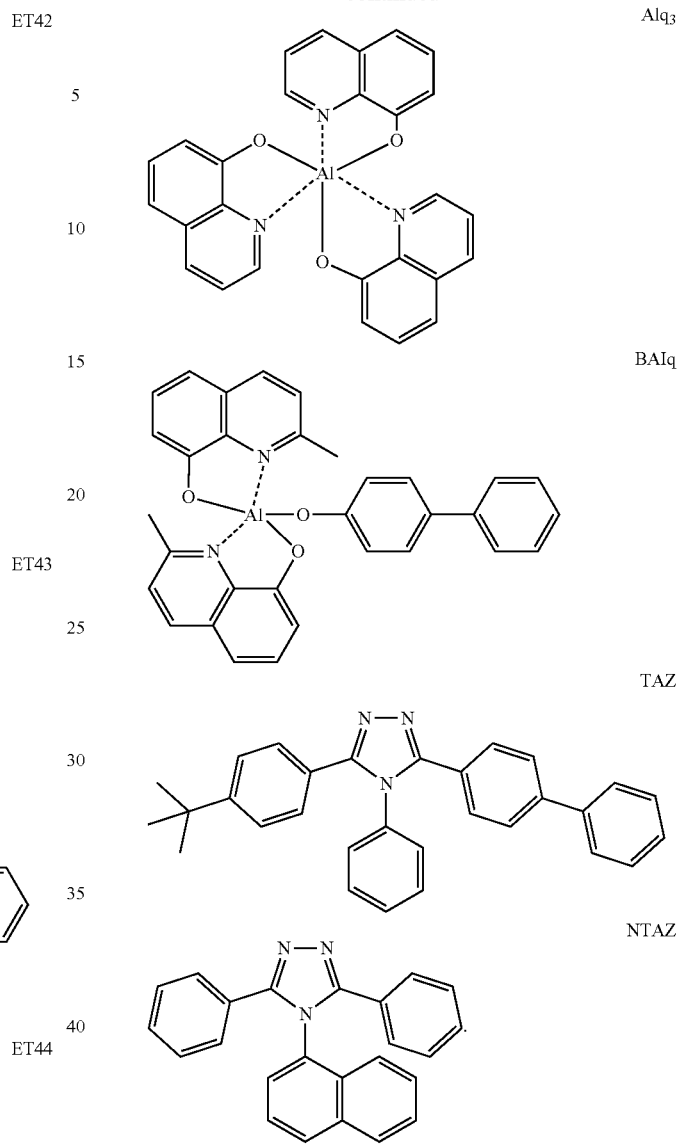

Compounds included in the first buffer layer and the second buffer layer may be understood by referring to the descriptions of the compound provided herein.

The thickness of the electron transport region may be in a range of about 100 Angstroms (Å) to about 5,000 Å, for example, about 160 Å to about 4,000 Å. When the electron transport region includes a hole blocking layer, an electron transport layer, or any combination thereof, the thicknesses of the hole blocking layer or the electron transport layer may each independently be in a range of about 20 Å to about 1,000 Å, for example, about 30 Å to about 300 Å, and the thickness of the electron transport layer may be in a range of about 100 Å to about 1,000 Å, for example, about 150 Å to about 500 Å. When the thickness of the hole blocking layer and/or the electron transport layer is within any of these ranges, excellent electron transport characteristics may be obtained without a substantial increase in driving voltage.

The thickness of the first buffer layer and the thickness of the second buffer layer may each independently be in a range of about 10 Å to about 500 Å, for example, about 30 Å to about 300 Å, or for example, about 60 Å to about 150 Å.

When the first buffer layer and the second buffer layer each have a thickness less than 10 Å, it may be difficult to control electron injection, and when the first buffer layer and the second buffer layer each have a thickness greater than 500 Å, driving voltage may rapidly increase.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a lithium (Li) ion, a sodium (Na) ion, a potassium (K) ion, a rubidium (Rb) ion, or a cesium (Cs) ion. A metal ion of the alkaline earth metal complex may be a beryllium (Be) ion, a magnesium (Mg) ion, a calcium (Ca) ion, a strontium (Sr) ion, or a barium (Ba) ion. Each ligand coordinated with the metal ion of the alkali metal complex and the alkaline earth metal complex may independently be hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

For example, the metal-containing material may include a Li complex. The Li complex may include, e.g., Compound ET-D1 (LiQ) or Compound ET-D2:

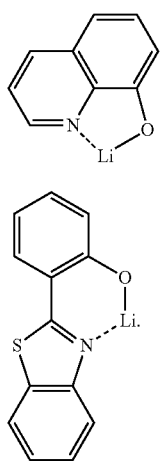

ET-D1

ET-D2

The electron transport region may include an electron injection layer that facilitates injection of electrons from the second electrode 150. The electron injection layer may be in direct contact with the second electrode 150.

The electron injection layer may have i) a single-layered structure consisting of a single layer consisting of a single material, ii) a single-layered structure consisting of a single layer including a plurality of different materials, or iii) a multi-layered structure having a plurality of layers including a plurality of different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may be Li, Na, K, Rb, Cs or any combination thereof. The alkaline earth metal may be Mg, Ca, Sr, Ba, or any combination thereof. The rare earth metal may be Sc, Y, Ce, Tb, Yb, Gd, or any combination thereof.

The alkali metal-containing compound, the alkaline earth metal-containing compound, and the rare earth metal-containing compound may respectively be oxides, halides (e.g., fluorides, chlorides, bromides, or iodides), tellurides, or any combination thereof of each of the alkali metal, the alkaline earth metal, and the rare earth metal.

The alkali metal-containing compound may be alkali metal oxides such as $Li_2O$, $Cs_2O$, or $K_2O$, alkali metal halides such as LiF, NaF, CsF, KF, LiI, NaI, CsI, or KI, or any combination thereof. The alkaline earth-metal-containing compound may include alkaline earth-metal oxides, such as BaO, SrO, CaO, $Ba_xSr_{1-x}O$ (wherein x is a real number satisfying 0<x<1), or $Ba_xCa_{1-x}O$ (wherein x is a real number satisfying 0<x<1). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In some embodiments, the rare earth metal-containing compound may include a lanthanide metal telluride. Examples of the lanthanide metal telluride include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth metal complex, and the rare earth metal complex may include: i) one of ions of the alkali metal, alkaline earth metal, and rare earth metal described above and ii) a ligand bond to the metal ion, e.g., hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In some embodiments, the electron injection layer may further include an organic material (e.g., a compound represented by Formula 601).

In some embodiments, the electron injection layer may consist of i) an alkali metal-containing compound (e.g., alkali metal halide), or ii) a) an alkali metal-containing compound (e.g., alkali metal halide); and b) an alkali metal, an alkaline earth metal, a rare earth metal, or any combination thereof. In some embodiments, the electron injection layer may be a KI:Yb co-deposition layer, a RbI:Yb co-deposition layer, and the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth metal complex, the rare earth metal complex, or any combination thereof may be homogeneously or non-homogeneously dispersed in a matrix including the organic material.

The thickness of the electron injection layer may be in a range of about 1 Å to about 100 Å, and in some embodiments, about 3 Å to about 90 Å. When the thickness of the electron injection layer is within any of these ranges, excellent electron injection characteristics may be obtained without a substantial increase in driving voltage.

Second Electrode 150

The second electrode 150 may be on the interlayer 130. In an embodiment, the second electrode 150 may be a cathode that is an electron injection electrode. In this embodiment, a material for forming the second electrode 150 may be a material having a low work function, for example, a metal, an alloy, an electrically conductive compound, or any combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure, or a multi-layered structure including two or more layers.

Capping Layer

A first capping layer may be located outside the first electrode 110, and/or a second capping layer may be located outside the second electrode 150. In some embodiments, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

In the light-emitting device 10, light emitted from the emission layer in the interlayer 130 may pass through the first electrode 110 (which may be a semi-transmissive electrode or a transmissive electrode) and through the first capping layer to the outside. In the light-emitting device 10, light emitted from the emission layer in the interlayer 130 may pass through the second electrode 150 (which may be a semi-transmissive electrode or a transmissive electrode) and through the second capping layer to the outside.

The first capping layer and the second capping layer may improve the external luminescence efficiency based on the principle of constructive interference. Accordingly, the optical extraction efficiency of the light-emitting device 10 may be increased, thus improving the luminescence efficiency of the light-emitting device 10.

The first capping layer and the second capping layer may each include a material having a refractive index of 1.6 or higher (at 589 nm).

The first capping layer and the second capping layer may each independently be a capping layer including an organic material, an inorganic capping layer including an inorganic material, or an organic-inorganic composite capping layer including an organic material and an inorganic material.

At least one of the first capping layer and the second capping layer may each independently include carbocyclic compounds, heterocyclic compounds, amine group-containing compounds, porphine derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may optionally be substituted with a substituent of O, N, S, Se, Si, F, Cl, Br, I, or any combination thereof. In some embodiments, at least one of the first capping layer and the second capping layer may each independently include an amine group-containing compound.

In some embodiments, at least one of the first capping layer and the second capping layer may each independently include the compound represented by Formula 201, the compound represented by Formula 202, or any combination thereof.

In one or more embodiments, at least one of the first capping layer and the second capping layer may each independently include one of Compounds HT28 to HT33, one of Compounds CP1 to CP6, β-NPB, or any combination thereof:

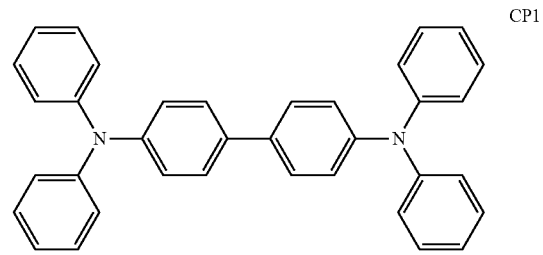

CP1

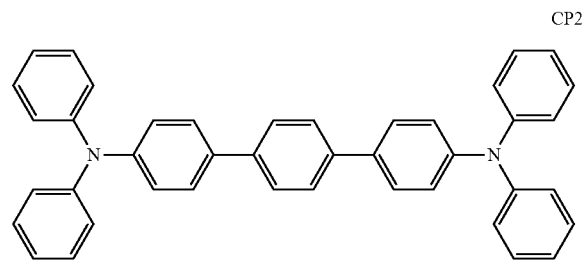

CP2

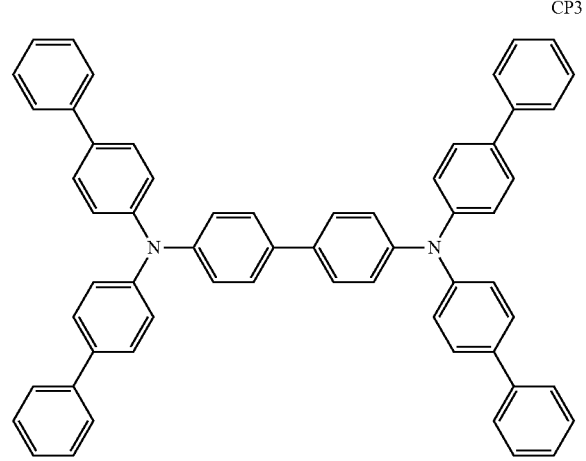

CP3

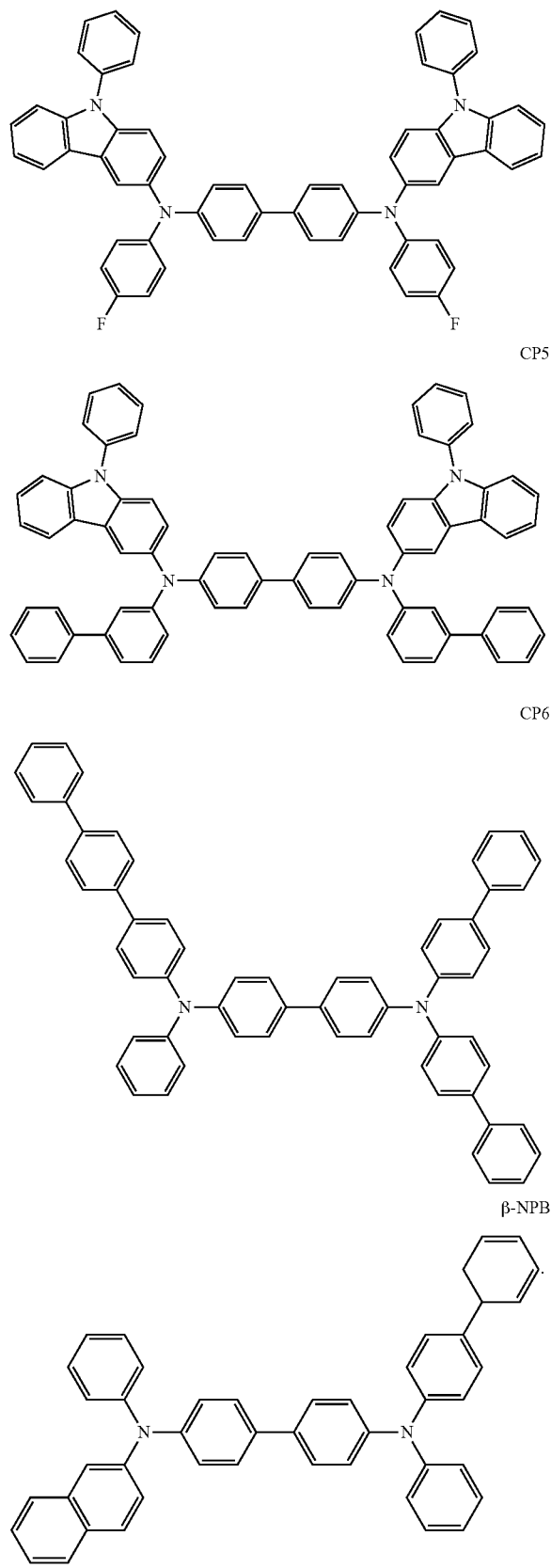

Electronic Apparatus

The light-emitting device may be included in various electronic apparatuses. In some embodiments, an electronic apparatus including the light-emitting device may be a light-emitting apparatus or an authentication apparatus.

The electronic apparatus (e.g., a light-emitting apparatus) may further include, in addition to the light-emitting device, i) a color filter, ii) a color-conversion layer, or iii) a color filter and a color-conversion layer. The color filter and/or the color-conversion layer may be disposed on at least one traveling direction of light emitted from the light-emitting device. For example, light emitted from the light-emitting device may be blue light. The light-emitting device may be understood by referring to the descriptions provided herein. In some embodiments, the color-conversion layer may include quantum dots. The quantum dot may be, for example, the quantum dot described herein.

The electronic apparatus may include a first substrate. The first substrate may include a plurality of sub-pixel areas, the color filter may include a plurality of color filter areas respectively corresponding to the plurality of sub-pixel areas, and the color-conversion layer may include a plurality of color-conversion areas respectively corresponding to the plurality of sub-pixel areas.

A pixel-defining film may be located between the plurality of sub-pixel areas to define each sub-pixel area.

The color filter may further include a plurality of color filter areas and light-blocking patterns between the plurality of color filter areas, and the color-conversion layer may further include a plurality of color-conversion areas and light-blocking patterns between the plurality of color-conversion areas.

The plurality of color filter areas (or a plurality of color-conversion areas) may include: a first area emitting first color light; a second area emitting second color light; and/or a third area emitting third color light, and the first color light, the second color light, and/or the third color light may have different maximum emission wavelengths. In some embodiments, the first color light may be red light, the second color light may be green light, and the third color light may be blue light. In some embodiments, the plurality of color filter areas (or the plurality of color-conversion areas) may each include quantum dots. In some embodiments, the first area may include red quantum dots, the second area may include green quantum dots, and the third area may not include a quantum dot. The quantum dot may be understood by referring to the description of the quantum dot provided herein. The first area, the second area, and/or the third area may each further include an emitter.

In some embodiments, the light-emitting device may emit first light, the first area may absorb the first light to emit 1-1 color light, the second area may absorb the first light to emit 2-1 color light, and the third area may absorb the first light to emit 3-1 color light. In this embodiment, the 1-1 color light, the 2-1 color light, and the 3-1 color light may each have a different maximum emission wavelength. In some embodiments, the first light may be blue light, the 1-1 color light may be red light, the 2-1 color light may be green light, and the 3-1 light may be blue light.

The electronic apparatus may further include a thin-film transistor, in addition to the light-emitting device. The thin-film transistor may include a source electrode, a drain electrode, and an active layer, wherein one of the source electrode and the drain electrode may be electrically connected to one of the first electrode and the second electrode of the light-emitting device.

The thin-film transistor may further include a gate electrode, a gate insulating film, or the like.

The active layer may include a crystalline silicon, an amorphous silicon, an organic semiconductor, and an oxide semiconductor.

The electronic apparatus may further include an encapsulation unit for sealing the light-emitting device. The encapsulation unit may be located between the color filter and/or the color-conversion layer and the light-emitting device. The encapsulation unit may allow light to pass to the outside from the light-emitting device and prevent the air and moisture to permeate to the light-emitting device at the same time. The encapsulation unit may be a sealing substrate including transparent glass or a plastic substrate. The encapsulation unit may be a thin-film encapsulating layer including at least one of an organic layer and/or an inorganic layer. When the encapsulation unit is a thin-film encapsulating layer, the electronic apparatus may be flexible.

In addition to the color filter and/or the color-conversion layer, various functional layers may be disposed on the encapsulation unit depending on the use of an electronic apparatus. Examples of the functional layer may include a touch screen layer, a polarizing layer, or the like. The touch screen layer may be a resistive touch screen layer, a capacitive touch screen layer, or an infrared beam touch screen layer. The authentication apparatus may be, for example, a biometric authentication apparatus that identifies an individual according to biometric information (e.g., a fingertip, a pupil, or the like).

The authentication apparatus may further include a biometric information collecting unit, in addition to the light-emitting device described above.

The electronic apparatus may be applicable to various displays, an optical source, lighting, a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, or an endoscope display device), a fish finder, various measurement devices, gauges (e.g., gauges of an automobile, an airplane, or a ship), and a projector.

Figure 3:
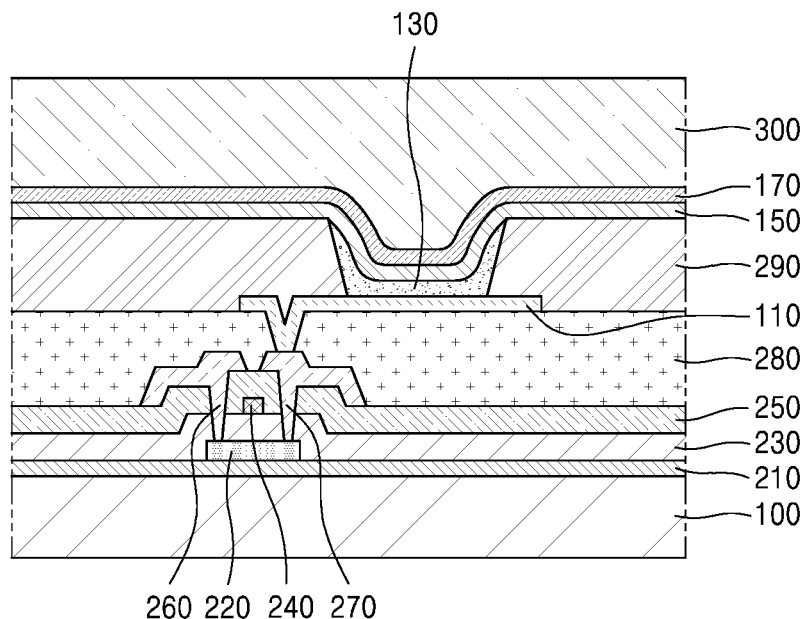
FIG. 3 is a schematic cross-sectional view of a light-emitting apparatus according to an embodiment.
Figure 4:
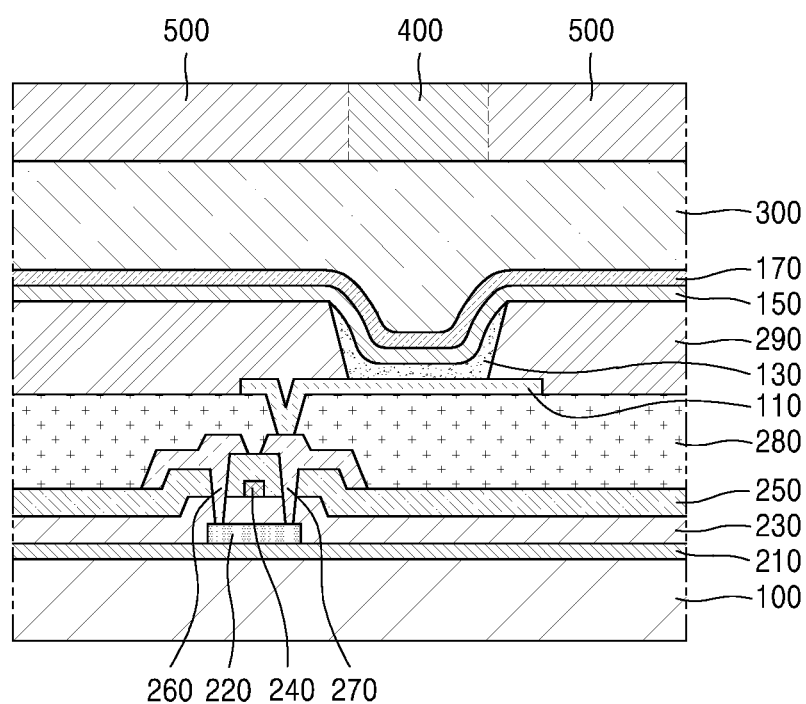
FIG. 4 is a schematic cross-sectional view of a light-emitting apparatus according to another embodiment.

Descriptions of FIGS. 3 and 4

FIG. 3 is a schematic cross-sectional view of an embodiment of an electronic apparatus.

An electronic apparatus in FIG. 3 may include a substrate 100, a thin-film transistor, a light-emitting device, and an encapsulation unit 300 sealing the light-emitting device.

The substrate 100 may be a flexible substrate, a glass substrate, or a metal substrate. A buffer layer 210 may be on the substrate 100. The buffer layer 210 may prevent penetration of impurities through the substrate 100 and provide a flat surface on the substrate 100.

A thin-film transistor may be on the buffer layer 210. The thin-film transistor may include an active layer 220, a gate electrode 240, a source electrode 260, and a drain electrode 270.

The active layer 220 may include an inorganic semiconductor such as silicon or polysilicon, an organic semiconductor, or an oxide semiconductor and include a source area, a drain area, and a channel area.

A gate insulating film 230 for insulating the active layer 220 and the gate electrode 240 may be on the active layer 220, and the gate electrode 240 may be on the gate insulating film 230.

An interlayer insulating film 250 may be on the gate electrode 240. The interlayer insulating film 250 may be between the gate electrode 240 and the source electrode 260 and between the gate electrode 240 and the drain electrode 270 to provide insulation therebetween.

The source electrode 260 and the drain electrode 270 may be on the interlayer insulating film 250. The interlayer insulating film 250 and the gate insulating film 230 may be formed to expose the source area and the drain area of the active layer 220, and the source electrode 260 and the drain electrode 270 may be adjacent to the exposed source area and the exposed drain area of the active layer 220.

Such a thin-film transistor may be electrically connected to a light-emitting device to drive the light-emitting device and may be protected by a passivation layer 280. The passivation layer 280 may include an inorganic insulating film, an organic insulating film, or a combination thereof. A light-emitting device may be on the passivation layer 280. The light-emitting device may include a first electrode 110, an interlayer 130, and a second electrode 150.

The first electrode 110 may be on the passivation layer 280. The passivation layer 280 may not fully cover the drain electrode 270 and expose a specific area of the drain electrode 270, and the first electrode 110 may be disposed to connect to the exposed area of the drain electrode 270.

A pixel-defining film 290 may be on the first electrode 110. The pixel-defining film 290 may expose a specific area of the first electrode 110, and the interlayer 130 may be formed in the exposed area of the first electrode 110. The pixel-defining film 290 may be a polyimide or polyacryl organic film. Some higher layers of the interlayer 130 may extend to the upper portion of the pixel-defining film 290 and may be disposed in the form of a common layer, in some implementations of this embodiment.

The second electrode 150 may be on the interlayer 130, and a capping layer 170 may be additionally formed on the second electrode 150. The capping layer 170 may be formed to cover the second electrode 150.

The encapsulation unit 300 may be on the capping layer 170. The encapsulation unit 300 may be on the light-emitting device to protect a light-emitting device from moisture or oxygen. The encapsulation unit 300 may include: an inorganic film including silicon nitride ($SiN_x$), silicon oxide ($SiO_x$), indium tin oxide, indium zinc oxide, or any combination thereof; an organic film including PET, polyethylene naphthalate, polycarbonate, polyimide, polyethylene sulfonate, polyoxy methylene, polyarylate, hexamethyl disiloxane, an acrylic resin (e.g., polymethyl methacrylate, polyacrylic acid, and the like), an epoxy resin (e.g., aliphatic glycidyl ether (AGE) and the like), or any combination thereof; or a combination of the inorganic film and the organic film.

FIG. 4 is a schematic cross-sectional view of another embodiment of an electronic apparatus.

The electronic apparatus shown in FIG. 4 may be substantially identical to the light-emitting apparatus shown in FIG. 3, except that a light-shielding pattern 500 and a functional area 400 are additionally located on the encapsulation unit 300. The functional area 400 may be i) a color filter area, ii) a color-conversion area, or iii) a combination of a color filter area and a color-conversion area. In some embodiments, the light-emitting device shown in FIG. 4 included in the electronic apparatus may be a tandem light-emitting device.

Manufacturing Method

The layers constituting the hole transport region, the emission layer, and the layers constituting the electron transport region may be formed in a specific region by using one or more suitable methods such as vacuum deposition, spin coating, casting, Langmuir-Blodgett (LB) deposition, ink-jet printing, laser printing, and laser-induced thermal imaging.

When layers constituting the hole transport region, an emission layer, and layers constituting the electron transport region are each independently formed by vacuum-deposition, the vacuum-deposition may be performed at a deposition temperature in a range of about 100° C. to about 500° C., at a vacuum degree in a range of about $10^{-8}$ torr to about $10^{-3}$ torr, and at a deposition rate in a range of about 0.01 Angstroms per second (Å/sec) to about 100 Å/sec, depending on the material to be included in each layer and the structure of each layer to be formed.

When layers constituting the hole transport region, the emission layer, and layers constituting the electron transport region are each independently formed by spin coating, the spin coating may be performed at a coating rate of about 2,000 revolutions per minute (rpm) to about 5,000 rpm and at a heat treatment temperature of about 80° C. to 200° C., depending on the material to be included in each layer and the structure of each layer to be formed.

General Definitions of Terms

The term "$C_3$-$C_{60}$ carbocyclic group" as used herein refers to a cyclic group consisting of carbon atoms only and having 3 to 60 carbon atoms as ring-forming atoms. The term "$C_1$-$C_{60}$ heterocyclic group" as used herein refers to a cyclic group having 1 to 60 carbon atoms in addition to a heteroatom as ring-forming atoms other than carbon atoms. The $C_3$-$C_{60}$ carbocyclic group and the $C_1$-$C_{60}$ heterocyclic group may each be a monocyclic group consisting of one ring or a polycyclic group in which at least two rings are condensed. For example, the number of ring-forming atoms in the $C_1$-$C_{60}$ heterocyclic group may be in a range of 3 to 61.

The term "cyclic group" as used herein may include the $C_3$-$C_{60}$ carbocyclic group and the $C_1$-$C_{60}$ heterocyclic group.

The term "π electron-rich $C_3$-$C_{60}$ cyclic group" refers to a cyclic group having 3 to 60 carbon atoms and not including *—N=*' as a ring-forming moiety. The term "π electron-deficient nitrogen-containing $C_1$-$C_{60}$ cyclic group" as used herein refers to a heterocyclic group having 1 to 60 carbon atoms and *—N=*' as a ring-forming moiety.

In some embodiments, the $C_3$-$C_{60}$ carbocyclic group may be i) a T1 group or ii) a group in which at least two T1 groups are condensed (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group, ii) a group in which at least two T2 groups are condensed, or iii) a group in which at least one T2 group is condensed with at least one T1 group (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), the π electron-rich $C_3$-$C_{60}$ cyclic group may be i) a T1 group, ii) a condensed group in which at least two T1 groups are condensed, iii) a T3 group, iv) a condensed group in which at least two T3 groups are condensed, or v) a condensed group in which at least one T3 group is condensed with at least one T1 group (for example, a $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, and the like), and the π electron-deficient nitrogen-containing $C_1$-$C_{60}$ cyclic group may be i) a T4 group, ii) a group in which at least two T4 groups are condensed, iii) a group in which at least one T4 group is condensed with at least one T1 group, iv) a group in which at least one T4 group is condensed with at least one T3 group, or v) a group in which at least one T4 group, at least one T1 group, and at least one T3 group are condensed (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may be a group condensed with any suitable cyclic group, a monovalent group, or a polyvalent group (e.g., a divalent group, a trivalent group, a quadvalent group, or the like), depending on the structure of the formula to which the term is applied. For example, a "benzene group" may be a benzene ring, a phenyl group, a phenylene group, or the like, and this may be understood by one of ordinary skill in the art, depending on the structure of the formula including the "benzene group".

In some embodiments, examples of the monovalent $C_3$-$C_{60}$ carbocyclic group and monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group having 1 to 60 carbon atoms, and examples thereof include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an iso-nonyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having substantially the same structure as the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having substantially the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is a $C_1$-$C_{60}$ alkyl group). Examples thereof include a methoxy group, an ethoxy group, and an isopropyloxy group.

The term "$C_3$-$C_{10}$ cycloalkyl group" as used herein refers to a monovalent saturated hydrocarbon monocyclic group including 3 to 10 carbon atoms. Examples of the $C_3$-$C_{10}$ cycloalkyl group as used herein include a cyclopropyl group, a cyclobutyl group, a cyclopentyl group, a cyclohexyl group, a cycloheptyl group, a cyclooctyl group, an adamantanyl group, a norbornanyl (bicyclo[2.2.1]heptyl) group, a bicyclo[1.1.1]pentyl group, a bicyclo[2.1.1]hexyl group, or a bicyclo[2.2.2]octyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent cyclic group including at least one heteroatom other than carbon atoms as a ring-forming atom and having 1 to 10 carbon atoms. Examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in its ring, and is not aromatic. Examples thereof include a cyclopentenyl group, a cyclohexenyl group, and a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent cyclic group including at least one heteroatom other than carbon atoms as a ring-forming atom, 1 to 10 carbon atoms, and at least one double bond in its ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each independently include two or more rings, the respective rings may be fused.

The term "$C_1$-$C_{60}$ heteroaryl group" as used herein refers to a monovalent group having a heterocyclic aromatic system further including at least one heteroatom other than carbon atoms as a ring-forming atom and 1 to 60 carbon atoms. The term "$C_1$-$C_{60}$ heteroarylene group" as used herein refers to a divalent group having a heterocyclic aromatic system further including at least one heteroatom other than carbon atoms as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the respective rings may be fused.

The term "monovalent non-aromatic condensed polycyclic group" as used herein refers to a monovalent group that has two or more condensed rings and only carbon atoms (e.g., 8 to 60 carbon atoms) as ring forming atoms, wherein the molecular structure when considered as a whole is non-aromatic. Examples of the monovalent non-aromatic condensed polycyclic group include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and at least one heteroatom other than carbon atoms (e.g., 1 to 60 carbon atoms), as a ring-forming atom, wherein the molecular structure when considered as a whole is non-aromatic. Examples of the monovalent non-aromatic condensed heteropolycyclic group include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzooxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having substantially the same structure as the monovalent non-aromatic condensed heteropolycyclic group.

The term "$C_6$-$C_{60}$ aryloxy group" as used herein refers to —$OA_{102}$ (wherein $A_{102}$ is a $C_6$-$C_{60}$ aryl group). The term "$C_6$-$C_{60}$ arylthio group" as used herein refers to —$SA_{103}$ (wherein $A_{103}$ is a $C_6$-$C_{60}$ aryl group).

The term "$C_7$-$C_{60}$ aryl alkyl group" as used herein refers to -$A_{144}A_{105}$ (wherein $A_{104}$ is a $C_1$-$C_{54}$ alkylene group, and $A_{105}$ is a $C_6$-$C_{59}$ aryl group). The term "$C_2$-$C_{60}$ heteroaryl alkyl group" as used herein refers to -$A_{106}A_{107}$ (wherein $A_{106}$ is a $C_1$-$C_{59}$ alkylene group, and $A_{107}$ is a $C_1$-$C_{59}$ heteroaryl group).

The term "$R_{10a}$" as used herein may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term "heteroatom" as used herein refers to any atom other than a carbon atom. Examples of the heteroatom may include O, S, N, P, Si, B, Ge, Se, or any combination thereof.

A third-row transition metal as used herein may include hafnium (Hf), tantalum (Ta), tungsten (W), rhenium (Re), osmium (Os), iridium (Ir), platinum (Pt), or gold (Au).

"Ph" used herein represents a phenyl group, "Me" used herein represents a methyl group, "Et" used herein represents an ethyl group, "ter-Bu" or "Bu$^t$" used herein represents a tert-butyl group, and "OMe" used herein represents a methoxy group.

The term "biphenyl group" as used herein refers to a phenyl group substituted with a phenyl group. The "biphenyl group" belongs to "a substituted phenyl group" having a "$C_6$-$C_{60}$ aryl group" as a substituent.

The term "terphenyl group" as used herein refers to a phenyl group substituted with a biphenyl group. The "terphenyl group" belongs to "a substituted phenyl group" having a "$C_6$-$C_{60}$ aryl group substituted with a $C_6$-$C_{60}$ aryl group" as a substituent.

The symbols * and *' as used herein, unless defined otherwise, refer to a binding site to an adjacent atom in a corresponding formula.

Hereinafter, a light-emitting device and a compound according to one or more embodiments will be described in more detail with reference to Examples.

EXAMPLES

Manufacture of Light-Emitting Device

Comparative Example 1 (No Buffer Layer)

A 15 Ohms per square centimeter ($\Omega/cm^2$) (800 Å) ITO/Ag/ITO glass substrate (available from Corning Co., Ltd) was cut to a size of 50 millimeters (mm)×50 mm×0.7 mm, sonicated in isopropyl alcohol and pure water for 5 minutes in each solvent, cleaned with ultraviolet rays for 15 minutes, and then ozone, and was mounted on a vacuum deposition apparatus.

HAT-CN was deposited on the glass substrate of ITO/Ag/ITO anode to form a hole injection layer having a thickness of 50 Å, and HLT1 was deposited on the hole injection layer to form a hole transport layer having a thickness of 600 Å, BH and BD were co-deposited on the hole transport layer at a weight ratio of 97:3 to form a first emission layer (blue) having a thickness of 200 Å, and TPM-TAZ and LiQ were co-deposited on the first emission layer at a weight ratio of 1:1 to form an electron transport layer having a thickness of 200 Å.

Subsequently, BCP and Li were co-deposited at a weight ratio of 99:1 to form an n-type charge generating layer having a thickness of 150 Å, and HAT-CN was deposited on the n-type charge generating layer to form a p-type charge generating layer having a thickness of 50 Å.

HLT1 was deposited on the p-type charge generating layer to form a hole transport layer having a thickness of 500 Å, BH and BD was co-deposited at a weight ratio of 97:3 on the hole transport layer to form a second emission layer (blue) having a thickness of 200 Å, and TPM-TAZ and LiQ were co-deposited at a weight ratio of 1:1 on the second emission layer having to form an electron transport layer having a thickness of 200 Å.

Subsequently, BCP and Li were co-deposited at a weight ratio of 99:1 to form an n-type charge generating layer having a thickness of 150 Å, and HAT-CN was deposited on the n-type charge generating layer to form a p-type charge generating layer having a thickness of 50 Å.

Subsequently, HLT1 was deposited to form a hole transport layer having a thickness of 400 Å, BH and BD was co-deposited at a weight ratio of 97:3 on the hole transport layer to form a third emission layer (blue) having a thickness of 200 Å, and TPM-TAZ and LiQ were co-deposited at a weight ratio of 1:1 on the third emission layer having to form an electron transport layer having a thickness of 200 Å.

Subsequently, BCP and Li were co-deposited at a weight ratio of 99:1 to form an n-type charge generating layer having a thickness of 150 Å, and HAT-CN was deposited on the n-type charge generating layer to form a p-type charge generating layer having a thickness of 50 Å.

Subsequently, HLT1 was deposited to form a hole transport layer having a thickness of 600 Å, Compounds GH1 and GH2 as a host (weight ratio of 5:5) and G-9 as a dopant were co-deposited on the hole transport layer to form a fourth emission layer (green) having a thickness of 200 Å (a doping concentration of 3 wt %).

ETL1 and LiQ were co-deposited at a weight ratio of 1:1 on the fourth emission layer to form an electron transport layer having a thickness of 300 Å.

Then, Yb was deposited thereon to a thickness of 10 Å, and Ag and Mg were co-deposited at a weight ratio of 9:1 to form a cathode having a thickness of 100 Å, thereby manufacturing a tandem light-emitting device.

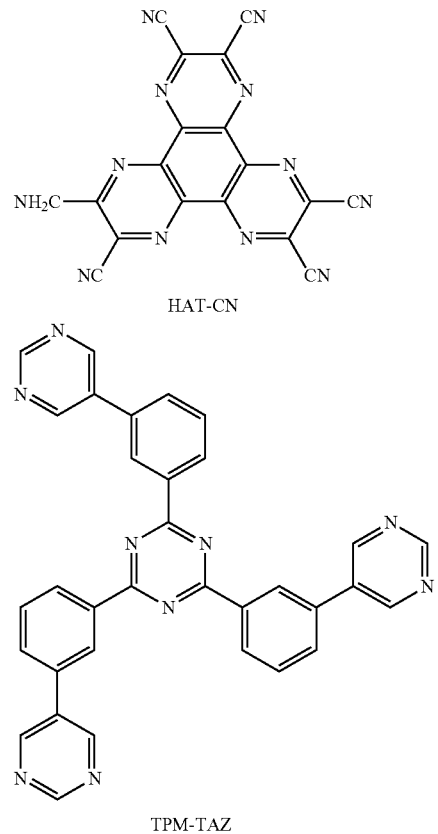

HAT-CN

TPM-TAZ

-continued
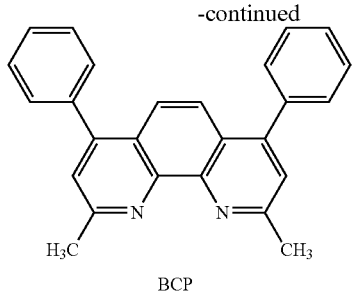
BCP
HTL1
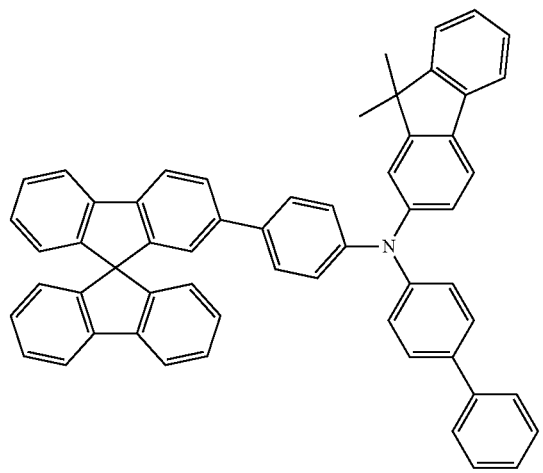
BH
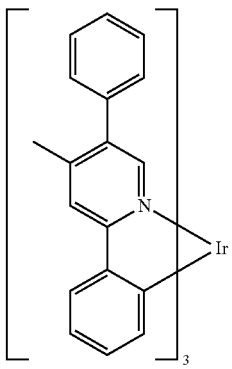
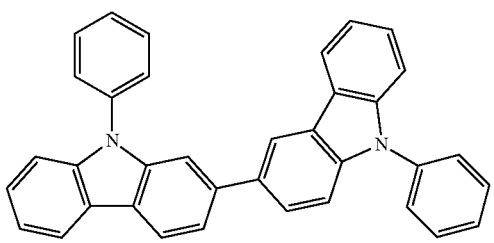
BD
-continued
G-9
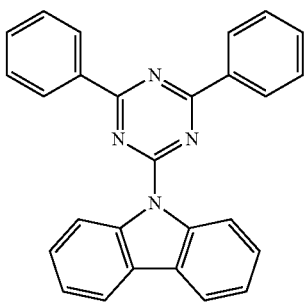
GH1
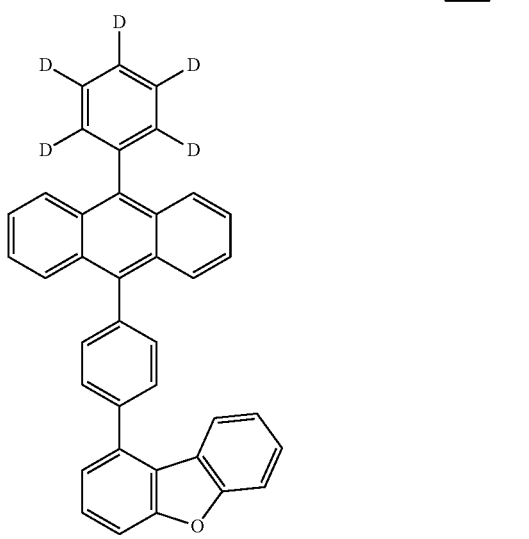
GH2
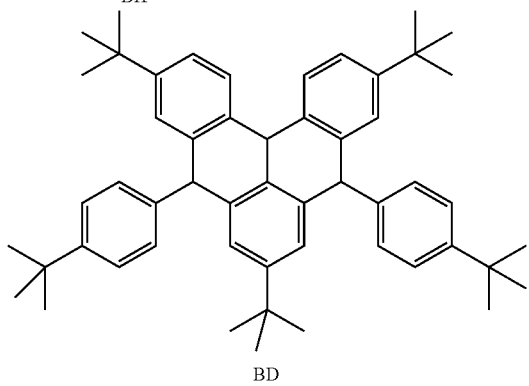
1-23
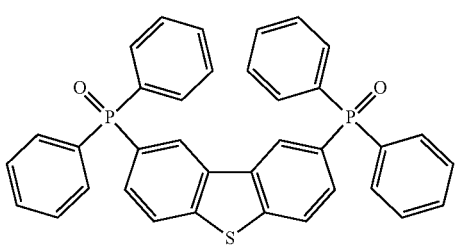
2-14

ETL1

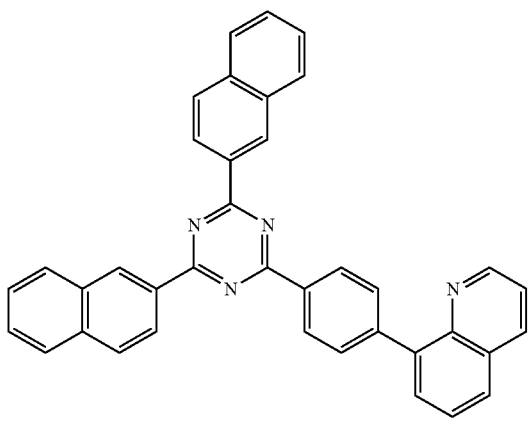

Comparative Example 2

A light-emitting device was manufactured in the same manner as in Comparative Example 1, except that Compound 1-23 was deposited on the fourth emission layer to form a single buffer layer having a thickness of 200 Å, and an electron transport layer was formed.

Comparative Example 3

A light-emitting device was manufactured in the same manner as in Comparative Example 2, except that Compound 2-14 was deposited on the fourth emission layer to form a single buffer layer having a thickness of 200 Å, and an electron transport layer was formed.

Comparative Example 4

A light-emitting device was manufactured in the same manner as in Comparative Example 2, except that Compound 2-14 was deposited on the fourth emission layer to form a first buffer layer having a thickness of 100 Å, and then Compound 1-23 was deposited to form the second buffer layer having a thickness of 100 Å.

Example 1

A light-emitting device was manufactured in the same manner as in Comparative Example 1, except that Compound 1-23 was deposited on the fourth emission layer to form a first buffer layer having a thickness of 100 Å, and then Compound 2-14 was deposited to form the second buffer layer having a thickness of 100 Å.

The driving voltage, efficiency, or lifespan were measured at a current density of 10 mA/cm² to evaluate characteristics of the light-emitting devices manufactured in Comparative Examples 1 to 4 and Examples 1. The results are shown in Table 2.

The driving voltage and the current density of the light-emitting devices were measured using a source meter (Keithley Instrument, 2400 series). The efficiencies of the light-emitting devices were measured using Hammamastu Absolute PL Measurement System C9920-2-12.

The LUMO energy level values of Host Compound GH-1 of the emission layer (green), GH-2, Buffer Layer Compounds 1-23 and 2-14, and Electron Transport Layer Compound ETL1 are shown in Table 1.

TABLE 1

| Compound | LUMO energy level value (eV) |
| --- | --- |
| GH-1 | −2.38 |
| GH-2 | −2.60 |
| 1-23 | −2.40 |
| 2-14 | −2.25 |
| ETL1 | −2.75 |

TABLE 2

| | Structure | Driving voltage @100 nit (V) | Efficiency @100 nit (Cd/A) | Efficiency @1,000 nit (Cd/A) | Efficiency @10,000 nit (Cd/A) | Lifespan @10,000 nit (T95) |
| --- | --- | --- | --- | --- | --- | --- |
| Comparative Example 1 | G-EML/ETL (No buffer) | 100% | 100% | 91% | 80% | 400 hours |
| Comparative Example 2 | G-EML/Buffer 1/ETL | 95% | 105% | 88% | 75% | 350 hours |
| Comparative Example 3 | G-EML/Buffer 2/ETL | 115% | 95% | 92% | 91% | 450 hours |
| Comparative Example 4 | G-EML/Buffer 2/Buffer 1/ETL | 115% | 97% | 85% | 77% | 380 hours |
| Example 1 | G-EML/Buffer 1/Buffer 2/ETL | 96% | 102% | 96% | 93% | 430 hours |

"G-EML" in Table 2 indicates a green emission layer.

The light-emitting device of Example 1 was found to have a low driving voltage, as compared with the light-emitting devices of Comparative Examples 1, 3, and 4.

The efficiency decreased greater, as the luminance was higher. For example, efficiency at 10,000 nit is each 80%, 75%, 91% and 77% in Comparative Examples 1 to 4, while efficiency at 10,000 nit is 93% in Example 1. Thus, the light-emitting device of Example 1 was found to have improved roll-off ratio, as compared with the light-emitting devices of the Comparative Examples.

The light-emitting device of Example 1 included two buffer layers, the absolute value of the LUMO energy level of the first buffer layer compound was smaller than the absolute value of the LUMO energy level of the host compound, the absolute value of the LUMO energy level of the second buffer layer compound was smaller than the absolute value of the LUMO energy level of the electron transport layer compound, and the absolute value of the LUMO energy level of the second buffer layer compound was smaller than the absolute value of the LUMO energy level of the first buffer layer compound.

The light-emitting device of Comparative Example 1 did not include a buffer layer, the light-emitting devices of Comparative Examples 2 and 3 each included a single buffer layer, and the light-emitting device of Comparative Example 4 included two buffer layers, but the LUMO energy level relationship in the compounds did not satisfy each of Equations (1) to (3).

As apparent from the foregoing description, a light-emitting device according to one or more embodiments may have excellent efficiency and long lifespan, as compared with devices in the related art.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light-emitting device comprising:
   a first electrode;
   a second electrode facing the first electrode; and
   an interlayer located between the first electrode and the second electrode and comprising an emission layer,
   wherein the emission layer comprises a host compound (H-1) and a dopant compound (D),
   the interlayer comprises a first buffer layer comprising a first electron transporting compound (ET-1), a second buffer layer comprising a second electron transporting compound (ET-2), and an electron transport layer comprising a third electron transporting compound (ET-3),
   an absolute value of a lowest unoccupied molecular orbital (LUMO) energy level of the first electron transporting compound (ET-1) is smaller than an absolute value of a LUMO energy level of the host compound (H-1),
   an absolute value of a LUMO energy level of the second electron transporting compound (ET-2) is smaller than an absolute value of a LUMO energy level of the third electron transporting compound (ET-3), and
   an absolute value of a LUMO energy level of the second electron transporting compound (ET-2) is smaller than an absolute value of a LUMO energy level of the first electron transporting compound (ET-1).

2. The light-emitting device of claim 1, wherein the first buffer layer is in contact with the emission layer.

3. The light-emitting device of claim 1, wherein the second buffer layer is in contact with the electron transport layer.

4. The light-emitting device of claim 1, wherein the first buffer layer is in contact with the second buffer layer.

5. The light-emitting device of claim 1, wherein the LUMO energy level of the first electron transporting compound (ET-1) and the LUMO energy level of the host compound (H-1) satisfy the following equation:

$$|E_{LUMO\_ET-1} - E_{LUMO\_H-1}| \leq 0.20 \text{ eV} \qquad (1).$$

6. The light-emitting device of claim 1, wherein the LUMO energy level of the second electron transporting compound (ET-2) and the LUMO energy level of the third electron transporting compound (ET-3) satisfy the following equation:

$$E_{LUMO\_ET-2} - E_{LUMO\_ET-3}| \geq 0.20 \text{ eV} \qquad (2).$$

7. The light-emitting device of claim 1, wherein the LUMO energy level of the first electron transporting compound (ET-1) and the LUMO energy level of the second electron transporting compound (ET-2) satisfy the following equation:

$$|E_{LUMO\_ET-2} - E_{LUMO\_ET-1}| \leq 0.20 \text{ eV} \qquad (3).$$

8. The light-emitting device of claim 1, wherein the emission layer further comprises at least one other host compound, and an absolute value of a LUMO energy level of the at least one other host compound is smaller than or equal to an absolute value of the LUMO energy level of the host compound (H-1).

9. The light-emitting device of claim 8, wherein a mol % of the host compound (H-1) is in a range of about 90 mol % to about 10 mol %, based on the total hosts in the emission layer.

10. The light-emitting device of claim 1, wherein the first buffer layer further comprises at least one other electron transporting compound, and an absolute value of a LUMO energy level of the at least one other electron transporting compound is greater than or equal to an absolute value of a LUMO energy level of the first electron transporting compound (ET-1).

11. The light-emitting device of claim 10, wherein a mol % of the first electron transporting compound (ET-1) is in a range of about 90 mol % to about 30 mol %, based on the total compounds in the first buffer layer.

12. The light-emitting device of claim 1, wherein the second buffer layer further comprises at least one other electron transporting compound, and an absolute value of a LUMO energy level of the at least one other electron transporting compound is greater than or equal to an absolute value of a LUMO energy level of the second electron transporting compound (ET-2).

13. The light-emitting device of claim 12, wherein a mol % of the second electron transporting compound (ET-2) is in a range of about 90 mol % to about 30 mol %, based on the total compounds in the second buffer layer.

14. The light-emitting device of claim 1, wherein the dopant compound (D) is a phosphorescent dopant compound.

15. The light-emitting device of claim 1, wherein the first electron transporting compound (ET-1) is selected from following compounds:

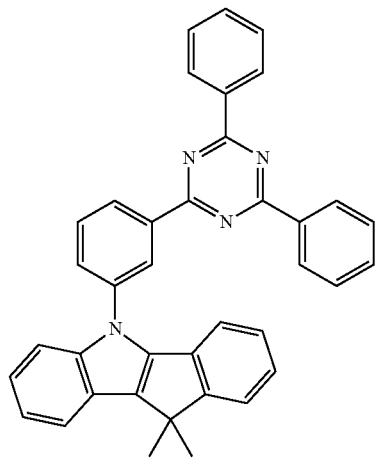

1-1

-continued
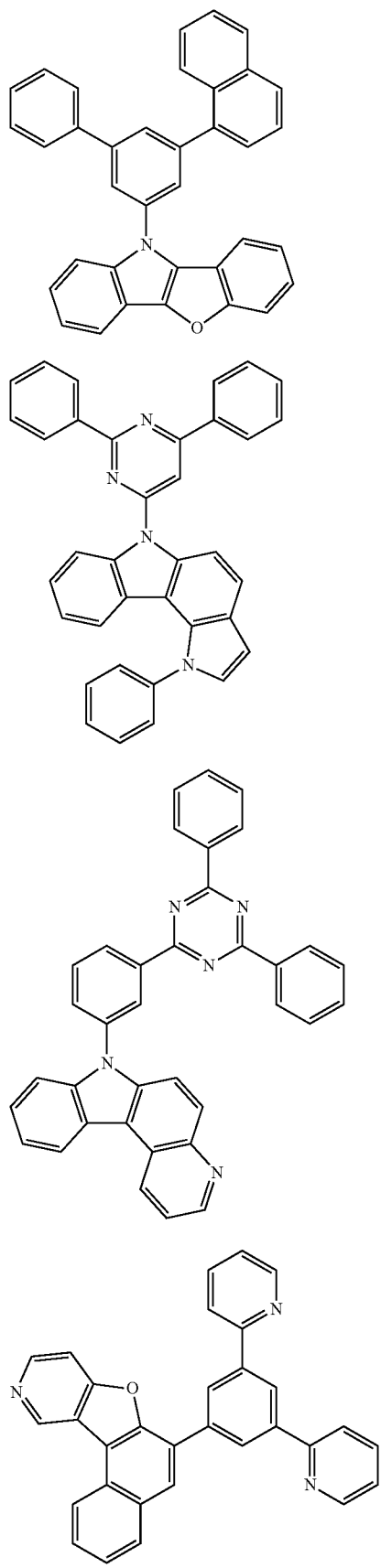
-continued
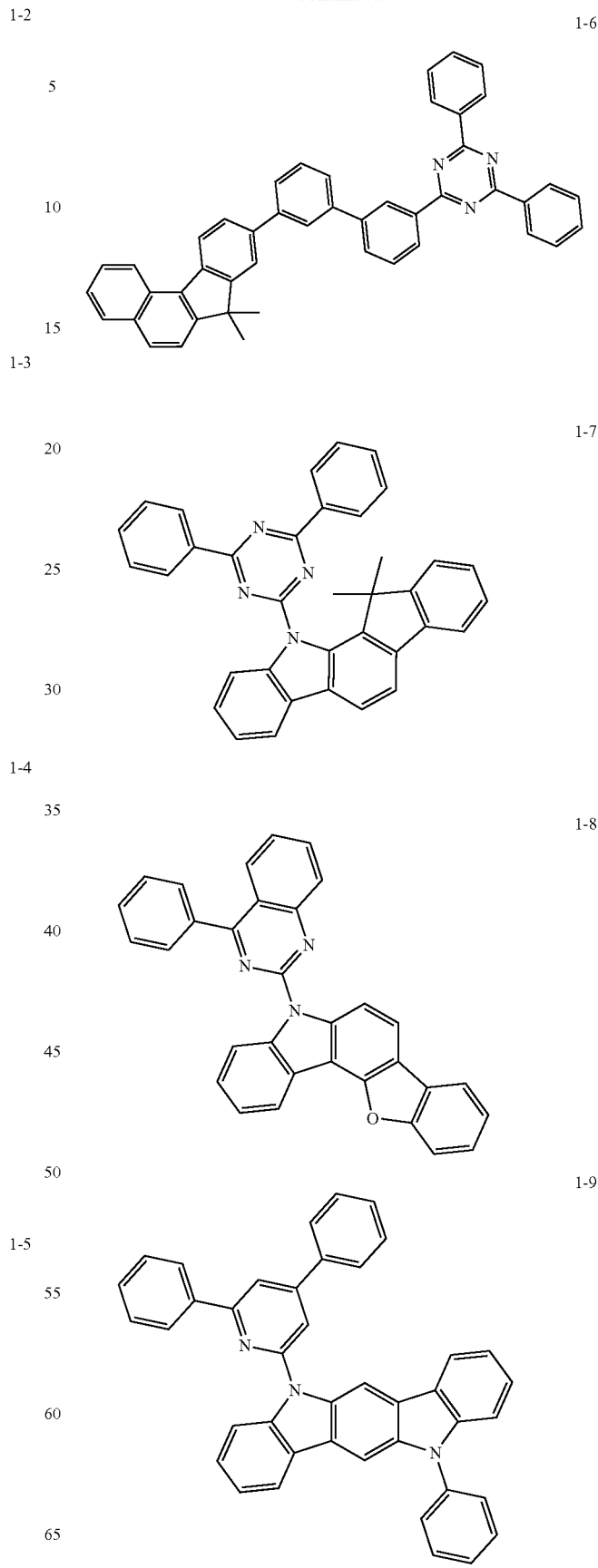

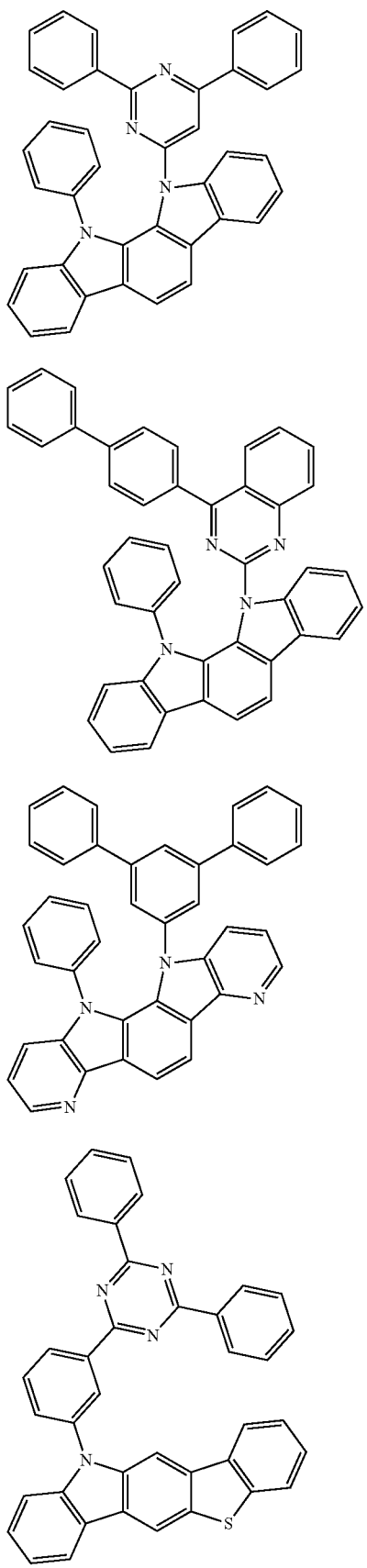
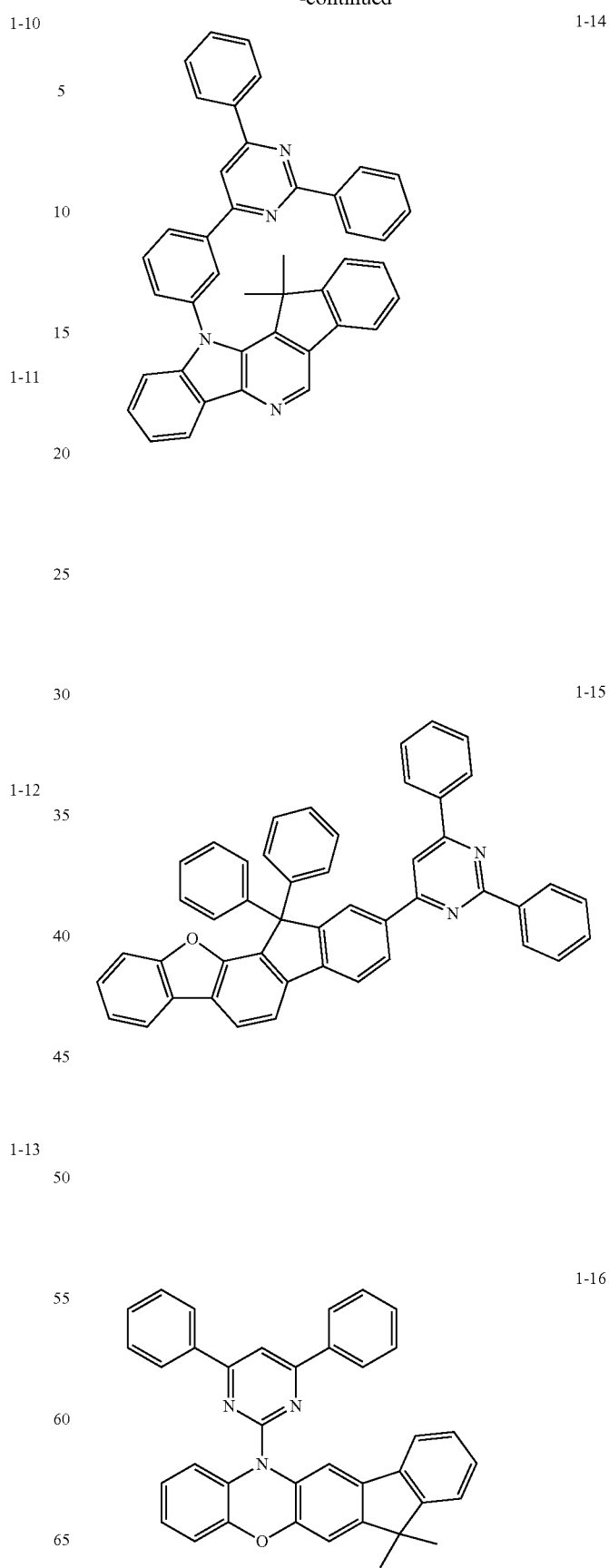

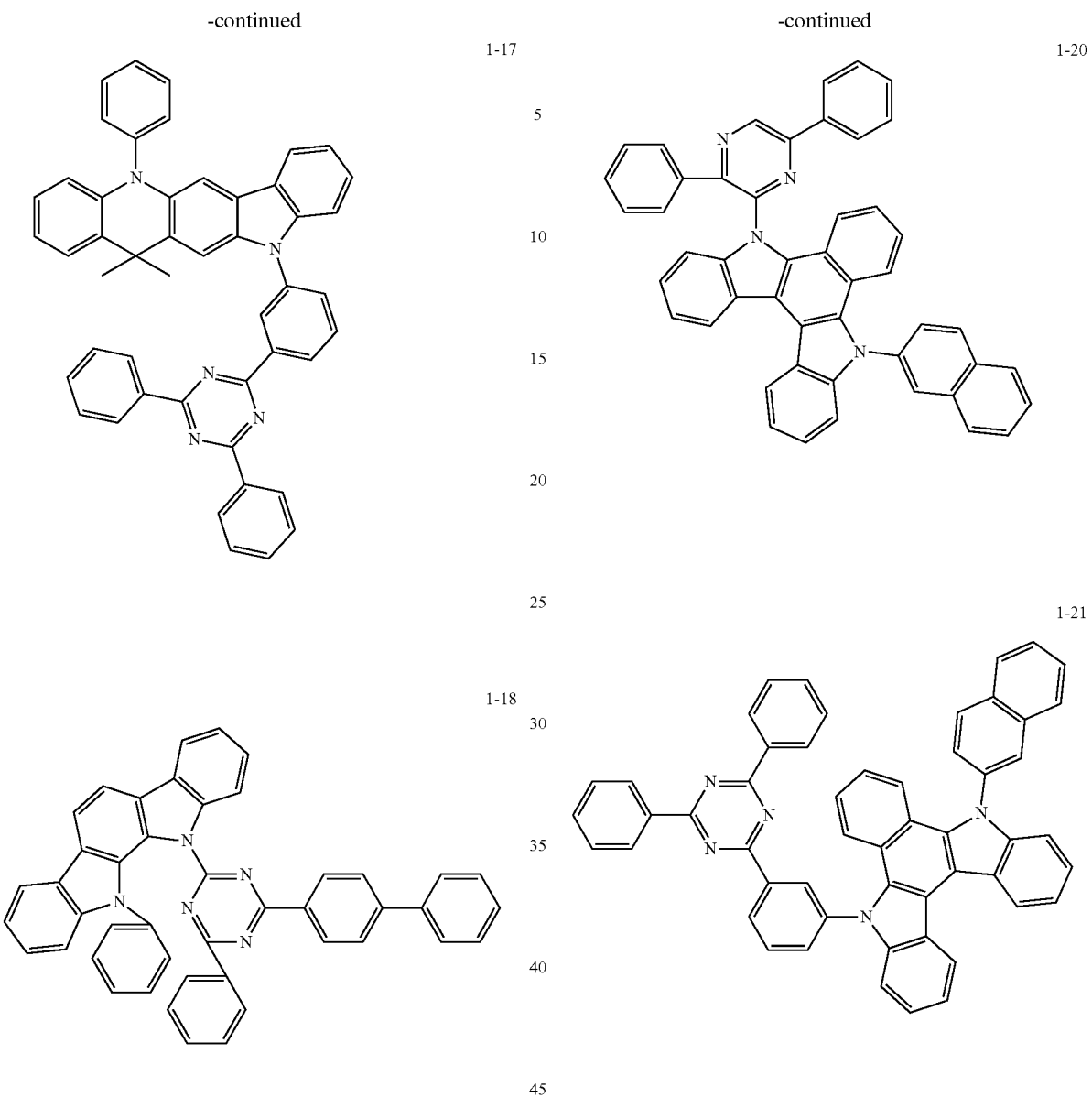

1-23
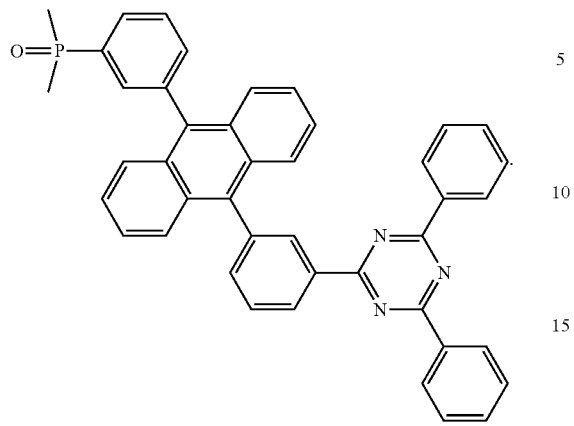
16. The light-emitting device of claim 1, wherein the second electron transporting compound (ET-2) is selected from following compounds:
2-1
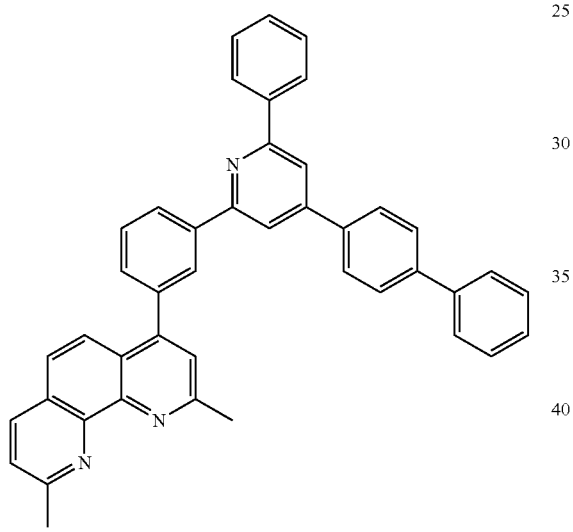
2-3
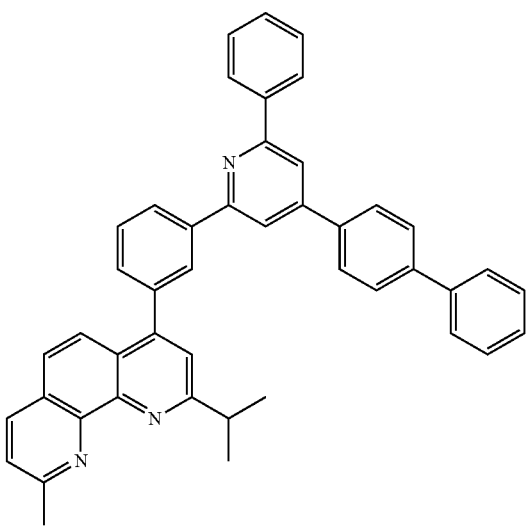
2-2
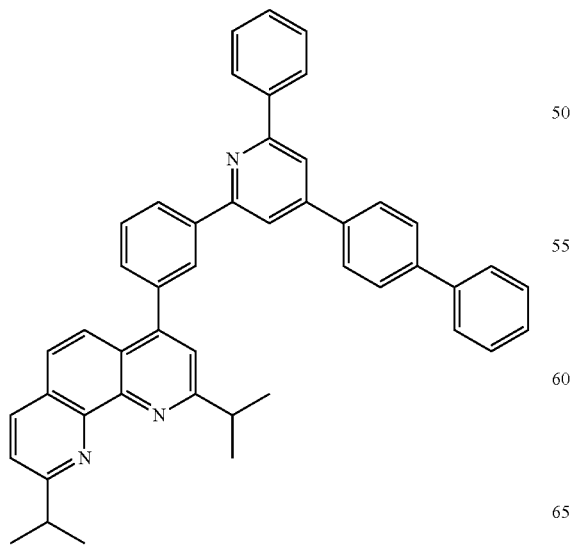
2-4
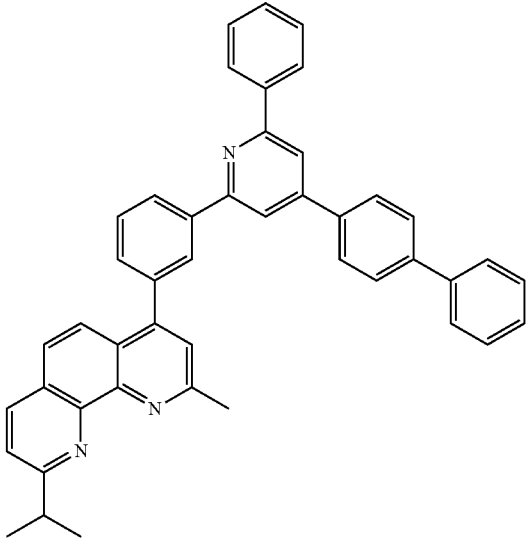

2-5
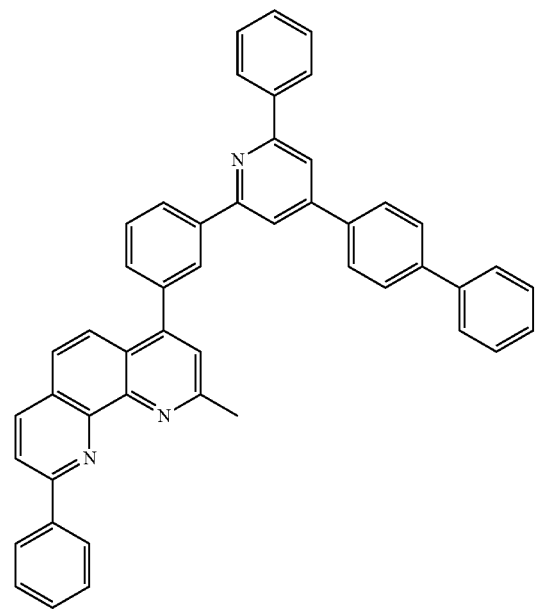
2-6
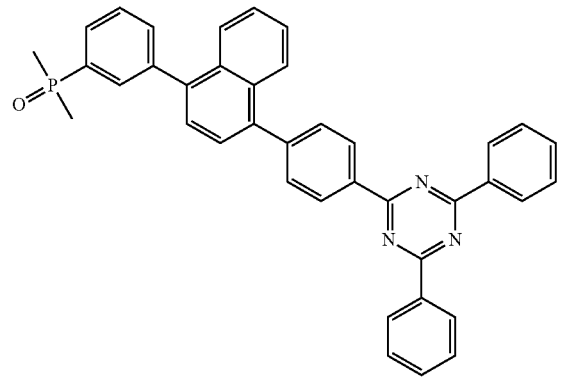
2-7
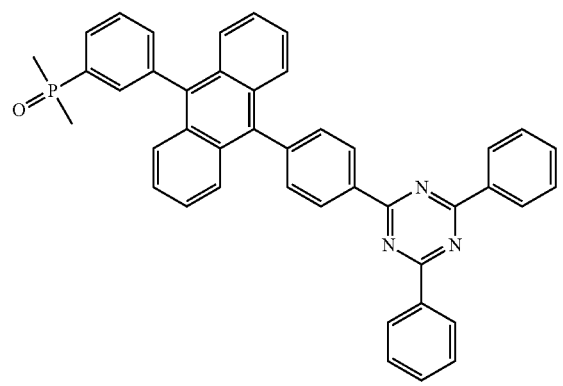
2-8
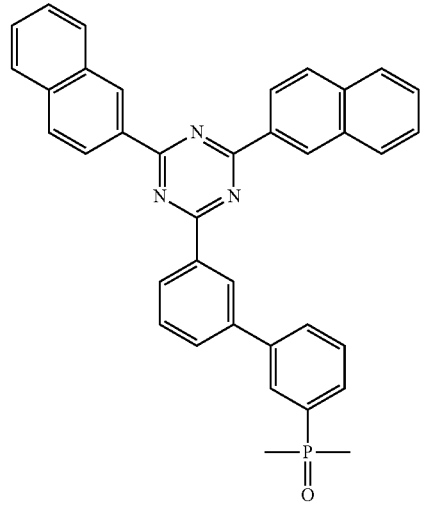
2-9
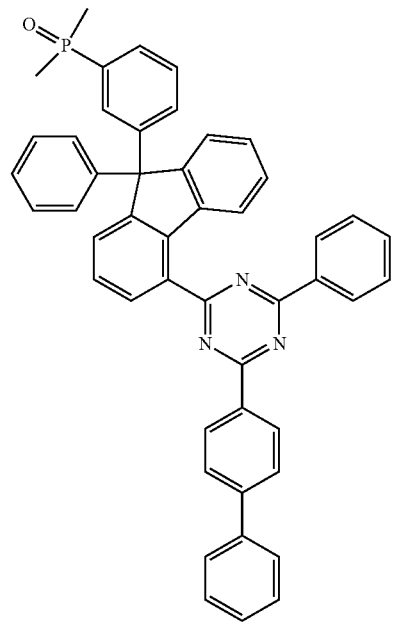
2-10
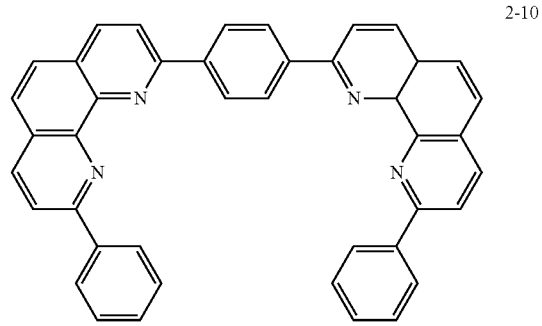

2-11
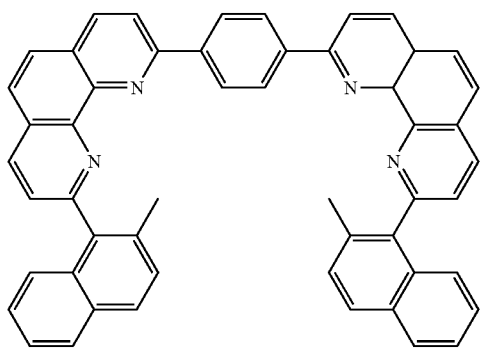
2-12
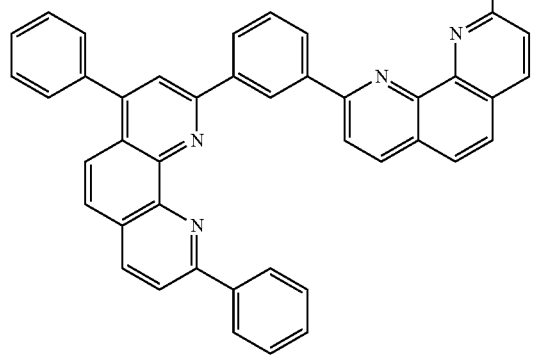
2-13
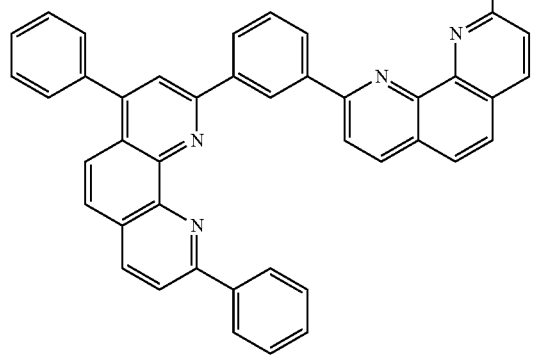
2-14
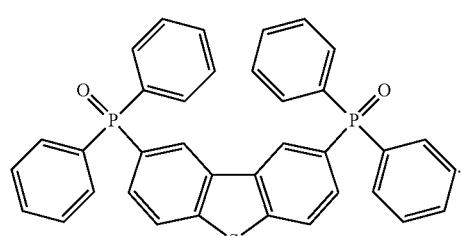
17. The light-emitting device of claim 1, wherein the dopant compound (D) is selected from Compounds G-1 to G-12:
G-1
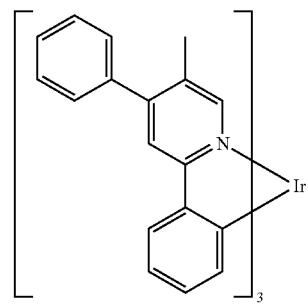
G-2
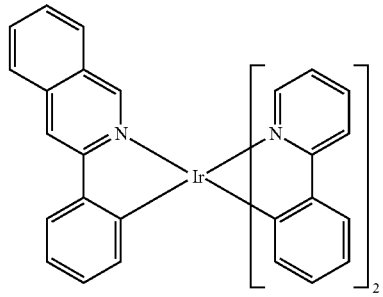
G-3
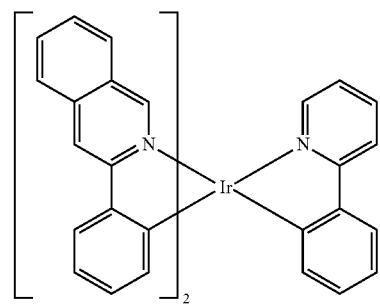
G-4
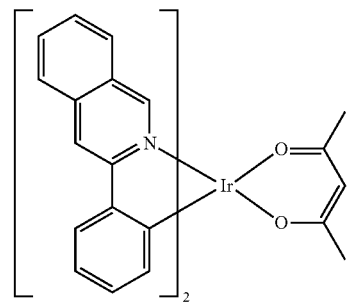
G-5
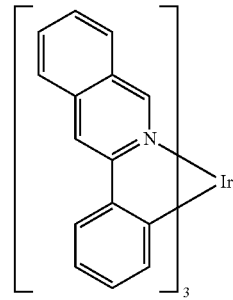

G-6
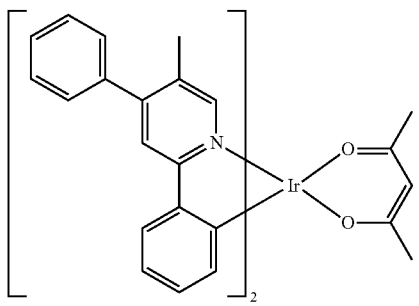

G-7
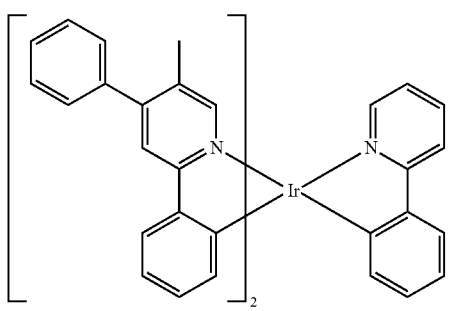

G-8
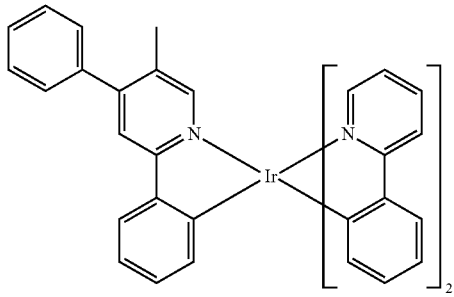

G-9
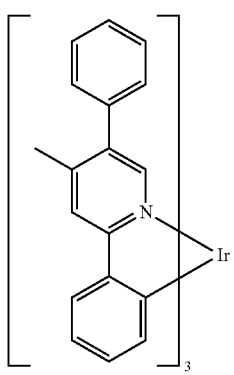

G-10
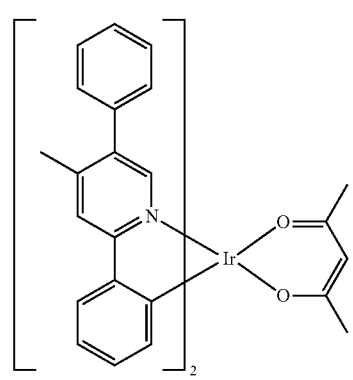

G-11
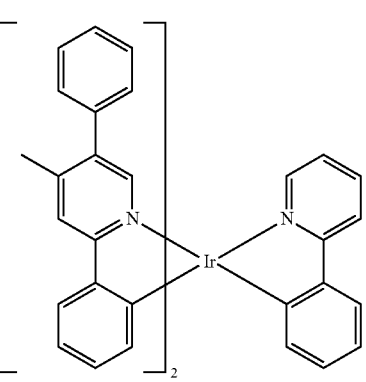

G-12
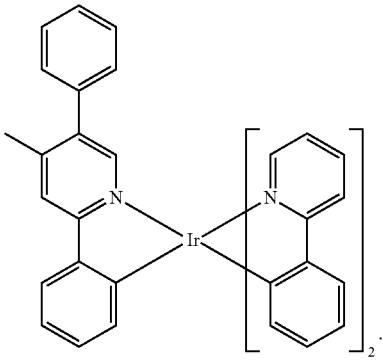

18. The light-emitting device of claim 1, wherein the interlayer comprises: emission units in the number of m; and charge generating unit(s) in the number of (m−1), between the emission units that are adjacent to each other, and any one unit of the emission units in the number of m comprises the emission layer, the first buffer layer, the second buffer layer, and the electron transport layer.

19. An electronic apparatus comprising the light-emitting device of claim 1.

20. The electronic apparatus of claim 19, wherein the emission units in the number of m comprise 1 to 7 blue emission units.

* * * * *